United States Patent
Hwang et al.

(10) Patent No.: US 11,189,807 B2
(45) Date of Patent: *Nov. 30, 2021

(54) ORGANOMETALLIC COMPOUND AND ORGANIC LIGHT-EMITTING DEVICE INCLUDING THE SAME

(71) Applicant: Samsung Electronics Co., Ltd., Suwon-si (KR)

(72) Inventors: Kyuyoung Hwang, Anyang-si (KR); Ohyun Kwon, Yongin-si (KR); Yoonhyun Kwak, Seoul (KR); Kum Hee Lee, Suwon-si (KR); Hyeonho Choi, Seoul (KR); Whail Choi, Seoul (KR); Byoungki Choi, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/885,603

(22) Filed: May 28, 2020

(65) Prior Publication Data
US 2020/0295278 A1 Sep. 17, 2020

Related U.S. Application Data

(63) Continuation of application No. 15/092,120, filed on Apr. 6, 2016, now Pat. No. 10,714,696.

(30) Foreign Application Priority Data

Aug. 3, 2015 (KR) .................. 10-2015-0109569

(51) Int. Cl.
*H01L 51/00* (2006.01)
*C07F 15/00* (2006.01)
(Continued)

(52) U.S. Cl.
CPC ...... *H01L 51/0085* (2013.01); *C07F 15/0033* (2013.01); *C09K 11/025* (2013.01); *C09K 11/06* (2013.01); *H05B 33/14* (2013.01); *C09K 2211/1029* (2013.01); *C09K 2211/1044* (2013.01); *C09K 2211/185* (2013.01);
(Continued)

(58) Field of Classification Search
CPC .................................. H01L 51/50–56
See application file for complete search history.

(56) References Cited

U.S. PATENT DOCUMENTS 9,617,291 B2 * 4/2017 Li ............... C07F 15/0033
2004/0230061 A1 11/2004 Seo et al.
(Continued)

FOREIGN PATENT DOCUMENTS

| JP | 2004155728 | | 6/2004 |
| JP | 2006120905 | A * | 5/2006 |
| JP | 200731678 | | 2/2007 |

OTHER PUBLICATIONS

Machine translation of JP-2006120905-A.*

*Primary Examiner* — William E McClain
(74) *Attorney, Agent, or Firm* — Cantor Colburn LLP

(57) ABSTRACT

An organometallic compound represented by Formula 1:

$$M(L_1)_{n1}(L_2)_{n2} \qquad \text{Formula 1}$$

wherein in Formula 1, M, $L_1$, $L_2$, n1, and n2 are the same as described in the specification.

13 Claims, 1 Drawing Sheet

(51) Int. Cl.
*C09K 11/06* (2006.01)
*C09K 11/02* (2006.01)
*H05B 33/14* (2006.01)
*H01L 51/50* (2006.01)

(52) U.S. Cl.
CPC ...... *H01L 51/0059* (2013.01); *H01L 51/0072* (2013.01); *H01L 51/0081* (2013.01); *H01L 51/5012* (2013.01); *H01L 51/5016* (2013.01)

(56) References Cited

U.S. PATENT DOCUMENTS

| | | |
|---|---|---|
| 2005/0006625 A1* | 1/2005 | Seo ........................ C09K 11/06 252/301.16 |
| 2007/0196691 A1* | 8/2007 | Ikemizu ................ H01L 51/004 428/690 |
| 2011/0204336 A1 | 8/2011 | Dobbs et al. |
| 2013/0168656 A1 | 7/2013 | Tsai et al. |
| 2014/0027716 A1 | 1/2014 | Tsai et al. |
| 2014/0158993 A1 | 6/2014 | So et al. |
| 2016/0359125 A1* | 12/2016 | Li ........................ C09K 11/06 |
| 2018/0130961 A1* | 5/2018 | Shi ...................... H01L 51/0087 |

* cited by examiner

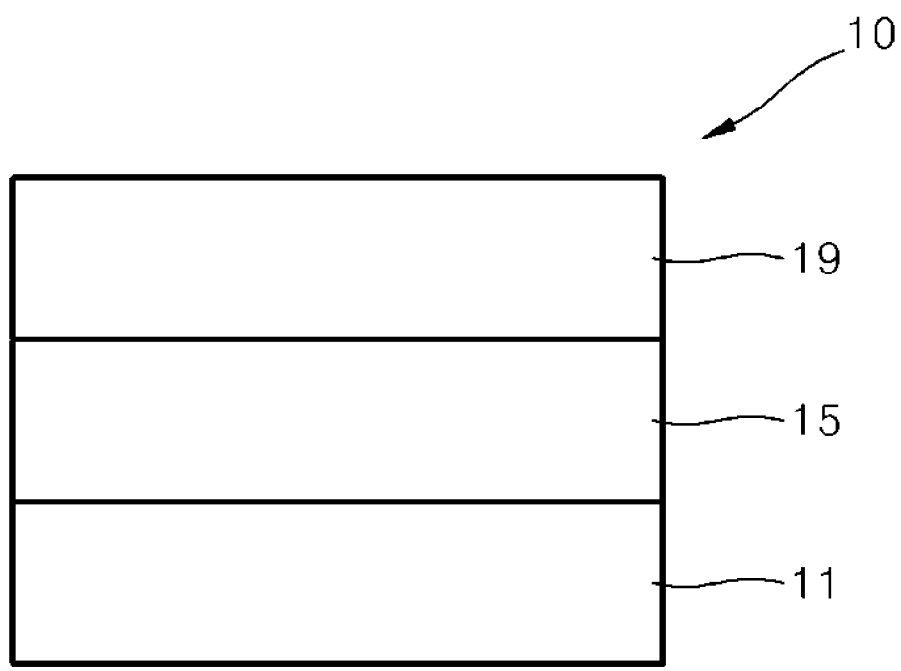

ORGANOMETALLIC COMPOUND AND ORGANIC LIGHT-EMITTING DEVICE INCLUDING THE SAME

CROSS-REFERENCE TO RELATED APPLICATION

This application is a continuation of U.S. application Ser. No. 15/092,120, filed on Apr. 6, 2016, which claims priority to and the benefit of Korean Patent Application No. 10-2015-0109569, filed on Aug. 3, 2015, in the Korean Intellectual Property Office, the contents of which are incorporated herein in their entirety by reference.

BACKGROUND

1. Field

The present disclosure relates to an organometallic compound and an organic light-emitting device including the organometallic compound.

2. Description of the Related Art

Organic light-emitting devices (OLEDs) are self-emission devices that have wide viewing angles, high contrast ratios, and short response times. In addition, the OLEDs exhibit excellent luminance, driving voltage, and response speed characteristics, and produce full-color images.

A typical organic light-emitting device includes an anode, a cathode, and an organic layer that is disposed between the anode and the cathode and includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons are recombined in the emission layer to produce excitons. These excitons change from an excited state to a ground state to thereby generate light.

Different types of organic light emitting devices are known. However, there still remains a need in OLEDs having low driving voltage, high efficiency, high brightness, and long lifespan.

SUMMARY

Provided are an organometallic compound and an organic light-emitting device including the organometallic compound.

Additional aspects will be set forth in part in the description which follows and, in part, will be apparent from the description, or may be learned by practice of the presented exemplary embodiments.

According to an aspect of the present inventive concept, an organometallic compound represented by Formula 1 below is described:

$$M(L_1)_{n1}(L_2)_{n2}$$   Formula 1

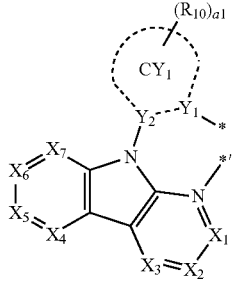

Formula 2A

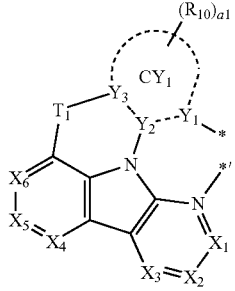

Formula 2B

Formula 2C wherein M in Formula 1 may be selected from Ir, Pt, Os, Ti, Zr, Hf, Eu, Tb, Tm, and Rh, $L_1$ in Formula 1 may be selected from a ligand represented by Formula 2A and a ligand represented by Formula 2B, $L_2$ in Formula 1 may be selected from ligands represented by Formula 2C, each of * and *' in Formulae 2A to 2C may be a binding site to M in Formula 1, n1 in Formula 1 may be 1, 2, or 3, provided that when n1 is 2 or greater, two or more groups $L_2$ may be the same or different, n2 in Formula 1 may be 0, 1, 2, 3, or 4, provided that when n2 is 2 or greater, two or more groups $L_2$ may be the same or different, $Y_1$ and $Y_2$ in Formulae 2A and 2B may be each C, $Y_3$ in Formula 2B may be a C or N, $Y_1$ and $Y_2$ in Formulae 2A and 2B may be linked by a single bond or a double bond, and $Y_2$ and $Y_3$ in Formula 2B may be linked by a single bond or a double bond, $Y_1$ in Formulae 2A and 2B and M in Formula 1 may be linked by a covalent bond, $CY_1$ and $CY_2$ in Formulae 2A and 2B may be each independently selected from a $C_5$-$C_{30}$ carbocyclic group and a $C_2$-$C_{30}$ heterocyclic group, in Formulae 2A and 2B, $X_1$ may be N or $C(R_1)$, $X_2$ may be N or $C(R_2)$, $X_3$ may be N or $C(R_3)$, $X_4$ may be N or $C(R_4)$, $X_5$ may be N or $C(R_5)$, $X_6$ may be N or $C(R_6)$, $X_7$ may be N or $C(R_7)$, $T_1$ in Formula 2B may be selected from a single bond, *—O—*', *—S—*', *—N($R_{31}$)—*, *—C($R_{31}$)($R_{32}$)—*', *—C($R_{31}$)=C($R_{32}$)—*,' and *—Si($R_{31}$)($R_{32}$)—*', wherein $R_{31}$ and $R_{32}$ may be optionally linked to form a substituted or unsubstituted $C_5$-$C_{30}$ carbocyclic group or a substituted or unsubstituted $C_2$-$C_{30}$ heterocyclic group, $R_1$ to $R_7$, $R_{10}$, $R_{31}$, and $R_{32}$ may be each independently selected from a hydrogen, a deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), —P(=O)($Q_8$)($Q_9$), and —Ge($Q_{51}$)($Q_{52}$)($Q_{53}$), a1 may be an integer selected from 0, 1, 2, 3, 4, and 5, two or more of $R_1$ to $R_3$ in Formulae 2A and 2B may be optionally linked to each other to form a substituted or unsubstituted $C_5$-$C_{30}$ carbocyclic group or a substituted or unsubstituted $C_2$-$C_{30}$ heterocyclic group, two or more of $R_4$ to $R_7$ in Formula 2A may be optionally linked to each other to form a substituted or unsubstituted $C_5$-$C_{30}$ carbocyclic group or a substituted or unsubstituted $C_2$-$C_{30}$ heterocyclic group, two or more groups $R_{10}$ in the number of a1 in Formulae 2A and 2B may be optionally linked to each other to form a substituted or unsubstituted $C_5$-$C_{30}$ carbocyclic group or a substituted or unsubstituted $C_2$-$C_{30}$ heterocyclic group, $Y_4$ and $Y_5$ in Formula 2C may be each independently O, N, P, or As, at least one substituent of the substituted $C_5$-$C_{30}$ carbocyclic group, substituted $C_2$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), and —P(=O)($Q_{28}$)($Q_{29}$); and —N($Q_{31}$)($Q_{32}$), —Si($Q_{33}$)($Q_{34}$)($Q_{35}$), —B($Q_{36}$)($Q_{37}$), and —P(=O)($Q_{38}$)($Q_{39}$);

wherein $Q_1$ to $Q_9$, $Q_{11}$ to $Q_{19}$, $Q_{21}$ to $Q_{29}$, $Q_{31}$ to $Q_{39}$, and $Q_{51}$ to $Q_{53}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one of a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

According to another aspect of the present inventive concept, described is an organic light-emitting device including:

a first electrode;

a second electrode; and an organic layer disposed between the first electrode and the second electrode, wherein the organic layer includes an emission layer and at least one organometallic compound described above.

An organometallic compound in the emission layer may serve as a dopant.

BRIEF DESCRIPTION OF THE DRAWINGS

These and/or other aspects will become apparent and more readily appreciated from the following description of the exemplary embodiments, taken in conjunction with the accompanying drawings in which:

FIG. Illustrates a schematic view of an organic light-emitting device according to an embodiment.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The organometallic compound is represented by Formula 1:

$$M(L_1)_{n1}(L_2)_{n2} \quad \text{Formula 1}$$

wherein M in Formula 1 may be selected from iridium (Ir), platinum (Pt), osmium (Os), titanium (Ti), zirconium (Zr), hafnium (Hf), europium (Eu), terbium (Tb), thulium (Tm), and rhodium (Rh).

For example, M in Formula 1 may be, but is not limited thereto, selected from iridium (Ir), platinum (Pt), and osmium (Os).

$L_1$ in Formula 1 may be selected from a ligand represented by Formula 2A and a ligand represented by Formula 2B, and $L_2$ in Formula 1 may be selected from ligands represented by Formula 2C, wherein * and *' in Formulae 2A to 2C may be each independently a binding site to M in Formula 1:

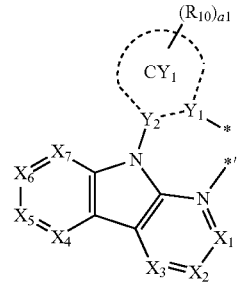

Formula 2A

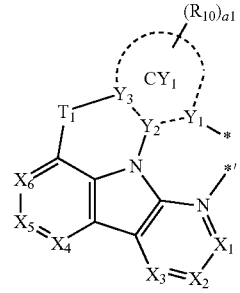

Formula 2B

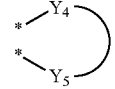

Formula 2C n1 in Formula 1 may be 1, 2, or 3, provided that when n1 is 2 or greater, two or more groups $L_1$ may be the same or different, and n2 in Formula 1 may be 0, 1, 2, 3, or 4, and when n2 is 2 or greater, two or more groups $L_2$ may be the same or different.

In some embodiments, in Formula 1,

M may be Ir or Os, and n1+n2 may be 3; or

M may be Pt, and n1+n2 may be 2, but embodiments are not limited thereto.

$Y_1$ and $Y_2$ in Formulae 2A and 2B may be a carbon (C), and $Y_3$ in Formula 2B may be a carbon (C) or nitrogen (N).

$Y_1$ and $Y_2$ in Formulae 2A and 2B may be linked by a single bond or a double bond, and $Y_2$ and $Y_3$ in Formula 2B may be linked by a single bond or a double bond.

$Y_1$ in Formulae 2A and 2B and M in Formula 1 may be linked by a covalent bond.

$CY_1$ and $CY_2$ in Formulae 2A and 2B may be each independently selected from a $C_5$-$C_{30}$ carbocyclic group and a $C_2$-$C_{30}$ heterocyclic group.

For example, $CY_1$ in Formulae 2A and 2B may be each independently selected from a cyclopentadiene, a benzene, a heptalene, an indene, a naphthalene, an azulene, a heptalene, an indacene, an acenaphthylene, a fluorene, a spirobifluorene, a benzofluorene, a dibenzofluorene, a phenalene, a phenanthrene, an anthracene, a fluoranthene, a triphenylene, a pyrene, a chrysene, naphthacene, a picene, a perylene, a pentacene, a hexacene, a pentacene, a rubicene, a coronene, an ovalene, a pyrrole, an isoindole, an indole, an indazole, a pyrazole, an imidazole, a triazole, an oxazole, an isoxazole, an oxadiazole, a thiazole, an isothiazole, a thiadiazole, a purine, a furan, a thiophene, a pyridine, a pyrimidine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzoimidazole, a benzofuran, a benzothiophene, an isobenzothiazole, a benzoxazole, an isobenzoxazole, a benzocarbazole, a dibenzocarbazole, an imidazopyridine, an imidazopyrimidine, a dibenzofuran, a dibenzothiophene, a dibenzothiophene sulfone, a carbazole, and a dibenzosilole.

According to an embodiment, $CY_1$ in Formulae 2A and 2B may be independently selected from a cyclopentadiene, a benzene, a naphthalene, a fluorene, a phenanthrene, an anthracene, a triphenylene, a pyrrole, an indole, a pyrazole, an imidazole, an oxazole, an isoxazole, a thiazole, an isothiazole, a furan, a thiophene, a pyridine, a pyrimidine, a quinoline, an isoquinoline, a quinoxaline, a quinazoline, a cinnoline, a benzoimidazole, a benzofuran, a benzothiophene, an isobenzothiazole, a benzoxazole, an isobenzoxazole, a benzocarbazole, a dibenzocarbazole, an imidazopyridine, an imidazopyrimidine, a dibenzofuran, a dibenzothiophene, a dibenzothiophene sulfone, a carbazole, and a dibenzosilole.

According to another embodiment, $CY_1$ in Formulae 2A and 2B may be independently selected from a cyclopentadiene, a benzene, a naphthalene, a fluorene, a phenanthrene, a triphenylene, a pyrrole, an indole, a pyrazole, an imidazole, a furan, a thiophene, a pyridine, a pyrimidine, a quinoline, an isoquinoline, a quinoxaline, a quinazoline, a dibenzofuran, and a dibenzothiophene, but embodiments are not limited thereto.

According to some embodiments, $CY_1$ in Formulae 2A and 2B may be independently selected from a benzene, a naphthalene, a pyridine, a furan, a thiophene, an indole, and a pyrrole, but embodiments are not limited thereto.

In Formulae 2A and 2B, $X_1$ may be N or $C(R_1)$, $X_2$ may be N or $C(R_2)$, $X_3$ may be N or $C(R_3)$, $X_4$ may be N or $C(R_4)$, $X_5$ may be N or $C(R_5)$, $X_6$ may be N or $C(R_6)$, and $X_7$ may be N or $C(R_7)$.

For example, in Formulae 2A and 2B, $X_1$ may be $C(R_1)$, $X_2$ may be $C(R_2)$, $X_3$ may be $C(R_3)$, $X_4$ may be $C(R_4)$, $X_5$ may be $C(R_5)$, $X_6$ may be $C(R_6)$, and $X_7$ may be $C(R_7)$, but embodiments are not limited thereto.

$T_1$ in Formula 2B may be selected from a single bond, *—O—*', *—S—*', *—N($R_{31}$)—*, *—C($R_{31}$)($R_{32}$)—*', *—C($R_{31}$)=C($R_{32}$)—*', and *—Si($R_{31}$)($R_{32}$)—*', and $R_{31}$ and $R_{32}$ may be optionally linked to each other to form a substituted or unsubstituted $C_5$-$C_{30}$ carbocyclic group or a substituted or unsubstituted $C_2$-$C_{30}$ heterocyclic group (for example, a substituted or unsubstituted cyclopropane, a substituted or unsubstituted cyclobutane, a substituted or unsubstituted cyclopentane, a substituted or unsubstituted cyclohexane, a substituted or unsubstituted benzene, etc.).

For example, $T_1$ in Formula 2B may be selected from *—O—*', *—S—*', *—C($R_{31}$)($R_{32}$)—*', *—Si($R_{31}$)($R_{32}$)—*', and a group represented by Formulae 11-1 to 11-4, but embodiments are not limited thereto:

Formula 11-1

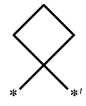

Formula 11-2

Formula 11-3

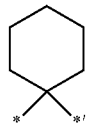

Formula 11-4 wherein, $R_1$ to $R_7$, $R_{10}$, $R_{31}$, and $R_{32}$ may be each independently selected from a hydrogen, a deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), —P(=O)($Q_8$)($Q_9$), and —Ge($Q_{51}$)($Q_{52}$)($Q_{53}$).

For example, $R_1$ to $R_7$, $R_{10}$, $R_{31}$, and $R_{32}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl (adamantyl) group, a norbornanyl (norbornyl) group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —$N(Q_1)(Q_2)$, —$Si(Q_3)(Q_4)(Q_5)$, —$B(Q_6)(Q_7)$, —$P(=O)(Q_8)(Q_9)$, and —$Ge(Q_{51})(Q_{52})(Q_{53})$, $Q_1$ to $Q_9$ and $Q_{51}$ to $Q_{53}$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group. According to an embodiment, $R_1$ to $R_7$, $R_{10}$, $R_{31}$, and $R_{32}$ may be each independently selected from a hydrogen, a deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from a deuterium, —F, —CD$_3$, —CD$_2$H, —CDH$_2$, —CF$_3$, —CF$_2$H, —CFH$_2$, a cyano group, a nitro group, a C$_1$-C$_{10}$ alkyl group, a C$_1$-C$_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —N(Q$_1$)(Q$_2$), —Si(Q$_3$)(Q$_4$)(Q$_5$), —B(Q$_6$)(Q$_7$), —P(=O)(Q$_8$)(Q$_9$), and —Ge(Q$_{51}$)(Q$_{52}$)(Q$_{53}$), Q$_1$ to Q$_9$ and Q$_{51}$ to Q$_{53}$ may be each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a C$_1$-C$_{10}$ alkyl group, and a phenyl group, but embodiments are not limited thereto.

According to another embodiment, R$_1$ to R$_7$, R$_{10}$, R$_{31}$, and R$_{32}$ may be each independently selected from a hydrogen, a deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by one of Formulae 9-1 to 9-19 below, a group represented by one of Formula 10-1 to 10-36 below, —Si(Q$_3$)(Q$_4$)(Q$_5$), and —Ge(Q$_{51}$)(Q$_{52}$)(Q$_{53}$), Q$_3$ to Q$_5$ and Q$_{51}$ to Q$_{53}$ may be each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a C$_1$-C$_{10}$ alkyl group, and a phenyl group, but embodiments are not limited thereto:

Formula 9-1

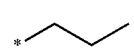

Formula 9-2

Formula 9-3

Formula 9-4

Formula 9-5

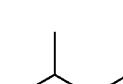

Formula 9-6

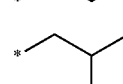

Formula 9-7

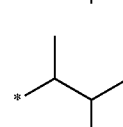

Formula 9-8

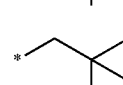

Formula 9-9

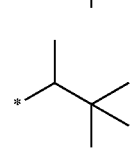

Formula 9-10

Formula 9-11

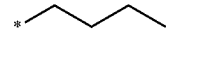

Formula 9-12

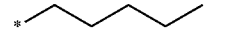

Formula 9-13

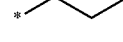

Formula 9-14

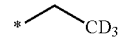

Formula 9-15

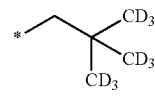

Formula 9-16

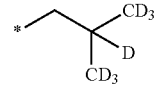

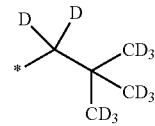

-continued
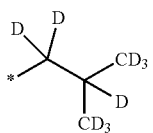
Formula 9-17
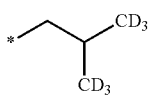
Formula 9-18
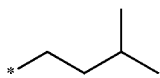
Formula 9-19
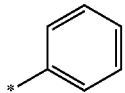
Formula 10-1
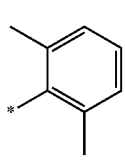
Formula 10-2
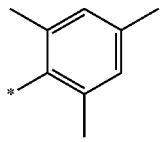
Formula 10-3
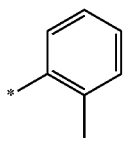
Formula 10-4
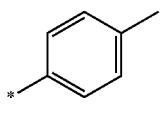
Formula 10-5
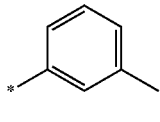
Formula 10-6
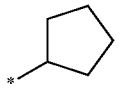
Formula 10-7
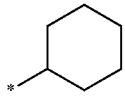
Formula 10-8
Formula 10-9
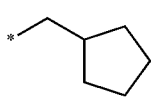
Formula 10-10
-continued
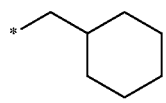
Formula 10-11
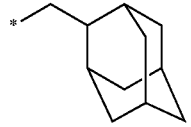
Formula 10-12
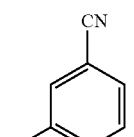
Formula 10-13
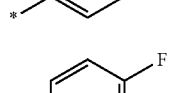
Formula 10-14
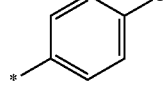
Formula 10-15
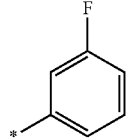
Formula 10-16
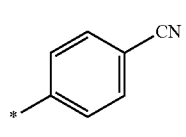
Formula 10-17
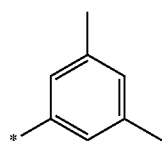
Formula 10-18
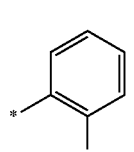
Formula 10-19
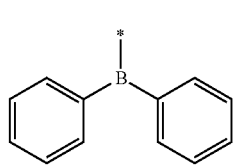
Formula 10-20
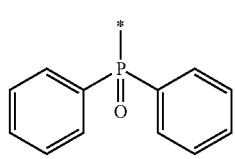
Formula 10-21
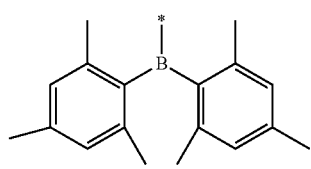

-continued

Formula 10-22
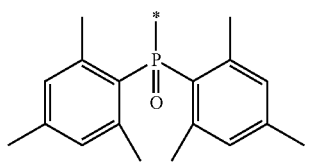

Formula 10-23
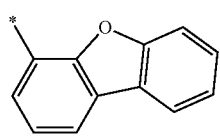

Formula 10-24
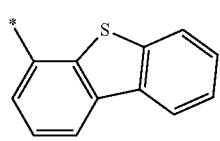

Formula 10-25
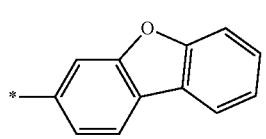

Formula 10-26
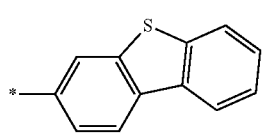

Formula 10-27
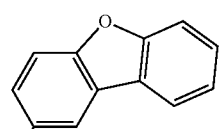

Formula 10-28
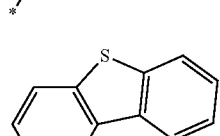

Formula 10-29
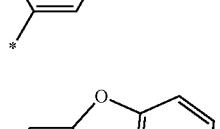

Formula 10-30
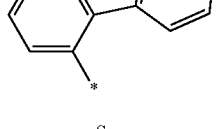

Formula 10-31
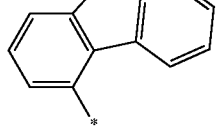

Formula 10-32
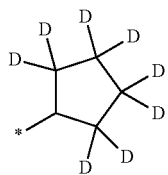

Formula 10-33
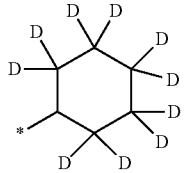

Formula 10-34
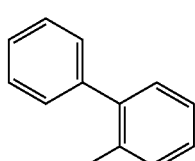

Formula 10-35
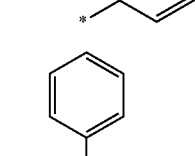

Formula 10-36
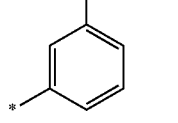

\* in Formulae 9-1 to 9-19 and 10-1 to 10-36 may be a binding site to a neighboring atom.

a1 in Formulae 2A and 2B may refer to the number of groups $R_{10}$, and be an integer selected from 0, 1, 2, 3, 4, and 5. When a1 is 2 or greater, two or more groups $R_{10}$ may be the same or different. a1 may be 0, 1, 2, or 3, but embodiments are not limited thereto.

Two or more of $R_1$ to $R_3$ in Formulae 2A and 2B may be optionally linked to each other to form a substituted or unsubstituted $C_5$-$C_{30}$ carbocyclic group or a substituted or unsubstituted $C_2$-$C_{30}$ heterocyclic group (for example, a substituted or unsubstituted cyclopentane, a substituted or unsubstituted cyclohexane, a substituted or unsubstituted adamantane, a substituted or unsubstituted benzene, a substituted or unsubstituted naphthalene, a substituted or unsubstituted pyridine, a substituted or unsubstituted pyrimidine, etc.).

In some embodiments, in Formula 1, $X_1$ may be $C(R_1)$, $X_2$ may be $C(R_2)$, and $R_1$ and $R_2$ may be optionally linked to each other to form a substituted or unsubstituted cyclopentane, a substituted or unsubstituted cyclohexane, a substituted or unsubstituted adamantane, a substituted or unsubstituted benzene, a substituted or unsubstituted naphthalene, a substituted or unsubstituted pyridine, or a substituted or unsubstituted pyrimidine.

In some embodiments, in Formula 1, $X_2$ may be $C(R_2)$, $X_3$ may be $C(R_3)$, and $R_2$ and $R_3$ may be optionally linked to each other to form a substituted or unsubstituted cyclopentane, a substituted or unsubstituted cyclohexane, a substituted or unsubstituted adamantane, a substituted or unsubstituted benzene, a substituted or unsubstituted naphthalene, a substituted or unsubstituted pyridine, or a substituted or unsubstituted pyrimidine.

Two or more of $R_4$ to $R_7$ in Formula 2A may be optionally linked to each other to form a substituted or unsubstituted $C_5$-$C_{30}$ carbocyclic group or a substituted or unsubstituted $C_2$-$C_{30}$ heterocyclic group (for example, a substituted or unsubstituted cyclopentane, a substituted or unsubstituted cyclohexane, a substituted or unsubstituted adamantane, a substituted or unsubstituted benzene, a substituted or unsubstituted naphthalene, a substituted or unsubstituted pyridine, a substituted or unsubstituted pyrimidine, etc.).

In some embodiments, in Formula 1, $X_4$ may be $C(R_4)$, $X_5$ may be $C(R_5)$, and $R_4$ and $R_5$ may be optionally linked to each other to form a substituted or unsubstituted cyclopentane, a substituted or unsubstituted cyclohexane, a substituted or unsubstituted adamantane, a substituted or unsubstituted benzene, a substituted or unsubstituted naphthalene, a substituted or unsubstituted pyridine, or a substituted or unsubstituted pyrimidine.

In some embodiments, in Formula 1, $X_5$ may be $C(R_5)$, $X_6$ may be $C(R_6)$, and $R_5$ and $R_6$ may be optionally linked to each other to form a substituted or unsubstituted cyclopentane, a substituted or unsubstituted cyclohexane, a substituted or unsubstituted adamantane, a substituted or unsubstituted benzene, a substituted or unsubstituted naphthalene, a substituted or unsubstituted pyridine, or a substituted or unsubstituted pyrimidine.

In some embodiments, in Formula 1, $X_6$ may be $C(R_6)$, $X_7$ may be $C(R_7)$, and $R_6$ and $R_7$ may be optionally linked to each other to form a substituted or unsubstituted cyclopentane, a substituted or unsubstituted cyclohexane, a substituted or unsubstituted adamantane, a substituted or unsubstituted benzene, a substituted or unsubstituted naphthalene, a substituted or unsubstituted pyridine, or a substituted or unsubstituted pyrimidine.

Two of more groups $R_{10}$ in the number of a1 in Formulae 2A and 2B may be optionally linked to each other to form a substituted or unsubstituted $C_5$-$C_{30}$ carbocyclic group or a substituted or unsubstituted $C_2$-$C_{30}$ heterocyclic group (for example, a substituted or unsubstituted cyclopentane, a substituted or unsubstituted cyclohexane, a substituted or unsubstituted adamantane, a substituted or unsubstituted benzene, a substituted or unsubstituted naphthalene, a substituted or unsubstituted pyridine, a substituted or unsubstituted pyrimidine, etc.).

Descriptions of a substituent of the "substituted cyclopentane, substituted cyclohexane, substituted adamantane, substituted benzene, substituted naphthalene, substituted pyridine, and substituted pyrimidine" are the same as the description of $R_1$ provided herein.

According to an embodiment, ligand $L_1$ in Formula 1 may be selected from ligands represented by Formulae 2A-1 to 2A-5, 2A-11 to 2A-14, 2A-21 to 2A-25, 2A-31 to 2A-34, 2A-41 to 2A-45, 2A-51 to 2A-54, 2A-61 to 2A-65, 2A-71 to 2A-74, 2A-81 to 2A-85, 2A-91 to 2A-94, 2A-101 to 2A-105, 2A-111 to 2A-114, 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93:

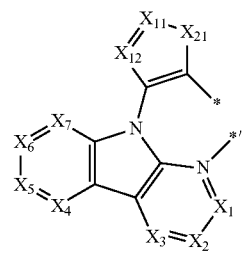

Formula 2A-1

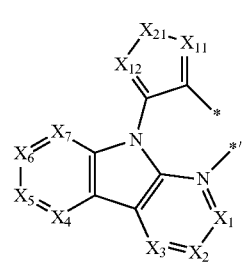

Formula 2A-2

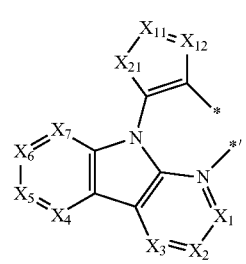

Formula 2A-3

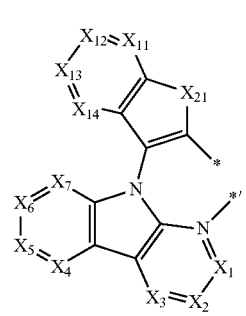

Formula 2A-4

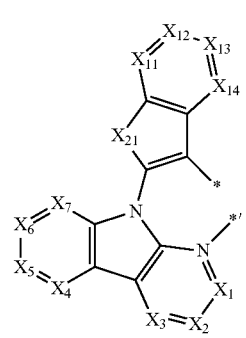

Formula 2A-5

Formula 2A-11
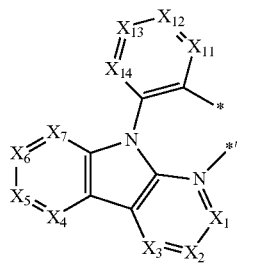
Formula 2A-12
Formula 2A-13
Formula 2A-14
Formula 2A-21
Formula 2A-22
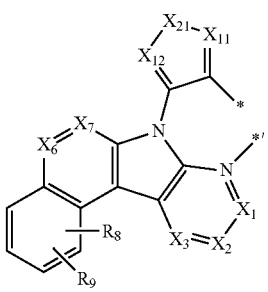
Formula 2A-23
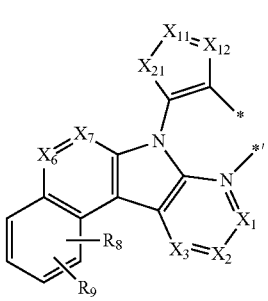
Formula 2A-24
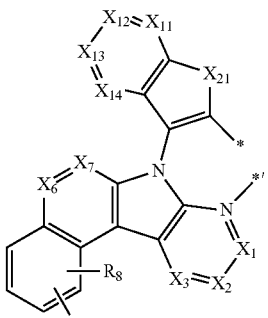
Formula 2A-25
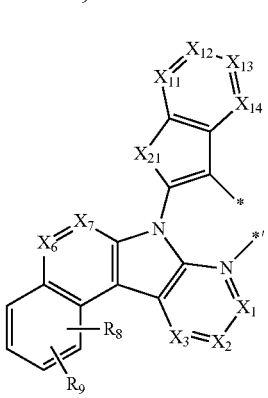
Formula 2A-31
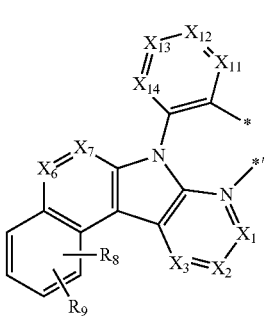

Formula 2A-32
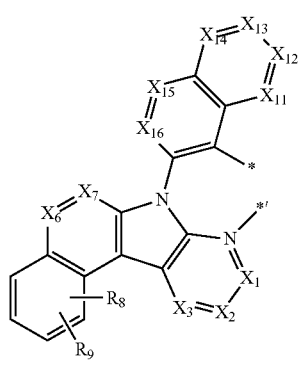
Formula 2A-33
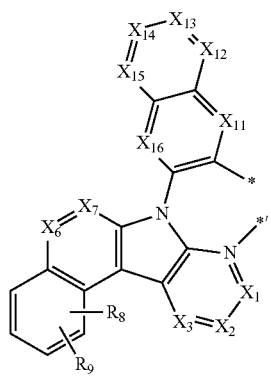
Formula 2A-34
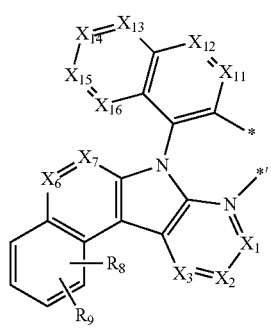
Formula 2A-41
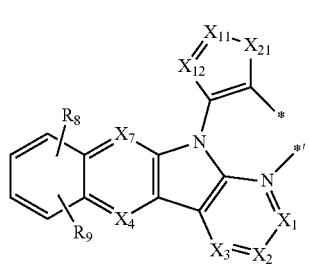
Formula 2A-42
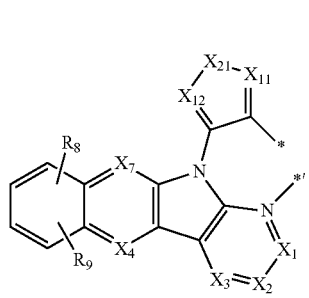
Formula 2A-43
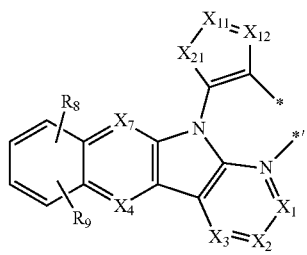
Formula 2A-44
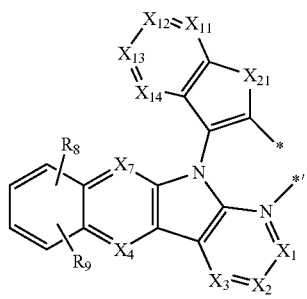
Formula 2A-45
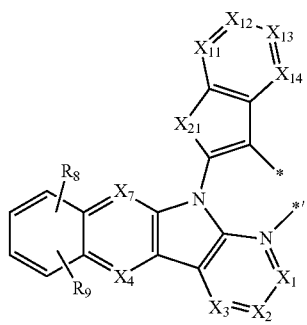
Formula 2A-51
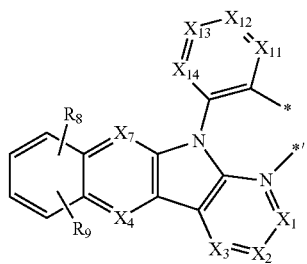
Formula 2A-52
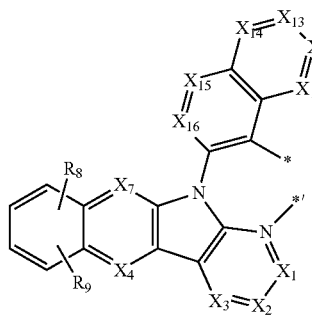

-continued
Formula 2A-53
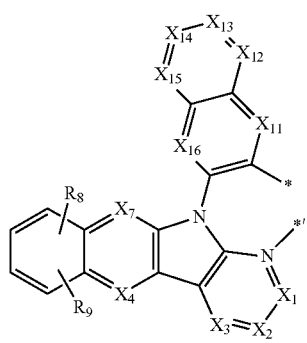
Formula 2A-54
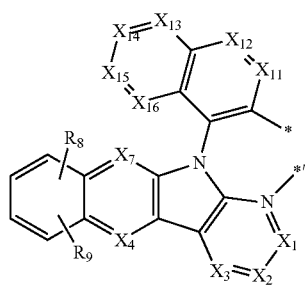
Formula 2A-61
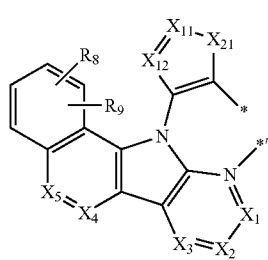
Formula 2A-62
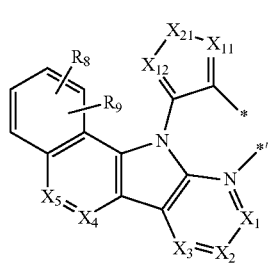
Formula 2A-63
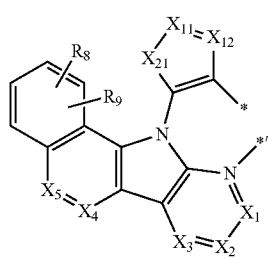
-continued
Formula 2A-64
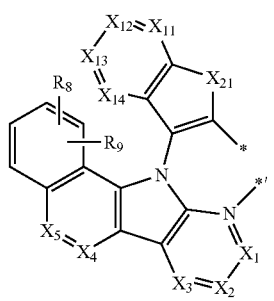
Formula 2A-65
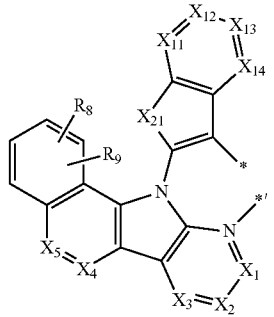
Formula 2A-71
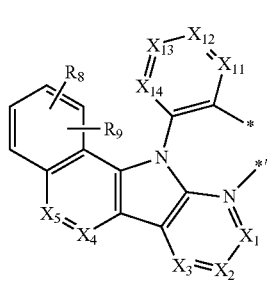
Formula 2A-72
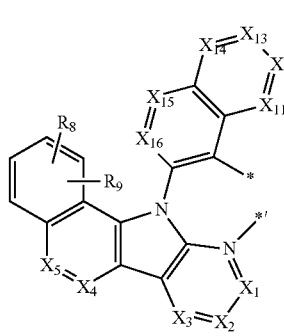
Formula 2A-73

-continued
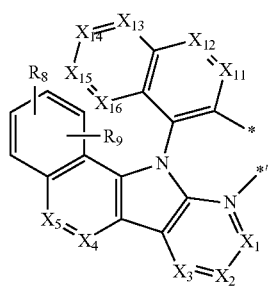
Formula 2A-74
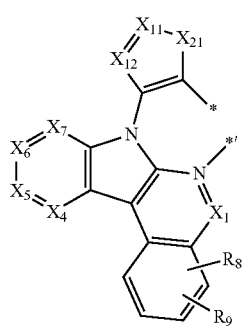
Formula 2A-81
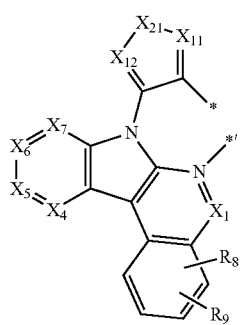
Formula 2A-82
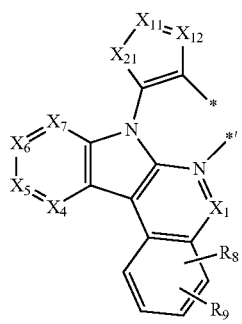
Formula 2A-83
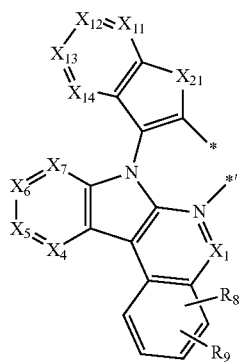
Formula 2A-84
-continued
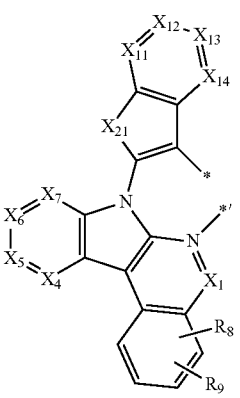
Formula 2A-85
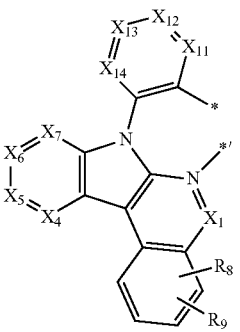
Formula 2A-91
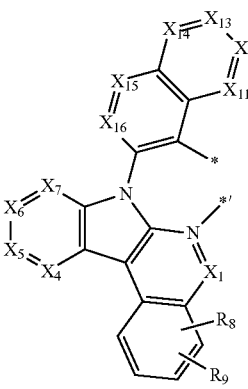
Formula 2A-92
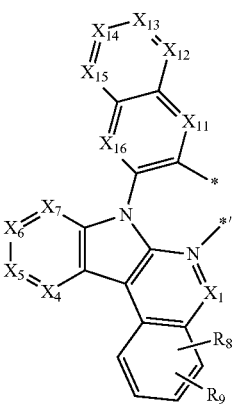
Formula 2A-93

-continued
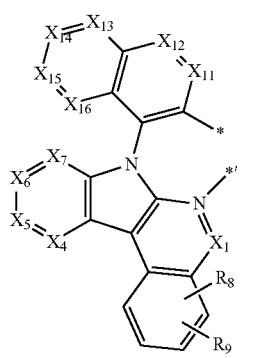
Formula 2A-101
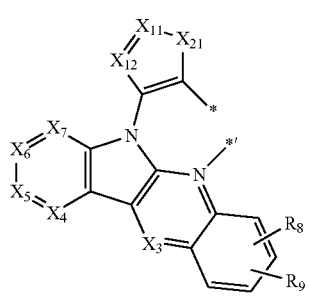
Formula 2A-102
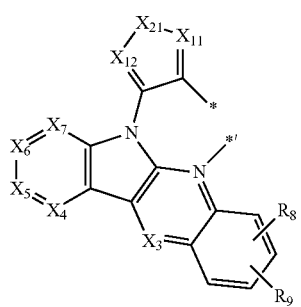
Formula 2A-103
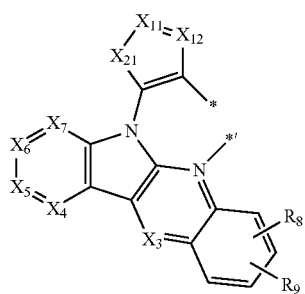
Formula 2A-104
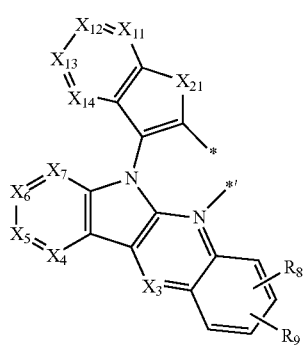
-continued
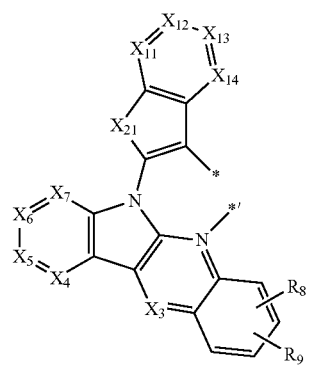
Formula 2A-94
Formula 2A-105
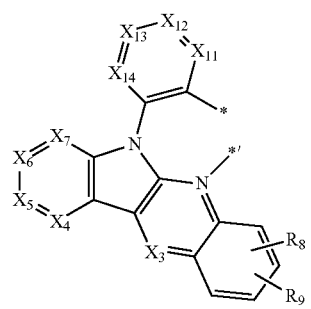
Formula 2A-111
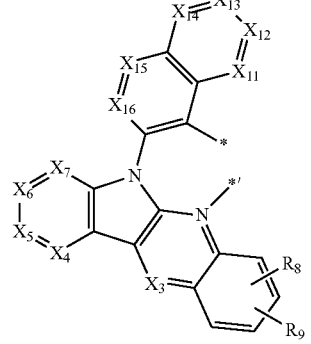
Formula 2A-112
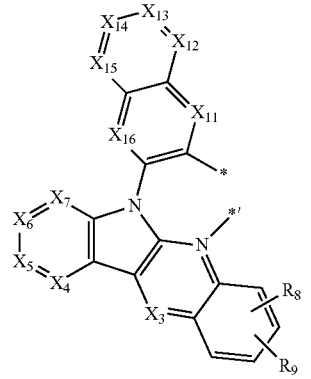
Formula 2A-113

-continued
Formula 2A-114
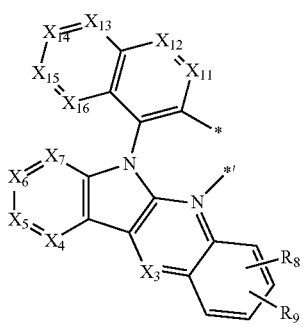
Formula 2B-1
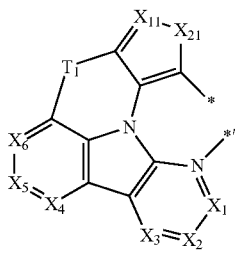
Formula 2B-2
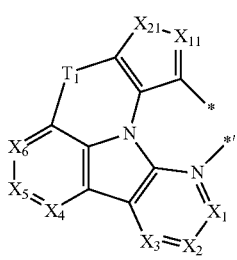
Formula 2B-3
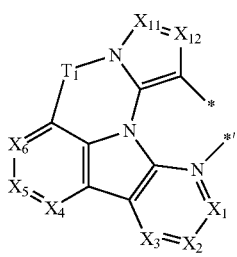
Formula 2B-11
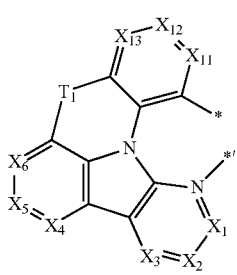
Formula 2B-12
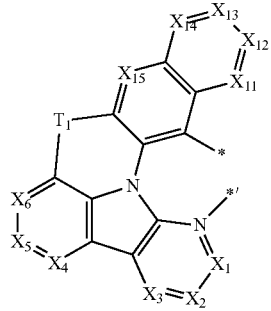
Formula 2B-13
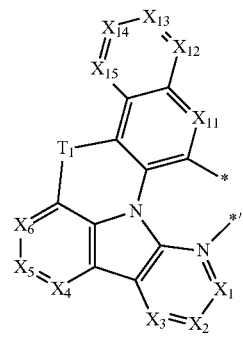
Formula 2B-21
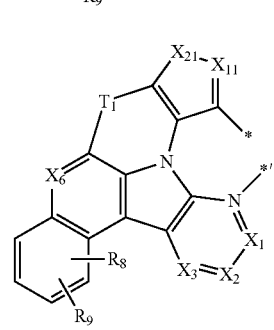
Formula 2B-22
Formula 2B-23
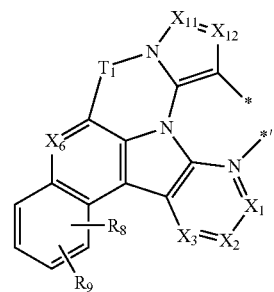

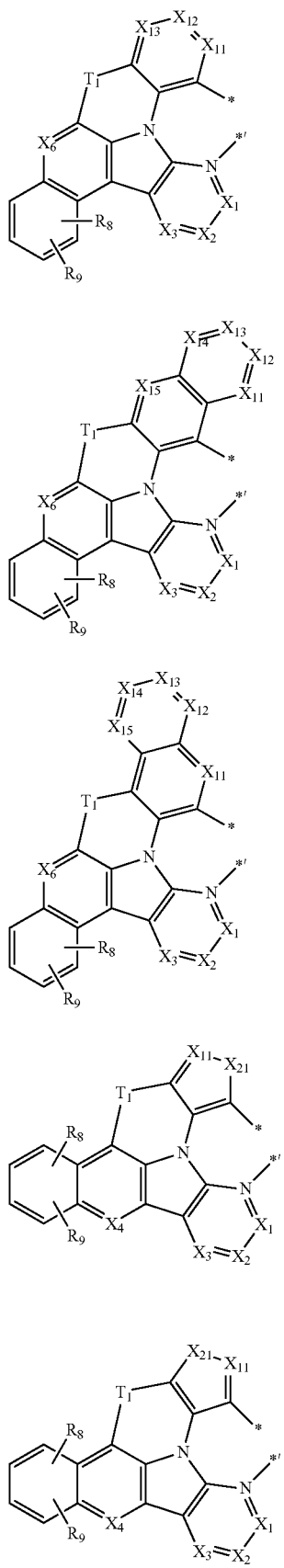
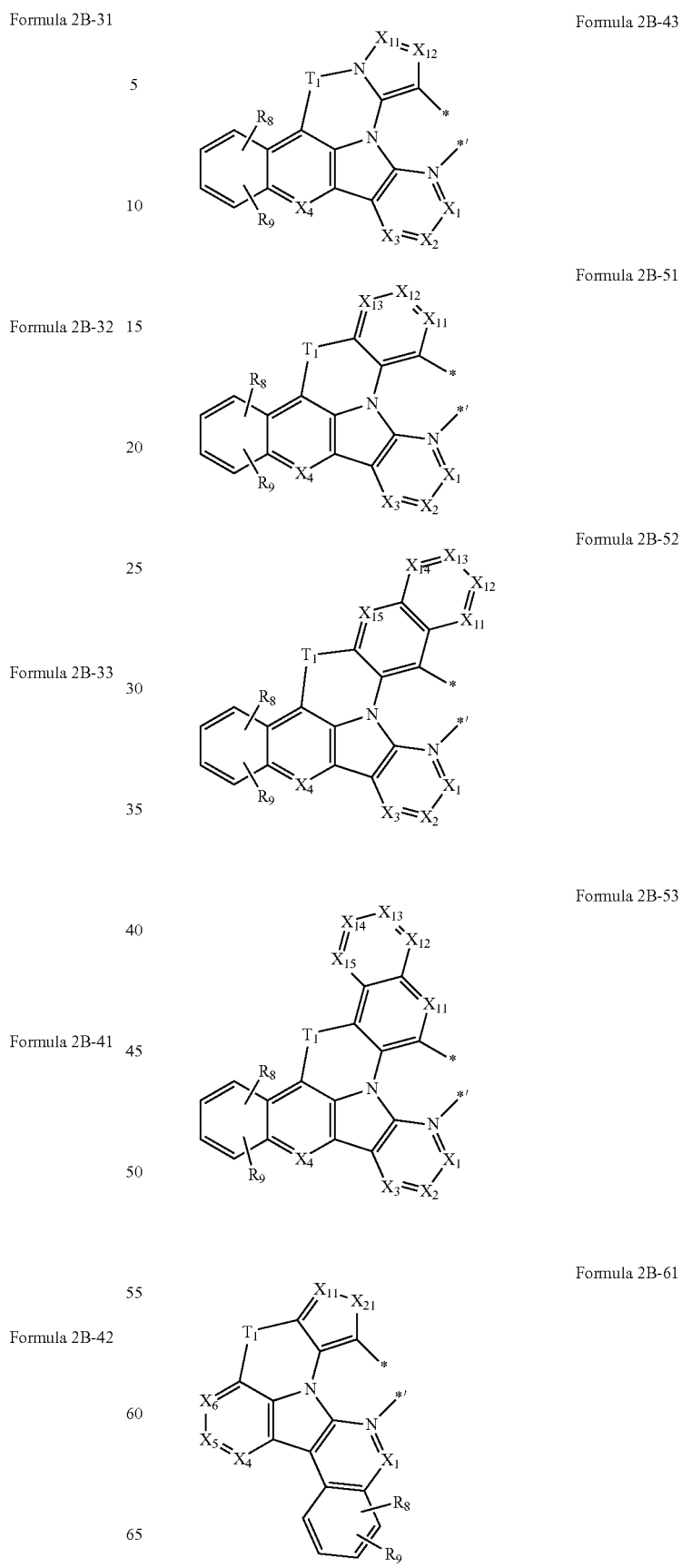

Formula 2B-62
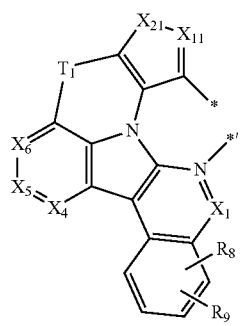
Formula 2B-63
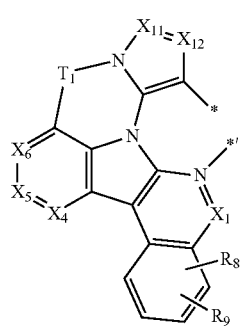
Formula 2B-71
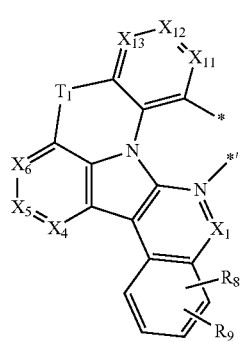
Formula 2B-72
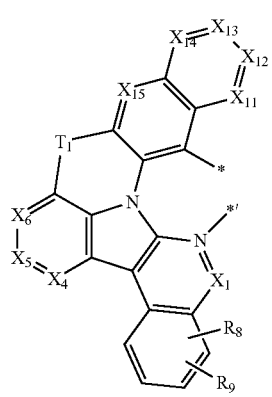
Formula 2B-73
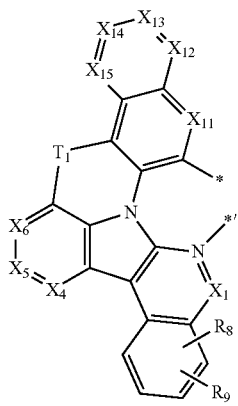
Formula 2B-81
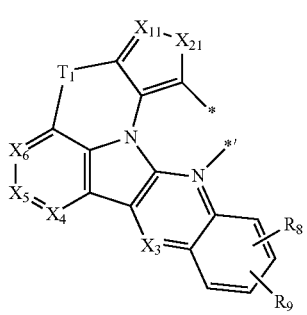
Formula 2B-82
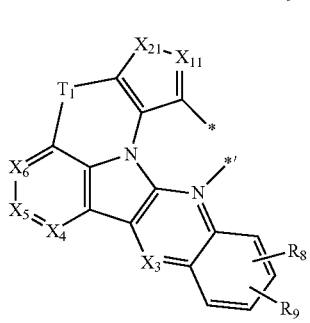
Formula 2B-83
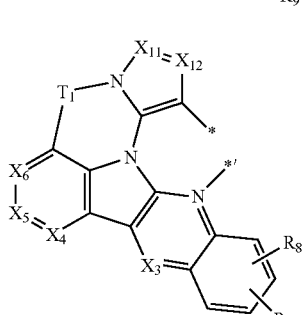
Formula 2B-91
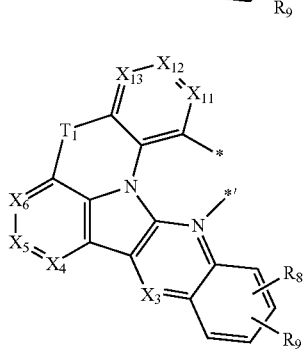

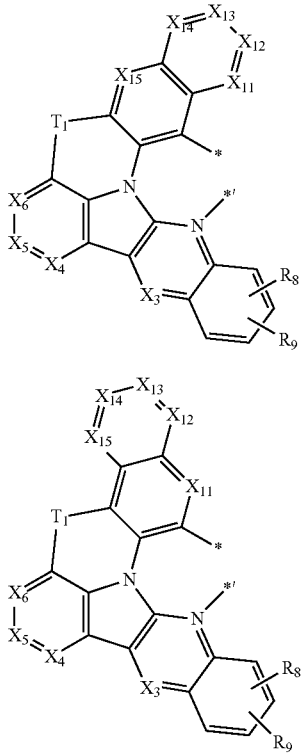

Formula 2B-92

Formula 2B-93

In Formulae 2A-1 to 2A-5, 2A-11 to 2A-14, 2A-21 to 2A-25, 2A-31 to 2A-34, 2A-41 to 2A-45, 2A-51 to 2A-54, 2A-61 to 2A-65, 2A-71 to 2A-74, 2A-81 to 2A-85, 2A-91 to 2A-94, 2A-101 to 2A-105, 2A-111 to 2A-114, 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93, descriptions of $X_1$ to $X_7$ and $T_1$ are the same as provided herein, $X_{11}$ may be N or $C(R_{11})$, $X_{12}$ may be N or $C(R_{12})$, $X_{13}$ may be N or $C(R_{13})$, $X_{14}$ may be N or $C(R_{14})$, $X_{15}$ may be N or $C(R_{15})$, $X_{16}$ may be N or $C(R_{16})$, $X_{21}$ may be O, S, $N(R_{21})$, or $C(R_{21})(R_{22})$, descriptions of $R_8$ and $R_9$ are the same as provided herein, descriptions of $R_{11}$ to $R_{16}$, $R_{21}$ and $R_{22}$ are each independently the same as the description of $R_{10}$ provided herein, and each of * and *' is a binding site to M in Formula 1.

In some embodiments, in Formulae 2A-1 to 2A-5, 2A-11 to 2A-14, 2A-21 to 2A-25, 2A-31 to 2A-34, 2A-41 to 2A-45, 2A-51 to 2A-54, 2A-61 to 2A-65, 2A-71 to 2A-74, 2A-81 to 2A-85, 2A-91 to 2A-94, 2A-101 to 2A-105, 2A-111 to 2A-114, 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93, $X_1$ may be $C(R_1)$, $X_2$ may be $C(R_2)$, $X_3$ may be $C(R_3)$, $X_4$ may be $C(R_4)$, $X_5$ may be $C(R_5)$, $X_6$ may be $C(R_6)$, $X_7$ may be $C(R_7)$, $T_1$ may be selected from *—O—*', *—S—*', *—$C(R_{31})$($R_{32}$)—*', *—$Si(R_{31})(R_{32})$—*', and groups represented by Formulae 11-1 to 11-4, $R_1$ to $R_9$, $R_{11}$ to $R_{16}$, $R_{21}$, $R_{22}$, $R_{31}$, and $R_{32}$ may be each independently selected from a hydrogen, a deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from a deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —$N(Q_1)(Q_2)$, —$Si(Q_3)(Q_4)(Q_5)$, —$B(Q_6)(Q_7)$, —$P(=O)(Q_8)(Q_9)$, and —$Ge(Q_{51})(Q_{52})(Q_{53})$, $Q_1$ to $Q_9$ and $Q_{51}$ to $Q_{53}$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, neighboring two substituents of $R_1$ to $R_3$ may be optionally linked to each other to form a substituted or unsubstituted $C_5$-$C_{10}$ carbocyclic ring (for example, a substituted or unsubstituted cyclopentane, a substituted or unsubstituted cyclohexane, a substituted or unsubstituted adamantane, a substituted or unsubstituted benzene, a substituted or unsubstituted pyridine, a substituted or unsubstituted pyrimidine, etc.), two neighboring substituents of $R_4$ to $R_7$ may be optionally linked to each other to form a substituted or unsubstituted $C_5$-$C_{10}$ carbocyclic ring (for example, a substituted or unsubstituted cyclopentane, a substituted or unsubstituted cyclohexane, a substituted or unsubstituted adamantane, a substituted or unsubstituted benzene, a substituted or unsubstituted pyridine, a substituted or unsubstituted pyrimidine, etc.), and two neighboring substituents of $R_{11}$ to $R_{16}$ may be optionally linked to each other to form a substituted or unsubstituted $C_5$-$C_{10}$ carbocyclic ring (for example, a substituted or unsubstituted cyclopentane, a substituted or unsubstituted cyclohexane, a substituted or unsubstituted adamantane, a substituted or unsubstituted benzene, a substituted or unsubstituted pyridine, a substituted or unsubstituted pyrimidine, etc.).

In some embodiments, in Formulae 2A-1 to 2A-5, 2A-11 to 2A-14, 2A-21 to 2A-25, 2A-31 to 2A-34, 2A-41 to 2A-45, 2A-51 to 2A-54, 2A-61 to 2A-65, 2A-71 to 2A-74, 2A-81 to 2A-85, 2A-91 to 2A-94, 2A-101 to 2A-105, 2A-111 to 2A-114, 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93, $X_1$ may be $C(R_1)$, $X_2$ may be $C(R_2)$, $X_3$ may be $C(R_3)$, $X_4$ may be $C(R_4)$, $X_5$ may be $C(R_5)$, $X_6$ may be $C(R_6)$, $X_7$ may be $C(R_7)$, $T_1$ may be selected from *—O—*', *—S—*', *—C($R_{31}$)($R_{32}$)—*', *—Si($R_{31}$)($R_{32}$)—*', and groups represented by Formulae 11-1 to 11-4, and $R_1$ to $R_9$, $R_{11}$ to $R_{16}$, $R_{21}$, $R_{22}$, $R_{31}$, and $R_{32}$ may be each independently selected from a hydrogen, a deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19, groups represented by Formulae 10-1 to 10-36, —Si($Q_3$)($Q_4$)($Q_5$), and —Ge($Q_{51}$)($Q_{52}$)($Q_{53}$), but embodiments are not limited thereto.

In some embodiments, ligand $L_1$ in Formula 1 may be selected from ligands represented by Formulae 2A-1 (1) to 2A-1 (3), 2A-3(1) to 2A-3(3), 2A-11(1) to 2A-11(9), and 2B-11(1) to 2B-11(6):

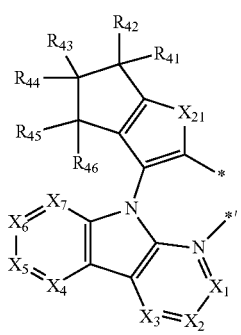

Formula 2A-1(1)

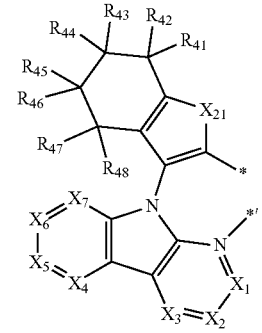

Formula 2A-1(2)

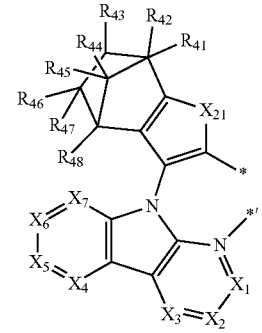

Formula 2A-1(3)

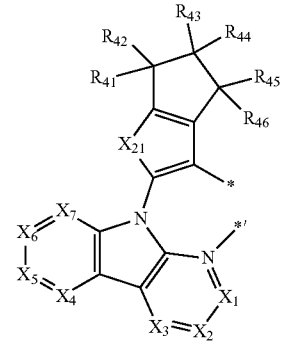

Formula 2A-3(1)

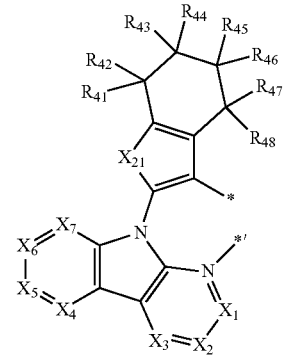

Formula 2A-3(2)

Formula 2A-3(3)
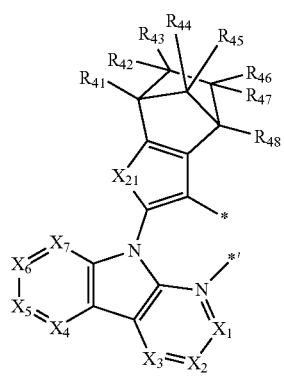
Formula 1A-11(1)
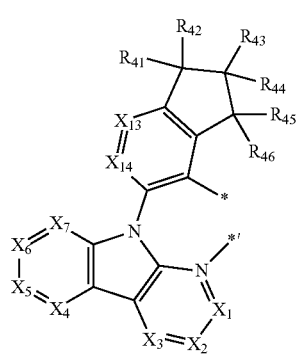
Formula 2A-11(2)
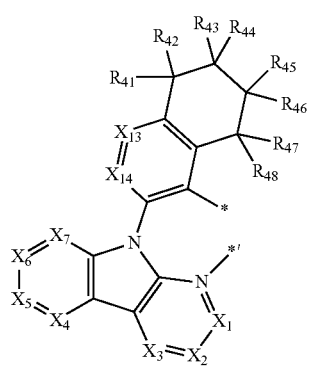
Formula 2A-11(3)
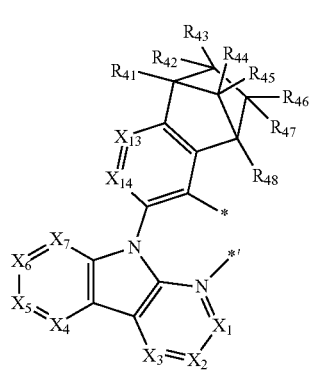
Formula 2A-11(4)
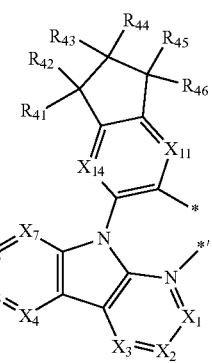
Formula 2A-11(5)
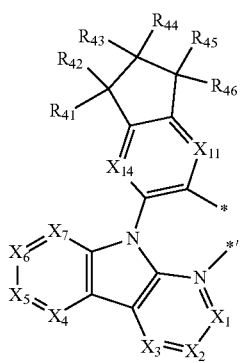
Formula 2A-11(6)
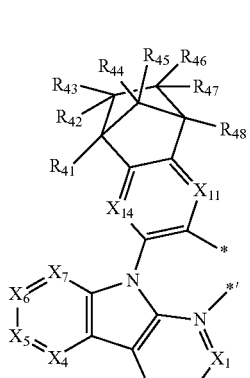
Formula 2A-11(7)
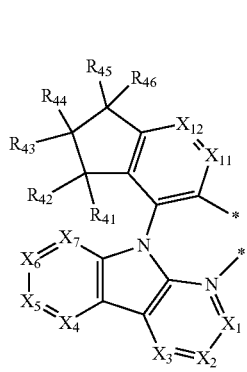

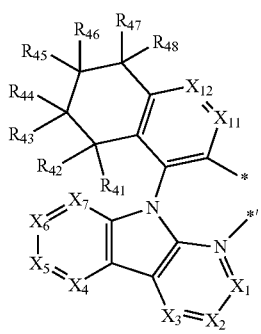
Formula 2A-11(8)
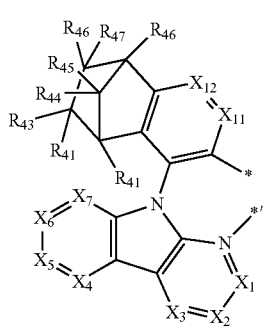
Formula 2A-11(9)
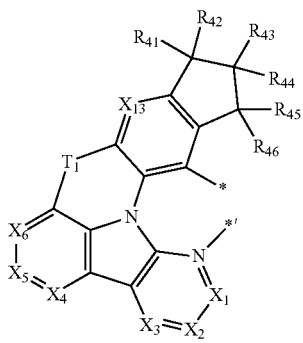
Formula 2B-11(1)
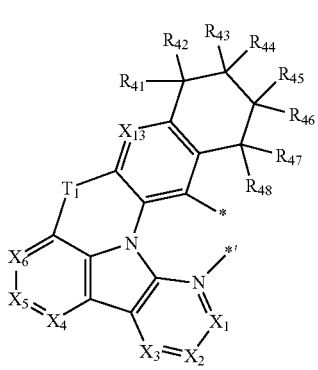
Formula 2B-11(2)
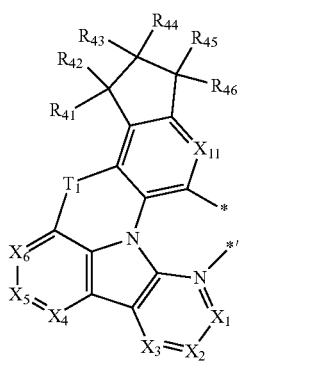
Formula 2B-11(3)
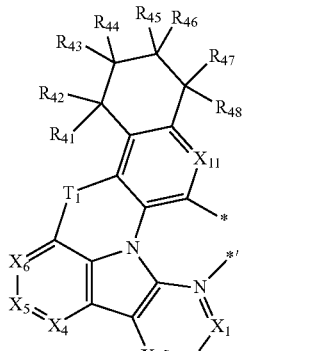
Formula 2B-11(4)
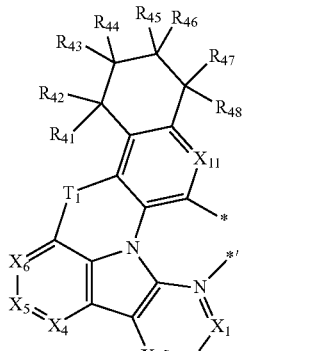
Formula 2B-11(5)
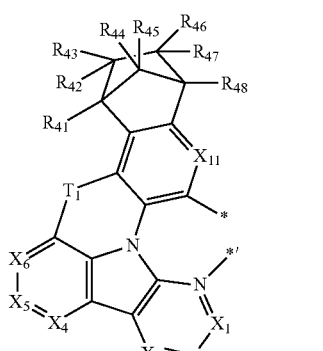
Formula 2B-11(6)

In Formulae 2A-1(1) to 2A-1(3), 2A-3(1) to 2A-3(3), 2A-11(1) to 2A-11(9), and 2B-11(1) to 2B-11(6), descriptions of $X_1$ to $X_7$ and $T_1$ are the same as provided herein, $X_{11}$ may be N or $C(R_{11})$, $X_{12}$ may be N or $C(R_{12})$, $X_{13}$ may be N or $C(R_{13})$, $X_{14}$ may be N or $C(R_{14})$, $X_{21}$ may be O, S, $N(R_{21})$, or $C(R_{21})(R_{22})$, descriptions of $R_{11}$ to $R_{14}$, $R_{21}$, $R_{22}$, $R_{31}$, and $R_{32}$ are the same as provided herein, and descriptions of $R_{41}$ to $R_{48}$ are the same as the description of $R_1$ provided herein.

In some embodiments, in Formulae 2A-1(1) to 2A-1(3), 2A-3(1) to 2A-3(3), 2A-11(1) to 2A-11(9), and 2B-11(1) to 2B-11(6), $X_1$ may be $C(R_1)$, $X_2$ may be $C(R_2)$, $X_3$ may be $C(R_3)$, $X_4$ may be $C(R_4)$, $X_5$ may be $C(R_5)$, $X_6$ may be $C(R_6)$, $X_7$ may be $C(R_7)$, $T_1$ may be selected from *—O—*', *—S—*', *—C($R_{31}$)($R_{32}$)—*', *—Si($R_{31}$)($R_{32}$)—*', and groups represented by Formulae 11-1 to 11-4, $X_{11}$ may be N or $C(R_{11})$, $X_{12}$ may be N or $C(R_{12})$, $X_{13}$ may be N or $C(R_{13})$, $X_{14}$ may be N or $C(R_{14})$, $X_{21}$ may be O, S, $N(R_{21})$, or $C(R_{21})(R_{22})$, $R_1$ to $R_7$, $R_{11}$ to $R_{14}$, $R_{21}$, $R_{22}$, $R_{31}$, $R_{32}$, and $R_{41}$ to $R_{48}$ may be each independently selected from a hydrogen, a deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from a deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —$N(Q_1)(Q_2)$, —$Si(Q_3)(Q_4)(Q_5)$, —$B(Q_6)(Q_7)$, —$P(=O)(Q_8)(Q_9)$, and —$Ge(Q_{51})(Q_{52})(Q_{53})$, and $Q_1$ to $Q_9$ and $Q_{51}$ to $Q_{53}$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group.

$Y_4$ and $Y_5$ in Formula 2C may be each independently O, N, P, or As.

In some embodiments, ligand $L_2$ in Formula 1 may be selected from ligands represented by Formulae 3A to 3C:

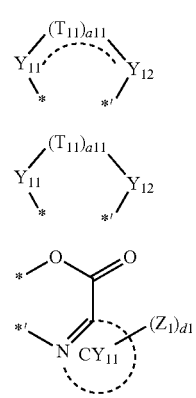

Formula 3A

Formula 3B

Formula 3C

In Formulae 3A to 3C, $Y_{11}$ may be selected from O, N, $N(Z_1)$, $P(Z_1)(Z_2)$, and $As(Z_1)(Z_2)$, $Y_{12}$ may be selected from O, N, $N(Z_3)$, $P(Z_3)(Z_4)$, and $As(Z_3)(Z_4)$, $CY_{11}$ may be a $C_2$-$C_{30}$ heterocyclic group, $T_{11}$ may be each independently selected from a single bond, a double bond, *—$C(Z_{11})(Z_{12})$—*', *—$C(Z_{11})$=$C(Z_{12})$—*', *=$C(Z_{11})$—*', *—$C(Z_{11})$=*', *=$C(Z_{11})$—$C(Z_{12})$=$C(Z_{13})$—*', *—$C(Z_{11})$=$C(Z_{12})$—$C(Z_{13})$=*', *—$N(Z_{11})$—*', and a substituted or unsubstituted $C_6$-$C_{30}$ arylene group, a11 may be an integer selected from 1 to 10, $Z_1$ to $Z_4$ and $Z_{11}$ to $Z_{13}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), and —P(=O)($Q_8$)($Q_9$), d1 may be an integer selected from 0 to 10, and each of * and *' may be a binding site to M in Formula 1.

In some embodiments, in Formulae 3A to 3C, $CY_{11}$ may be selected from a pyridine, a pyrimidine, a triazine, a pyrrole, a pyrazole, an imidazole, and a triazole, $Z_1$ to $Z_4$ and $Z_{11}$ to $Z_{13}$ may be each independently selected from a hydrogen, a deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from a deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —N($Q_1$)($Q_2$), —Si($Q_3$)($Q_4$)($Q_5$), —B($Q_6$)($Q_7$), —P(=O)($Q_8$)($Q_9$), and —Ge($Q_{51}$)($Q_{52}$)($Q_{53}$); and $Q_1$ to $Q_9$ and $Q_{51}$ to $Q_{53}$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, but embodiments are not limited thereto.

According to another embodiment, ligand $L_2$ in Formula 1 may be selected from ligands represented by Formulae 3-1 to 3-14:

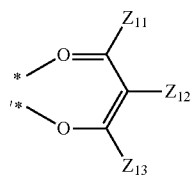

Formula 3-1

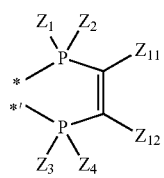

Formula 3-2

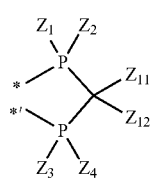

Formula 3-3

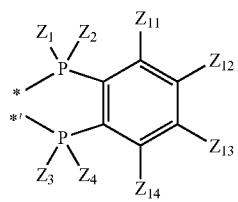

Formula 3-4

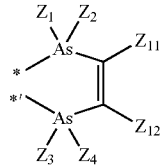

Formula 3-5

-continued

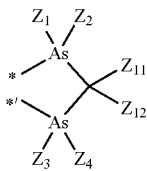
Formula 3-6

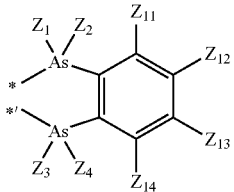
Formula 3-7

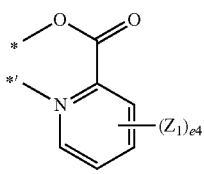
Formula 3-8

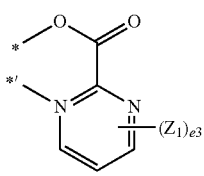
Formula 3-9

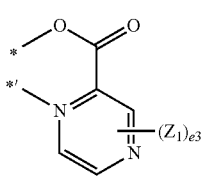
Formula 3-10

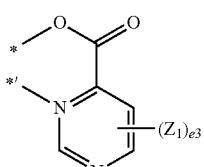
Formula 3-11

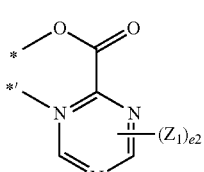
Formula 3-12

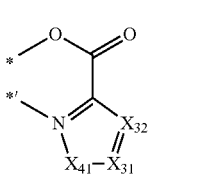
Formula 3-13

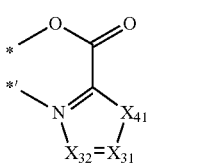
Formula 3-14

In Formulae 3-1 to 3-14, $X_{31}$ may be N or $C(Z_{1a})$, $X_{32}$ may be N or $C(Z_{1b})$, $X_{41}$ may be O, S, $N(Z_{1a})$, or $C(Z_{1a})(Z_{1b})$, $Z_1$ to $Z_4$, $Z_{1a}$, $Z_{1b}$, and $Z_{11}$ to $Z_{14}$ may be each independently selected from a hydrogen, a deuterium, —F, a cyano group, a nitro group, —SF$_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from a deuterium, —F, —CD$_3$, —CD$_2$H, —CDH$_2$, —CF$_3$, —CF$_2$H, —CFH$_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —N($Q_1$)($Q_2$), —Si($Q_3$)($Q_4$)($Q_5$), —B($Q_6$)($Q_7$), —P(=O)($Q_8$)($Q_9$), and —Ge($Q_{51}$)($Q_{52}$)($Q_{53}$), $Q_1$ to $Q_9$ and $Q_{51}$ to $Q_{53}$ may be each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, e2 may be 1 or 2, e3 may be an integer selected from 1 to 3, and e4 may be an integer selected from 1 to 4.

According to an embodiment, ligand $L_1$ in Formula 1 may be selected from ligands represented by Formulae 2A-1 to 2A-5, 2A-11 to 2A-14, 2A-21 to 2A-25, 2A-31 to 2A-34, 2A-41 to 2A-45, 2A-51 to 2A-54, 2A-61 to 2A-65, 2A-71 to 2A-74, 2A-81 to 2A-85, 2A-91 to 2A-94, 2A-101 to 2A-105, 2A-111 to 2A-114, 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93, and ligand $L_2$ may be selected from ligands represented by Formulae 3A to 3C (for example, ligands represented by Formulae 3-1 to 3-14).

In some embodiments, ligand $L_1$ in Formula 1 may be selected from ligands represented by Formulae 2A-1(1) to 2A-1(3), 2A-3(1) to 2A-3(3), 2A-11(1) to 2A-11(9), and 2B-11(1) to 2B-11(6), and ligand $L_2$ may be selected from ligands represented by Formulae 3A to 3C (for example, ligands represented by Formulae 3-1 to 3-14).

In some embodiments, in Formula 1, M may be Ir, n1 may be 2, n2 may be 1, and $L_2$ may be selected from ligands represented by Formulae 3-1 and 3-8 to 3-14.

In some embodiments, in Formula 1, M may be Pt, n1 may be 2, and n2 may be 0.

In some embodiments, in Formula 1, M may be Os, n1 may be 2, n2 may be 1, and $L_2$ may be selected from ligands represented by Formulae 3-2 to 3-7.

In some embodiments, an organometallic compound represented by Formula 1 may not be a cation and an anion pair further including a counter-ion and may rather be neutral.

An organometallic compound represented by Formula 1 may be one of Compounds 1 to 109, but embodiments are not limited thereto:

1
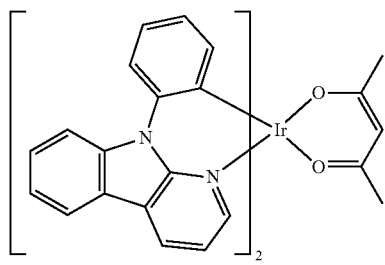

2
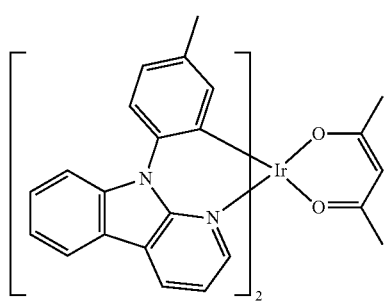

3
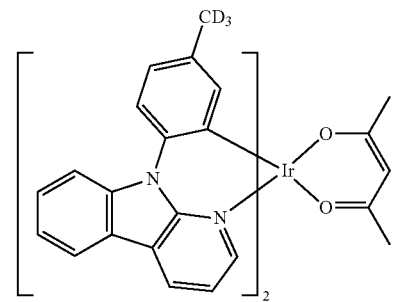

4
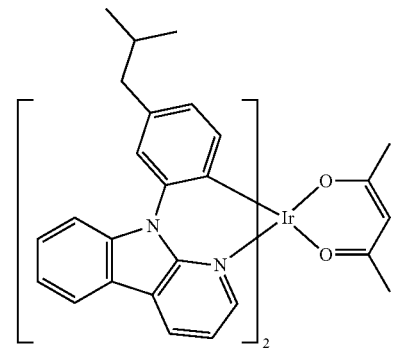

5
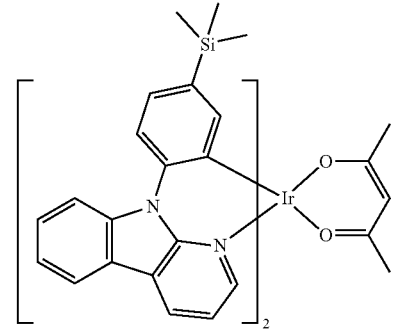

6
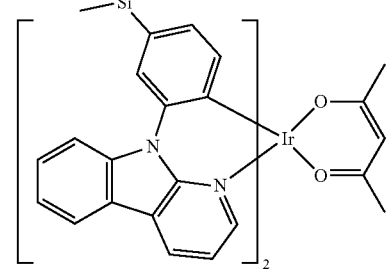

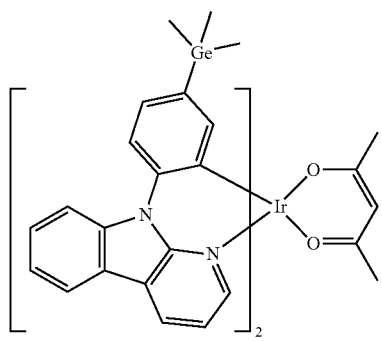
7
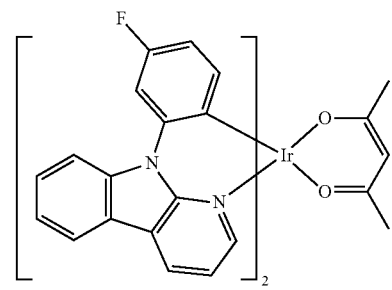
12
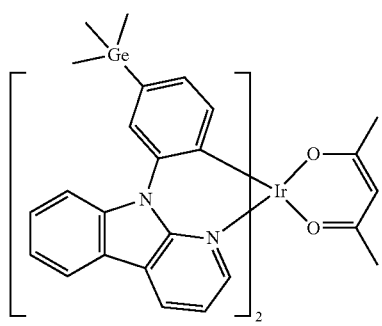
8
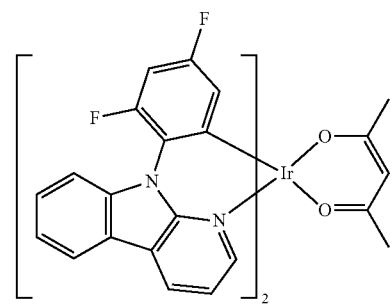
13
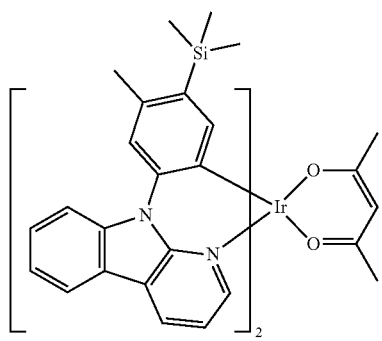
9
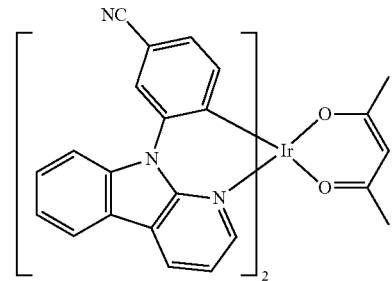
14
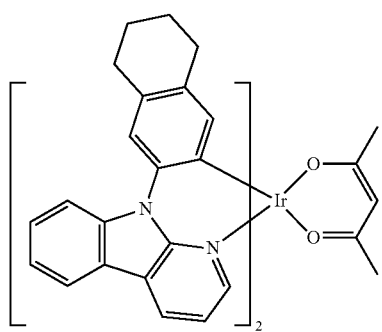
10
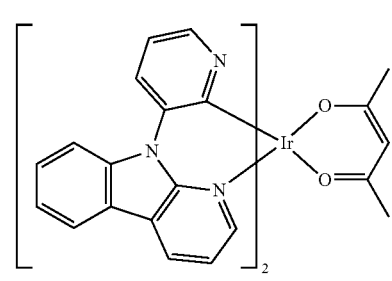
15
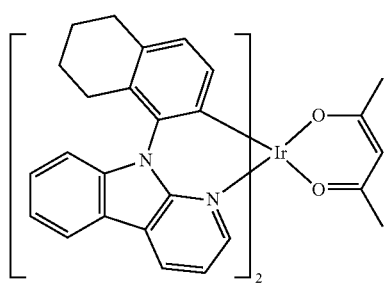
11
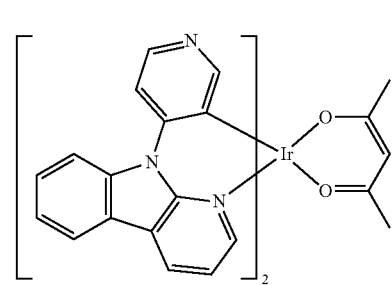
16

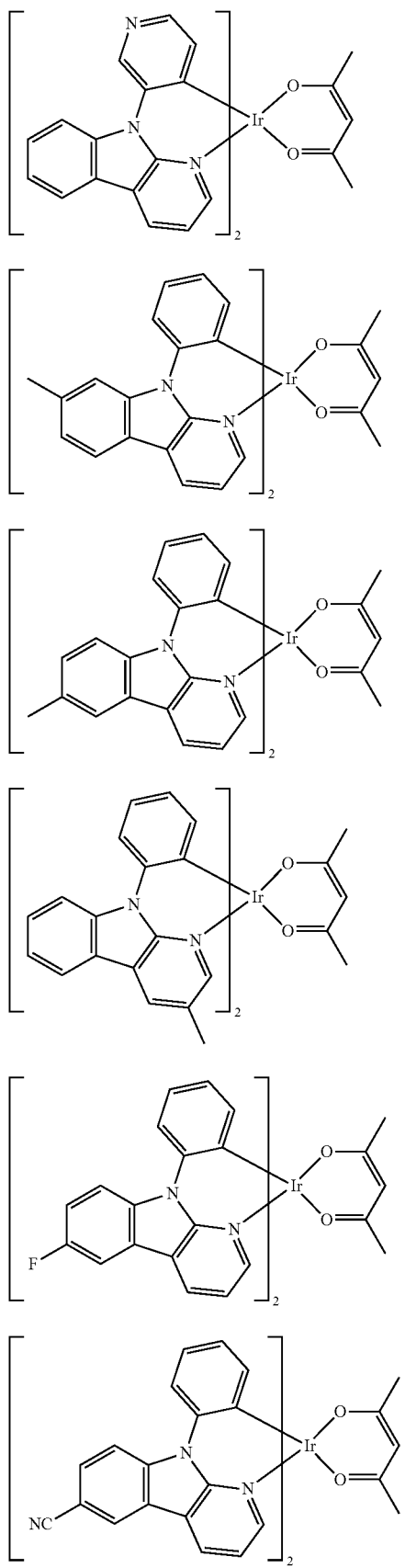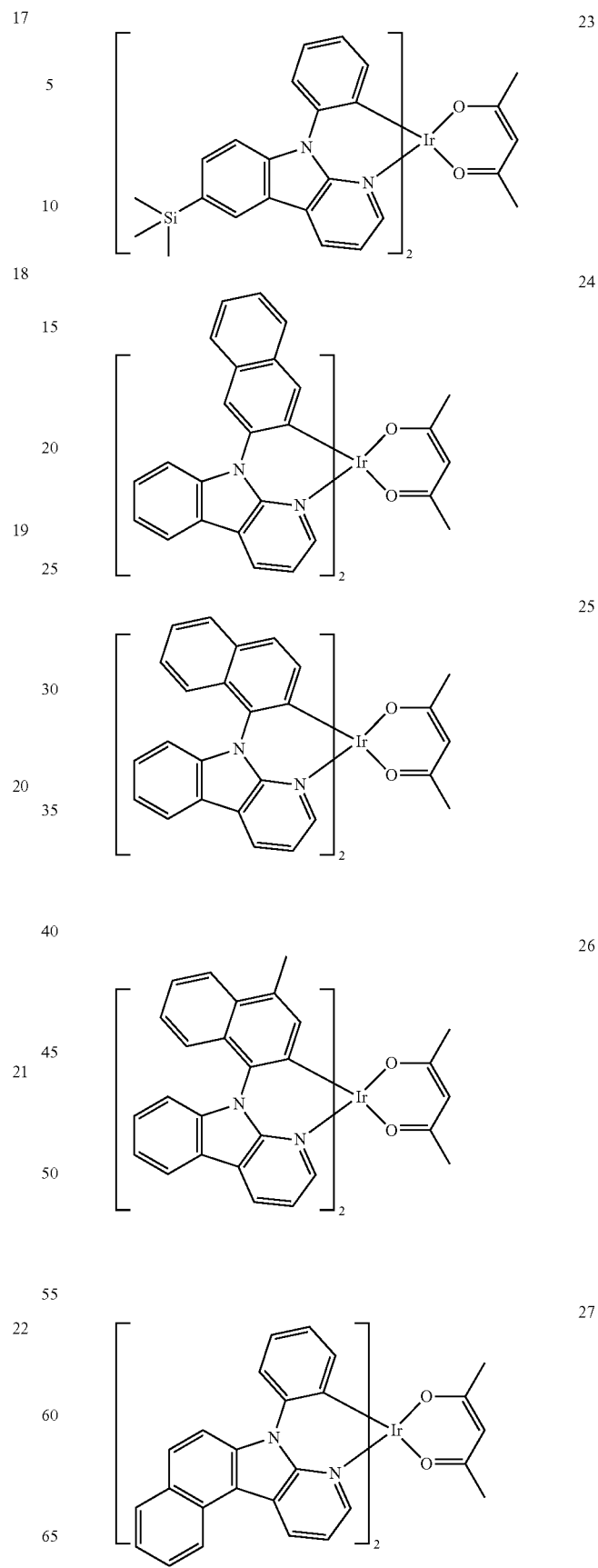

28
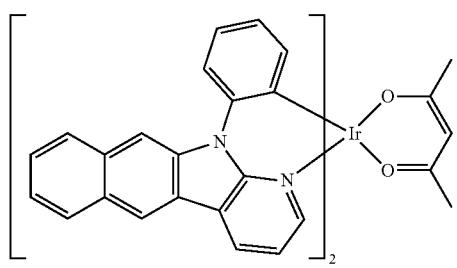
29
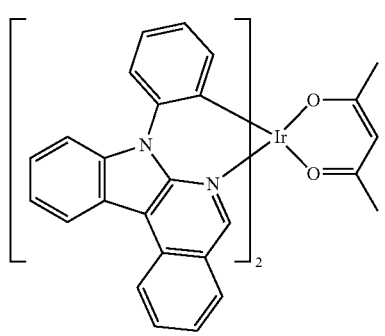
30
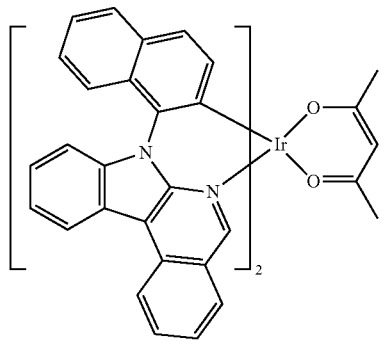
31
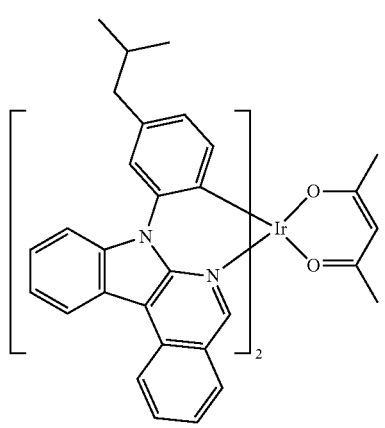
32
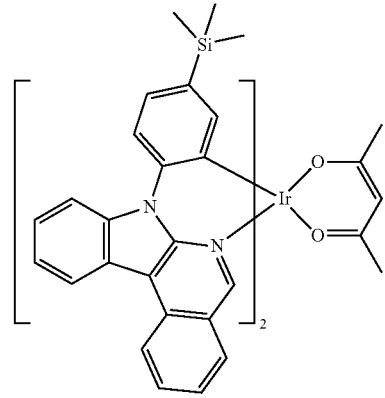
33
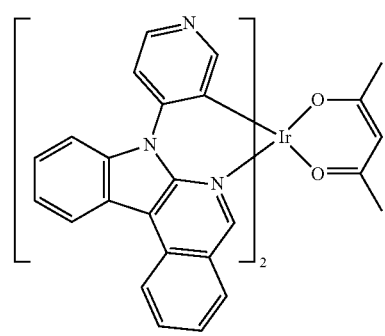
34
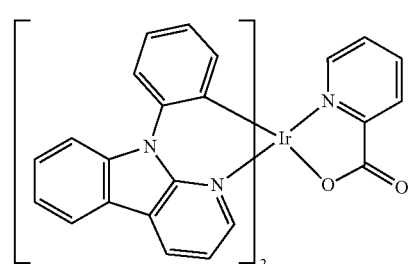
35
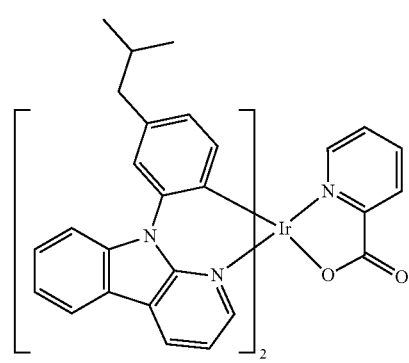

36
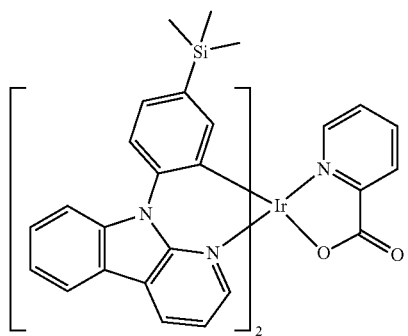
37
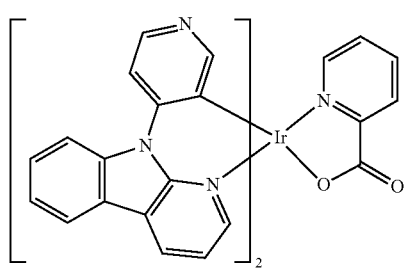
38
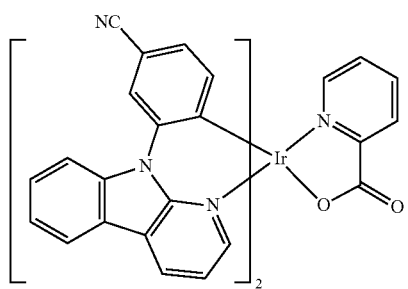
39
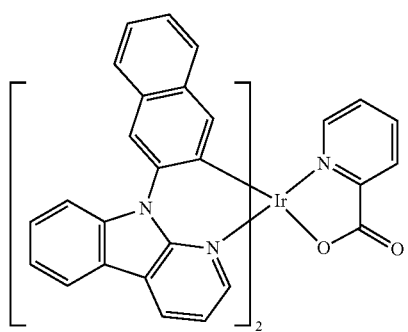
40
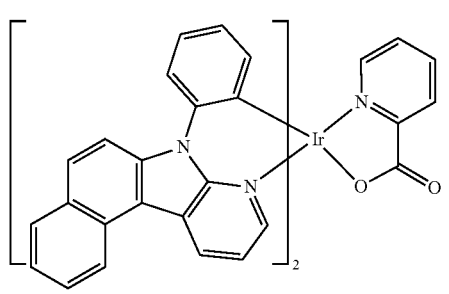
41
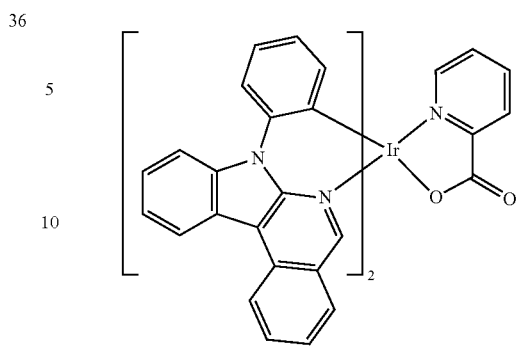
42
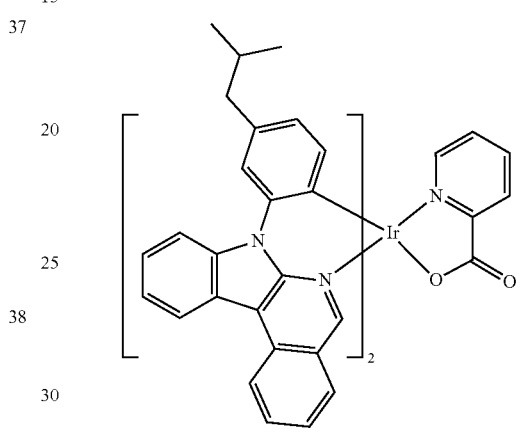
43
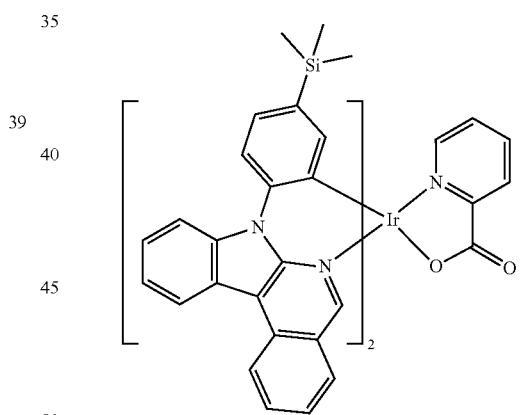
44
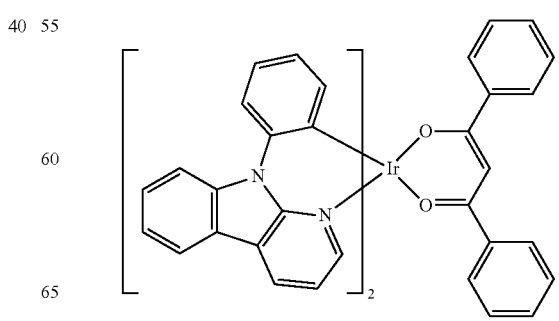

45
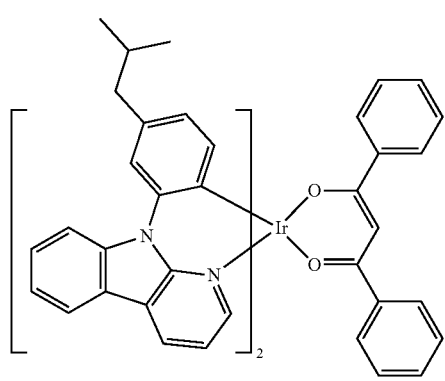
46
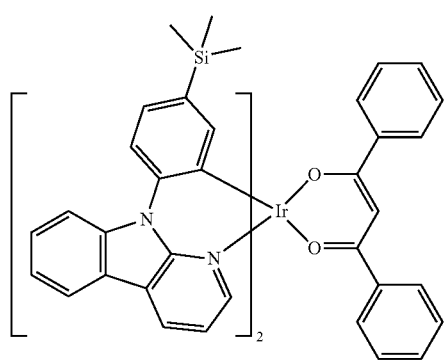
47
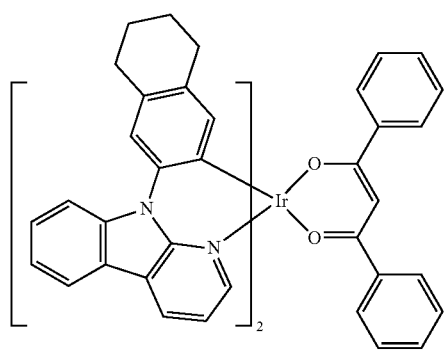
48
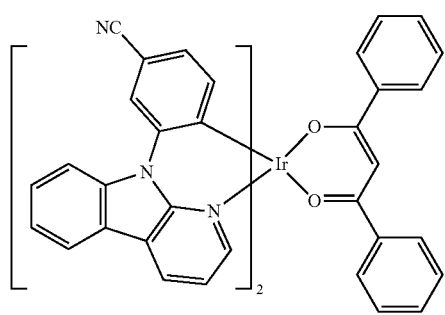
49
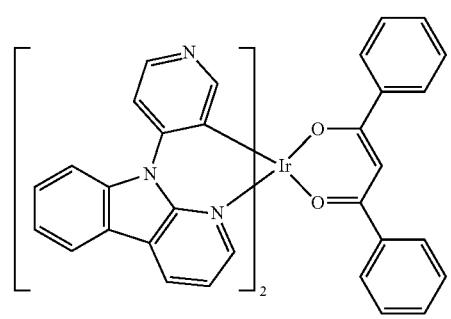
50
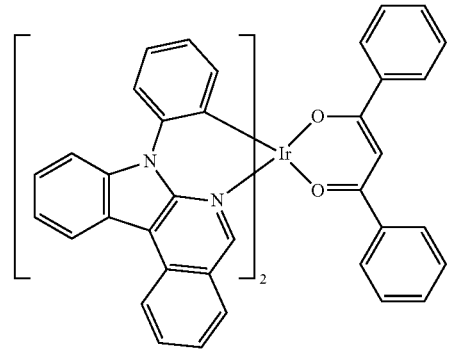
51
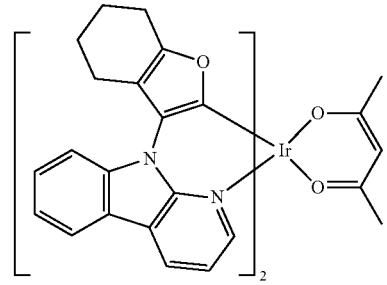
52
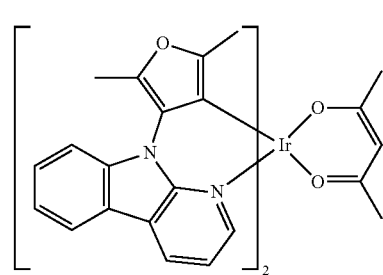
53
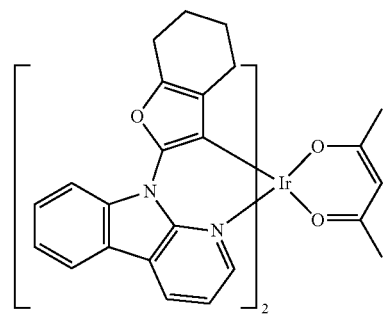

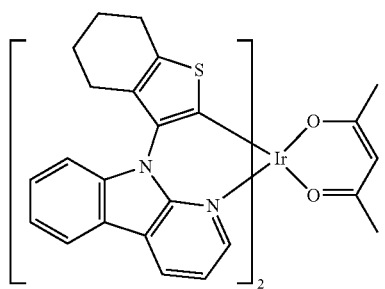
54
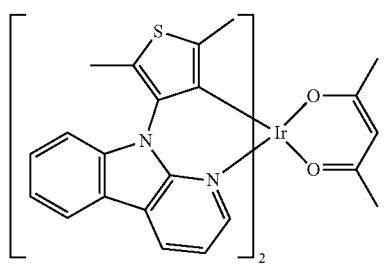
55
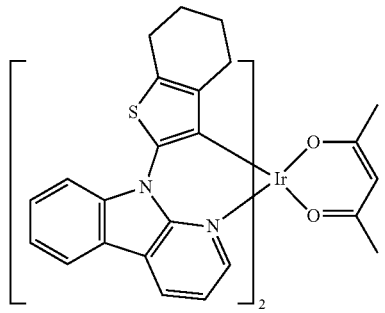
56
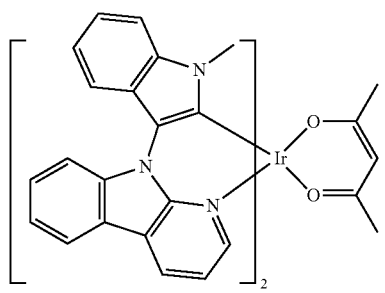
57
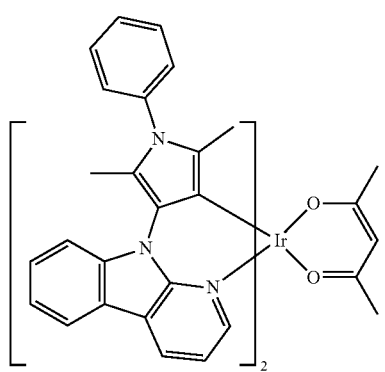
58
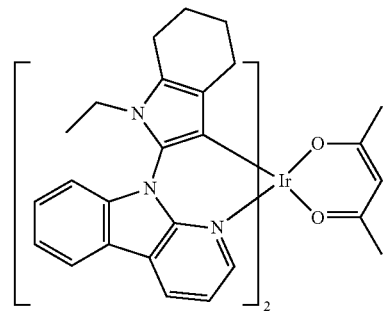
59
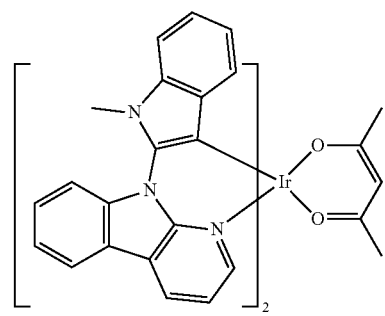
60
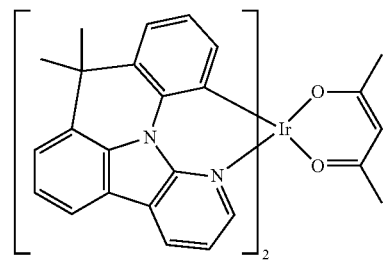
61
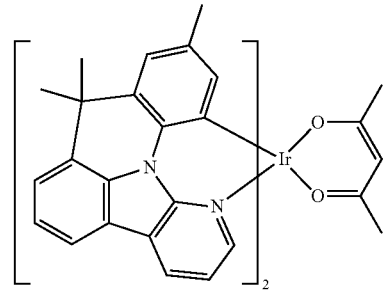
62
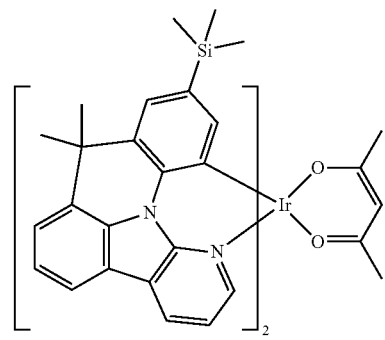
63

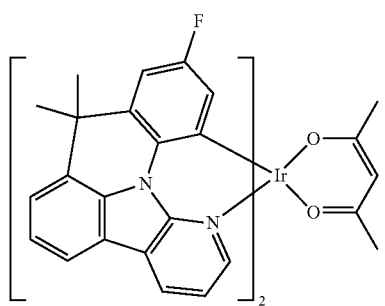
64
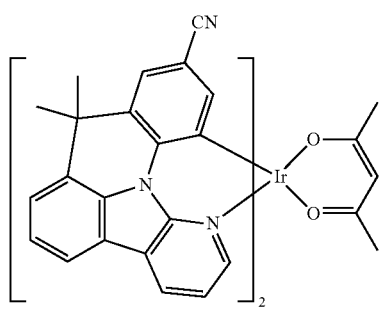
65
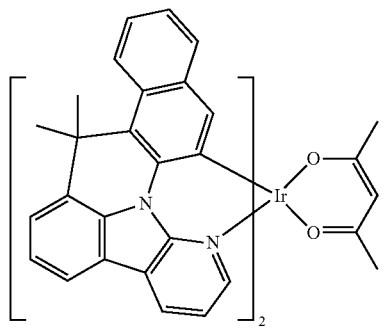
66
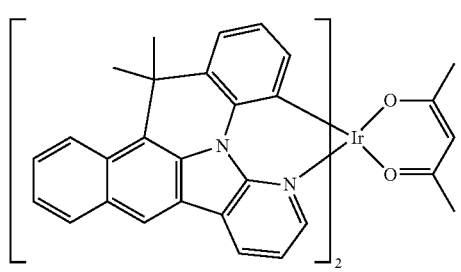
67
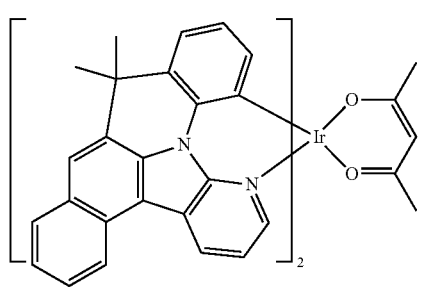
68
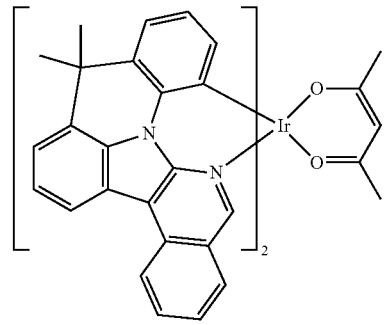
69
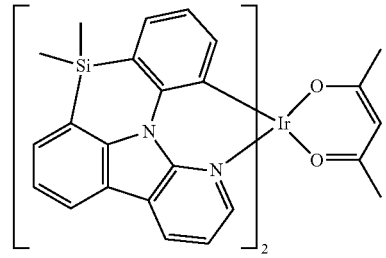
70
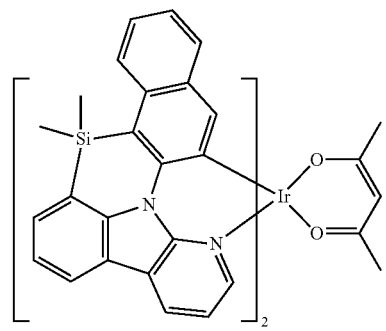
71
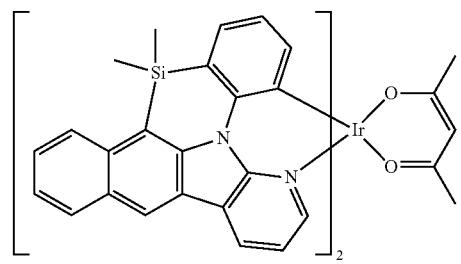
72
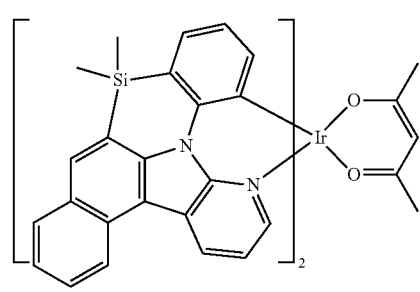
73

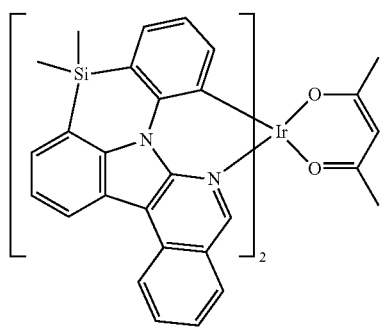
74
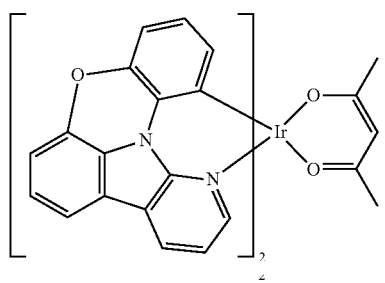
75
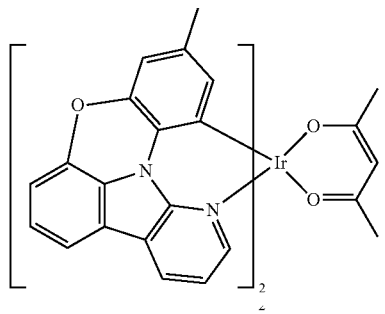
76
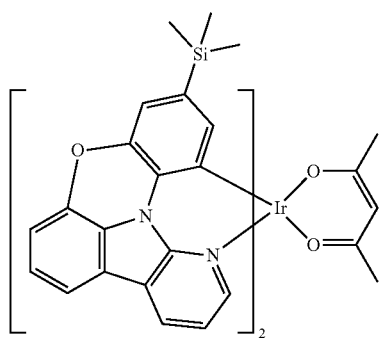
77
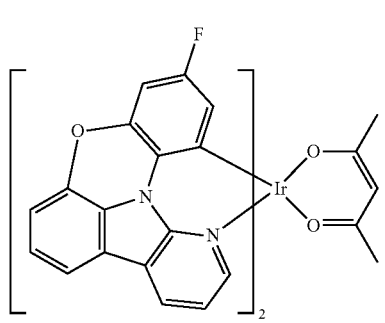
78
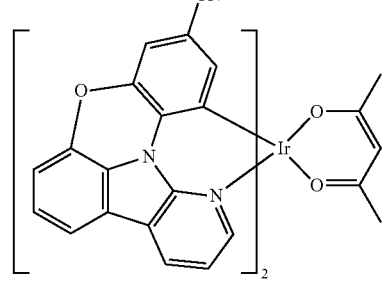
79
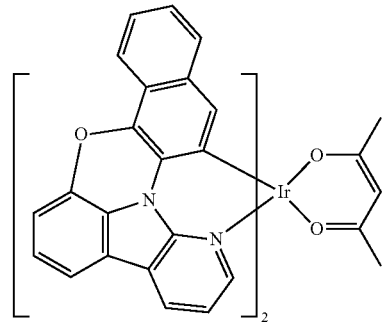
80
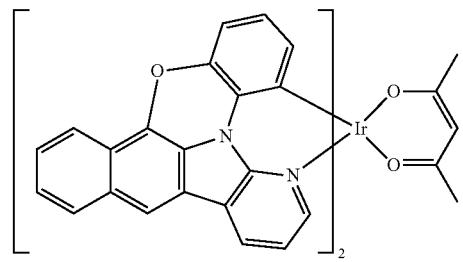
81
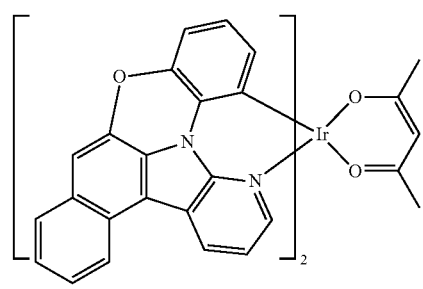
82
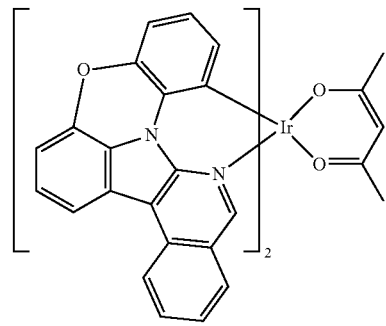
83

84
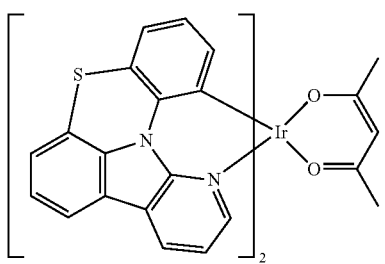
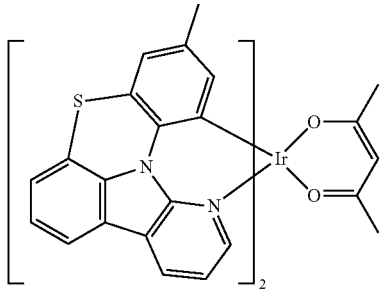
85
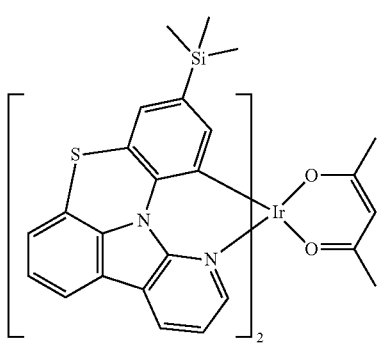
86
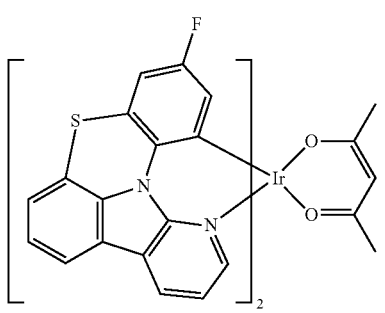
87
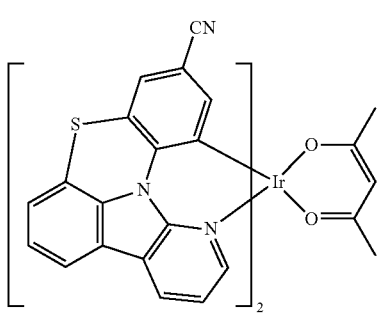
88
89
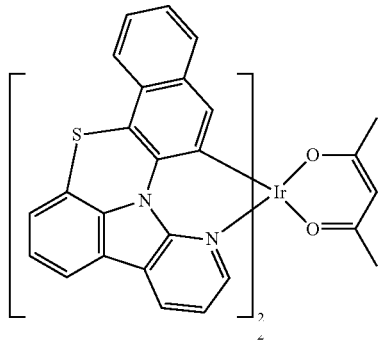
90
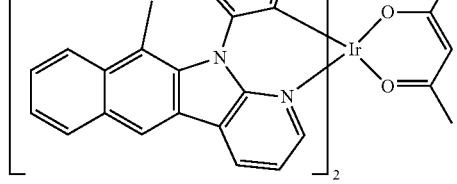
91
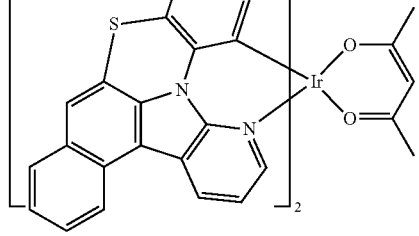
92
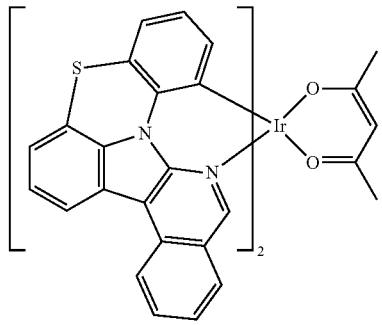
93
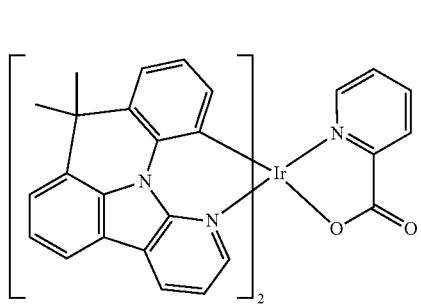

94
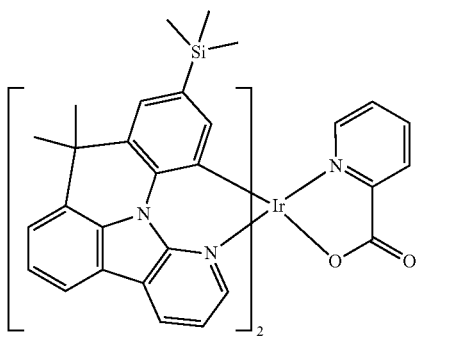
95
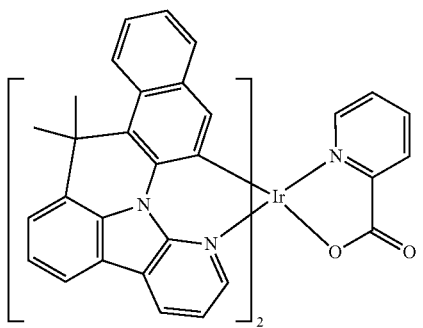
96
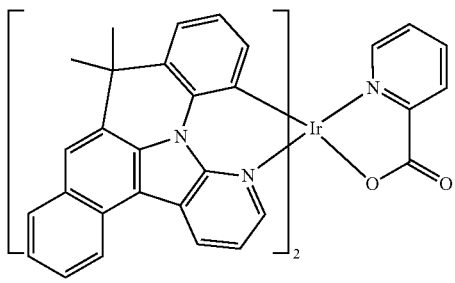
97
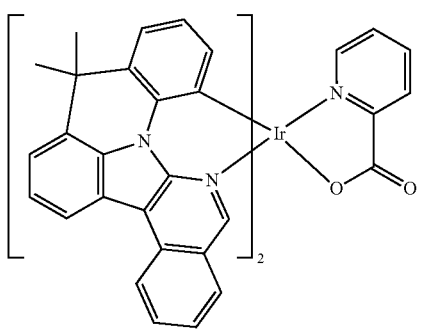
98
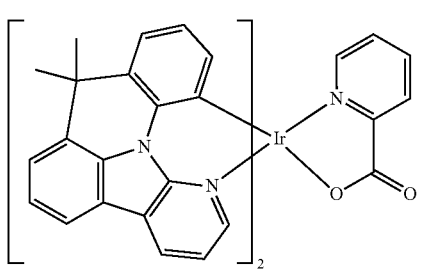
99
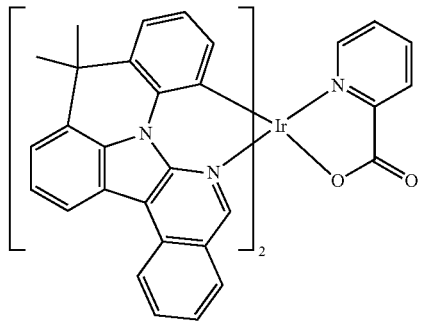
100
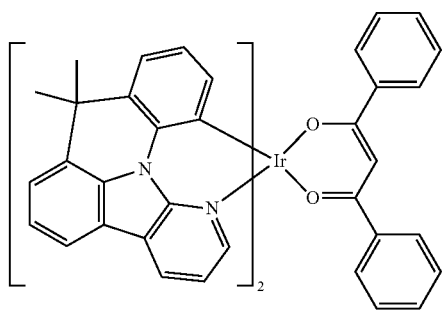
101
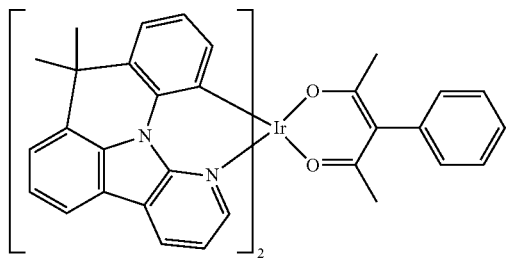
102
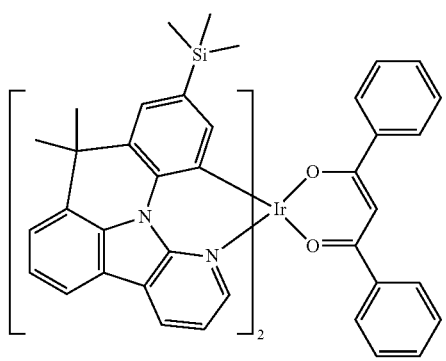
103
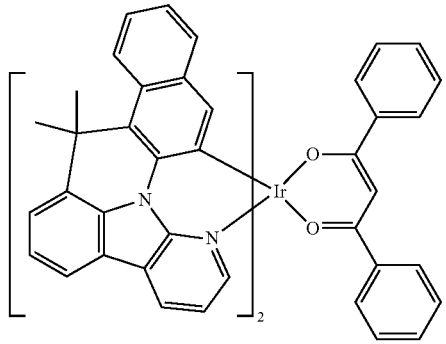

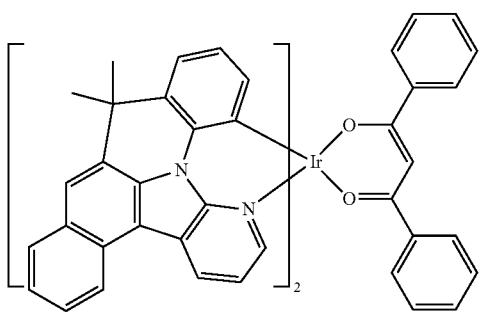

104

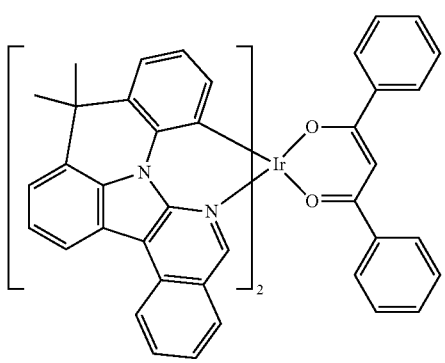

105

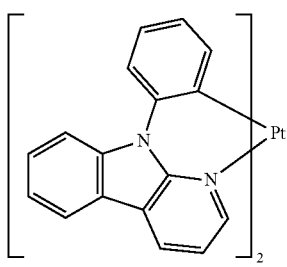

106

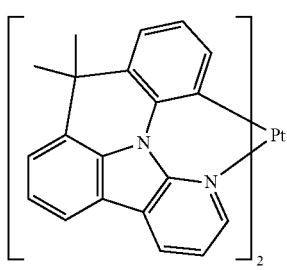

107

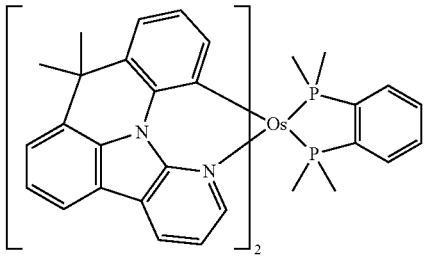

108

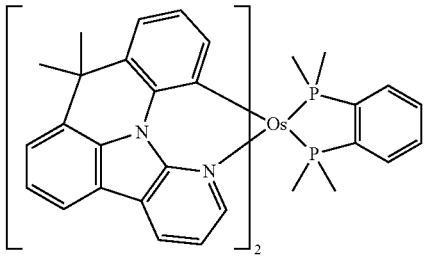

109

A ligand $L_1$ of an organometallic compound represented by Formula 1 may be selected from a ligand represented by Formula 2A and a ligand represented by Formula 2B. Thus, an organometallic compound represented by Formula 1 may have am improved charge mobility within a ligand to thus have an excellent luminous efficiency, which is confirmed by, for example, data of luminous efficiency that will be described later in Examples 1 to 4 and Comparative Example 1.

In some embodiments, a ligand $L_2$ in an organometallic compound represented by Formula 1 may be selected from a ligand represented by Formula 2C. Thus, strain energy in a molecule of an organometallic compound represented by Formula 1 is reduced, and the organometallic compound represented by Formula 1 may be structurally stable, and thus, an electric device adopting the organometallic compound represented by Formula 1, for example, an organic light-emitting device, may have excellent durability.

For example, energy levels of HOMO, LUMO, singlet $S_1$ and triplet $T_1$ with respect to some compounds among the organometallic compounds are evaluated by using a design for testability (DFT) method of a Gaussian program (a structure is optimized at a level of B3LYP and 6-31G(d,p)) and the results thereof are provided in Table 1 below.

TABLE 1

| Compound No. | HOMO (eV) | LUMO (eV) | $T_1$ energy level (eV) |
|---|---|---|---|
| 1 | −4.748 | −1.475 | 2.471 |
| 24 | −4.815 | −1.552 | 2.539 |
| 25 | −4.719 | −1.511 | 2.428 |
| 34 | −4.983 | −1.597 | 2.597 |
| 61 | −4.726 | −1.405 | 2.472 |
| 69 | −5.737 | −1.815 | 2.105 |
| 75 | −4.848 | −1.517 | 2.353 |
| 83 | −4.815 | −1.907 | 2.016 |
| 106 | −5.032 | −1.639 | 2.637 |
| Comparison Material 1 | −4.691 | −1.298 | 2.528 |

Comparison Material 1

Table 1 shows that the organometallic compound represented by Formula 1 may have electric characteristics suitable for use as a dopant of an electric device, for example, an organic light-emitting device.

A method of synthesizing an organometallic compound represented by Formula 1 may be recognized by those of ordinary skill in the art with reference to Synthesis Examples below.

In this regard, the organometallic compound represented by Formula 1 may be suitable for use as a dopant of an organic layer of an organic light-emitting device, for example, an emission layer in the organic layer, and according to another aspect, the organic light-emitting device may include:

a first electrode;

a second electrode; and an organic layer disposed between the first electrode and the second electrode, wherein the organic layer includes the emission layer and at least one organometallic compound represented by Formula 1.

The organic light-emitting device includes the organic layer including the organometallic compound represented by Formula 1, thereby having low driving voltage, high efficiency, high power, high quantum efficiency, long lifespan, and excellent color purity.

The organometallic compound represented by Formula 1 may be used in a pair of electrodes in an organic light-emitting device. For example, the organometallic compound represented by Formula 1 may be included in the emission layer. Here, the organometallic compound may serve as a dopant, and the emission layer may further include a host. (In other words, the amount of an organometallic compound represented by Formula 1 is less than the amount of the host).

The expression as used herein "(an organic layer) includes at least one organometallic compound" may be understood as "(organic layer) may include one organometallic compound represented by Formula 1 or two or more different organometallic compounds represented by Formula 1".

For example, the organic layer may include only Compound 1 as the organometallic compound. In this regard, Compound 1 may be included in the emission layer of the organic light-emitting device. Alternatively, the organic layer may include Compound 1 and Compound 2 as the organometallic compounds. In this regard, Compound 1 and Compound 2 may be included in the same layer (for example, both Compound 1 and Compound 2 may be included in the emission layer).

The first electrode may be an anode, which is a hole injection electrode, and the second electrode may be a cathode, which is an electron injection electrode. Alternatively, the first electrode may be a cathode, which is an electron injection electrode, and the second electrode may be an anode, which is a hole injection electrode.

For example, the first electrode may be an anode, the second electrode may be a cathode, and the organic layer may include:

i) a hole transport region disposed between the first electrode and the emission layer, wherein the hole-transport region may include at least one selected from a hole injection layer, a hole-transport layer, and an electron blocking layer; and ii) an electron transport region disposed between the emission layer and the second electrode, wherein the electron transport region may include at least one selected from a hole blocking layer, an electron transport layer, and an electron injection layer.

As used herein, the term the "organic layer" refers to a single and/or a plurality of layers disposed between the first electrode and the second electrode in an organic light-emitting device. The "organic layer" may include not only organic compounds but also organometallic complexes including metals.

FIG. is a schematic view of an organic light-emitting device 10 according to an embodiment of the present inventive concept. Hereinafter, a structure and a method of manufacturing an organic light-emitting device, according to an embodiment of the present inventive concept, will be described with reference to FIGURE. The organic light-emitting device 10 includes a first electrode 11, an organic layer 15, and a second electrode 19, which are sequentially layered in the stated order.

A substrate may be additionally disposed under the first electrode 11 or on the second electrode 19. The substrate may be a conventional substrate that is used in an organic light-emitting device, such as glass substrate or a transparent plastic substrate, each having excellent mechanical strength, thermal stability, transparency, surface smoothness, ease of handling, and water repellency.

The first electrode 11 may be formed by vacuum-depositing or sputtering a material for forming a first electrode on the substrate. The first electrode 11 may be an anode. The material for the first electrode 11 may be selected from materials with a high work function for easy hole injection. The first electrode 11 may be a reflective electrode, a semi-transmissive electrode, or a transmissive electrode. The material for the first electrode 11 may be selected from indium tin oxide (ITO), indium zinc oxide (IZO), tin oxide ($SnO_2$), and zinc oxide (ZnO). Alternatively, a metal such as magnesium (Mg), aluminum (Al), aluminum-lithium (Al—Li), calcium (Ca), magnesium-indium (Mg—In), and magnesium-silver (Mg—Ag) may be used.

The first electrode 11 may have a single layer structure or a multi-layer structure including a plurality of layers. For example, the first electrode 11 may have a triple-layer structure of ITO/Ag/ITO, but embodiments are not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, hole transport layer, electron blocking layer, and buffer layer.

The hole transport region may only include a hole injection layer or a hole transport layer. Alternatively, the hole transport region may include a structure in which a hole injection layer/a hole transport layer or a hole injection layer/a hole transport layer/an electron blocking layer are sequentially layered on the first electrode 11.

When the hole transport region includes a hole injection layer, the hole injection layer may be formed on the first electrode 11 by using various methods such as vacuum-deposition, spin coating, casting, and a Langmuir-Blodgett (LB) method.

When a hole injection layer is formed by vacuum-deposition, for example, the vacuum-deposition may be performed at a deposition temperature in a range of about 100° C. to about 500° C., at a vacuum degree in a range of about $10^{-8}$ to about $10^{-3}$ torr, and at a deposition rate in a range of about 0.01 Angstroms per second (Å/sec) to about 100 Å/sec, though the conditions may vary depending on a compound that is used as a hole injection material and a structure and thermal properties of a desired hole injection layer, but it is not limited thereto.

When a hole injection layer is formed by spin coating, the spin coating may be performed at a coating rate in a range of about 2,000 revolutions per minute (rpm) to about 5,000 rpm, and at a temperature in a range of about 80° C. to 200° C. for removing a solvent after the spin coating, though the conditions may vary depending on a compound that is used as a hole injection material and a structure and thermal properties of a desired hole injection layer, but is not limited thereto.

The conditions for forming a hole transport layer and an electron blocking layer may be inferred based on the conditions for forming the hole injection layer.

The hole transport region may include at least one selected from m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), (polyaniline)/poly(4-styrenesulfonate) (PANI/PSS), a compound represented by Formula 201 below a compound represented by Formula 202 below:

m-MTDATA

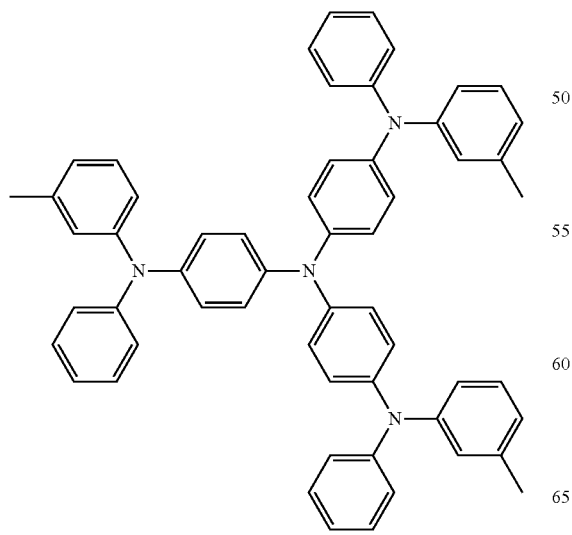

TDATA

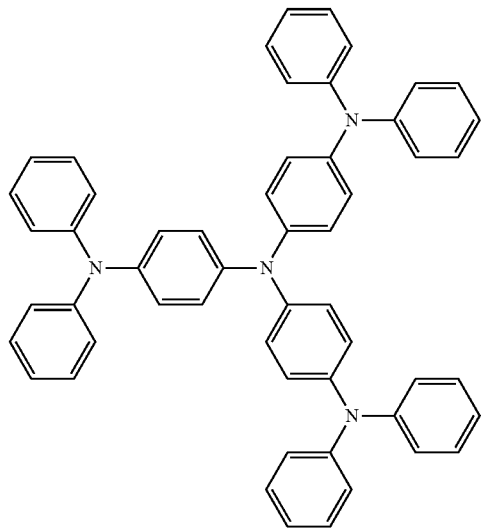

2-TNATA

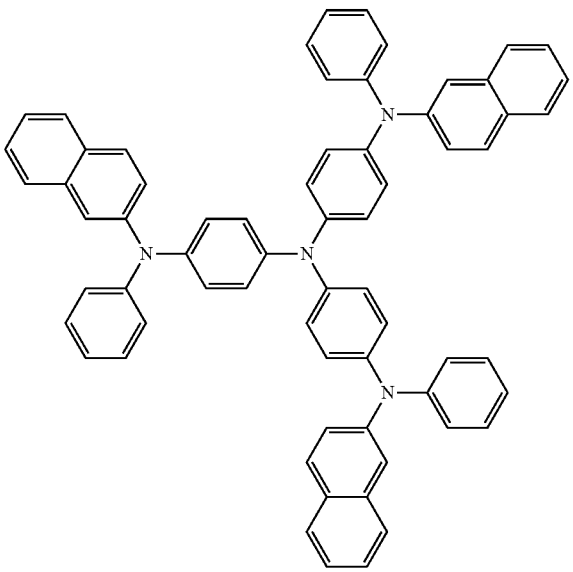

NPB

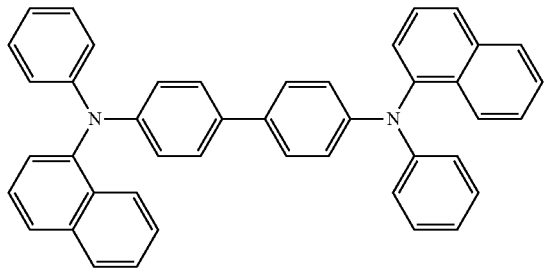

β-NPB

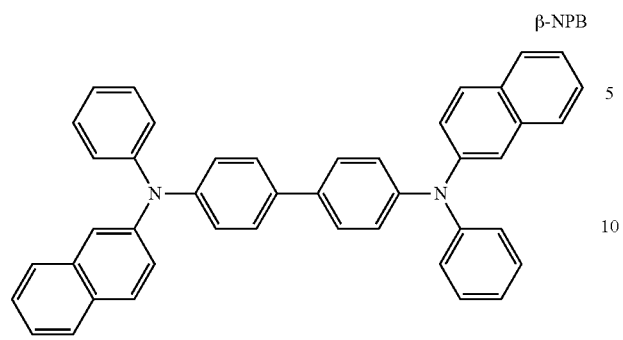

TPD

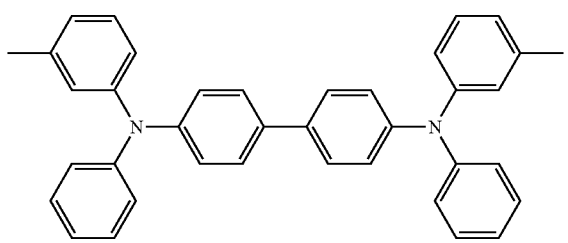

Spiro-TPD

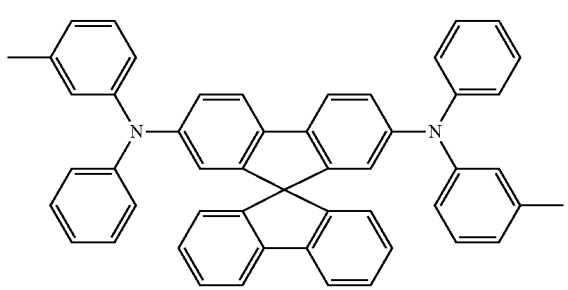

Spiro-NPB

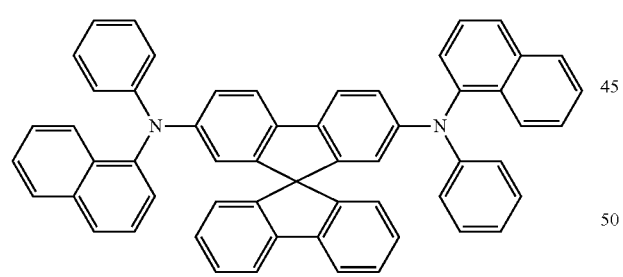

methylated NPB

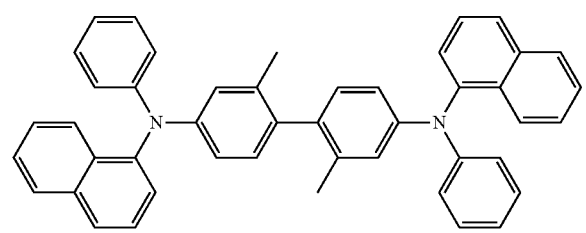

TAPC

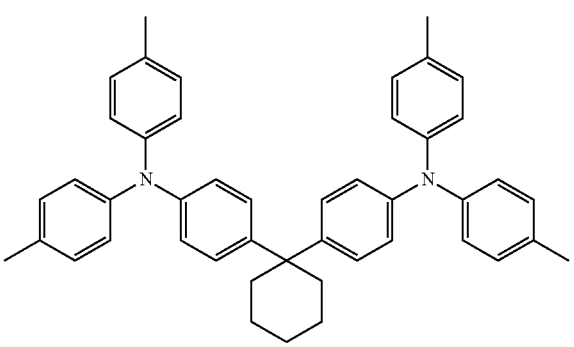

HMTPD

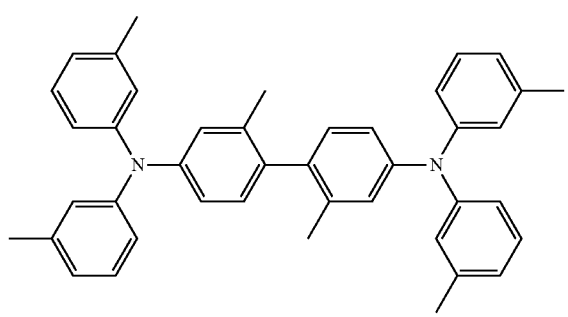

Formula 201

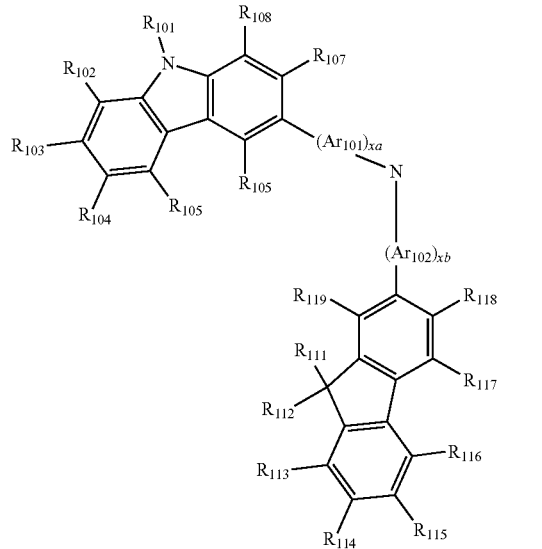

Formula 202

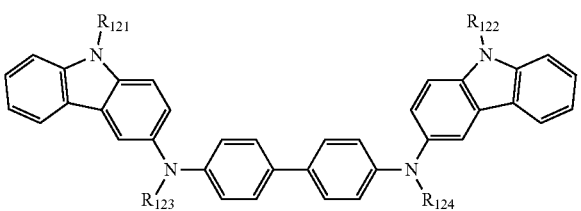

In Formula 201, $Ar_{101}$ and $Ar_{102}$ may be each independently selected from
a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may each independently be an integer of 0 to 5, or may be 0, 1, or 2. For example, xa may be 1 and xb may be 0, but embodiments are not limited thereto.

In Formulae 201 and 202, $R_{101}$ to $R_{108}$, $R_{111}$ to $R_{119}$, and $R_{121}$ to $R_{124}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, etc.), and a $C_1$-$C_{10}$ alkoxy group (for example, a methoxy group, an ethoxy group, a propoxy group, a butoxy group, a pentoxy group, etc.);

a $C_1$-$C_{10}$ alkyl group and a $C_1$-$C_{10}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, an anthracenyl group, a fluorenyl group and a pyrenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but embodiments are not limited thereto.

$R_{109}$ in Formula 201 may be selected from
a phenyl group, a naphthyl group, an anthracenyl group, and a pyridinyl group; and
a phenyl group, a naphthyl group, an anthracenyl group and a pyridinyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, a compound represented by Formula 201 may be represented by Formula 201A below, but embodiments are not limited thereto:

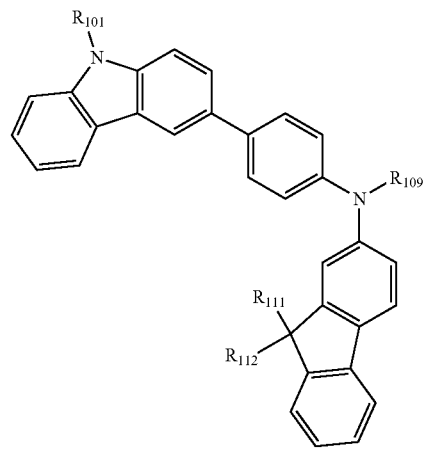

Formula 201A

Detailed descriptions of $R_{101}$, $R_{111}$, $R_{112}$, and $R_{109}$ in Formula 201A are the same as described above.

For example, a compound represented by Formula 201 and a compound represented by Formula 202 may include Compounds HT1 to HT20, but embodiments are not limited thereto:

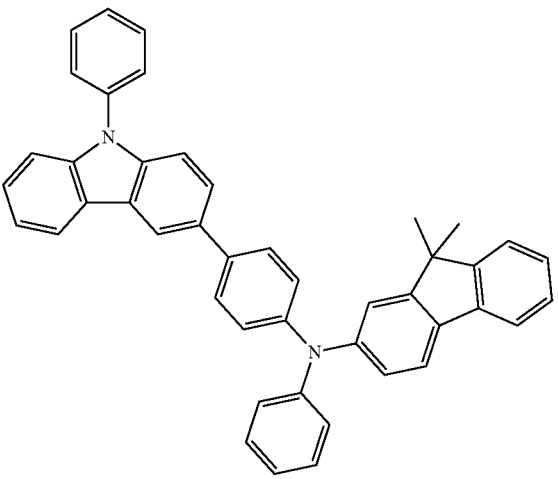

HT1

HT2
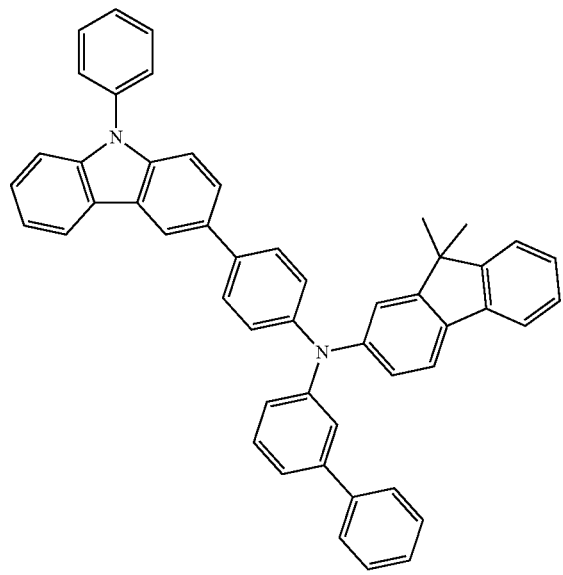
HT4
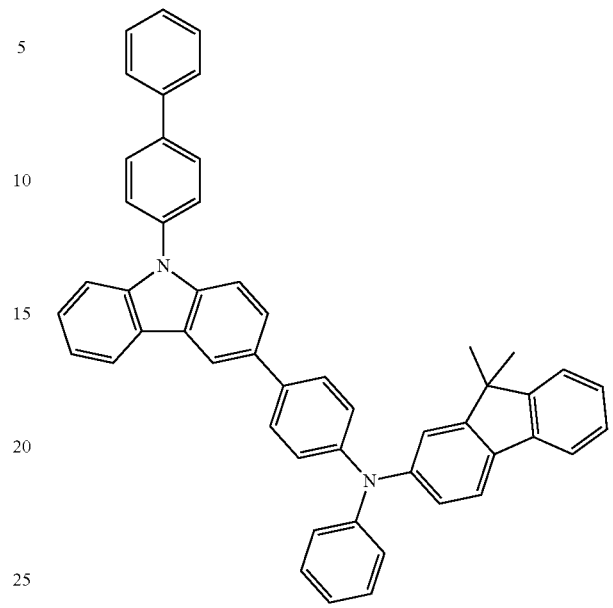
HT3
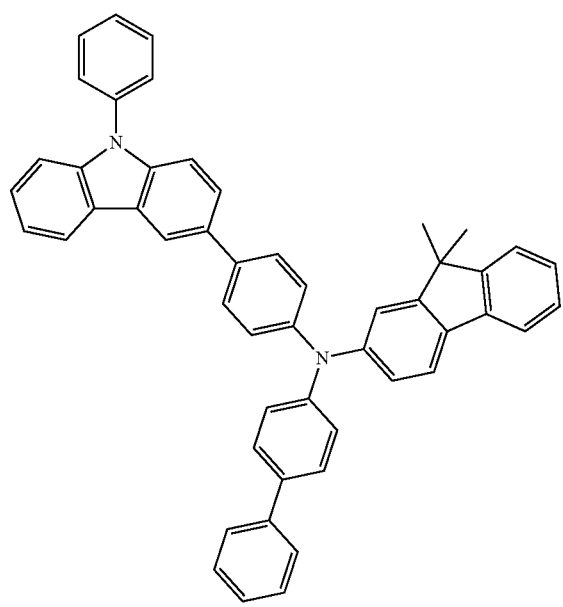
HT5
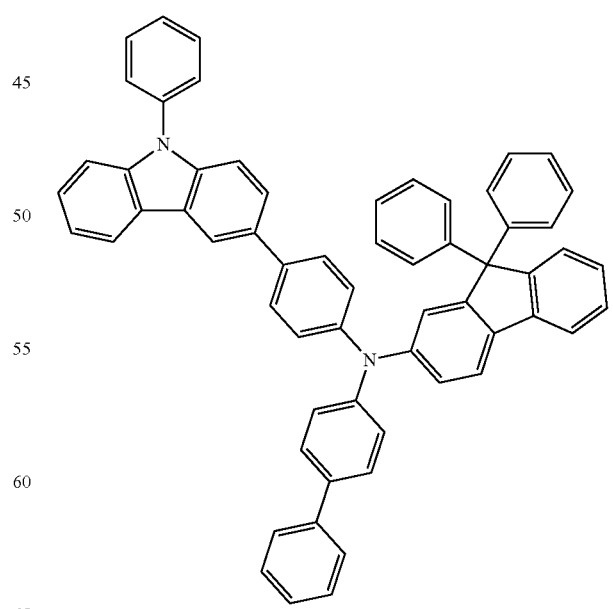

HT6
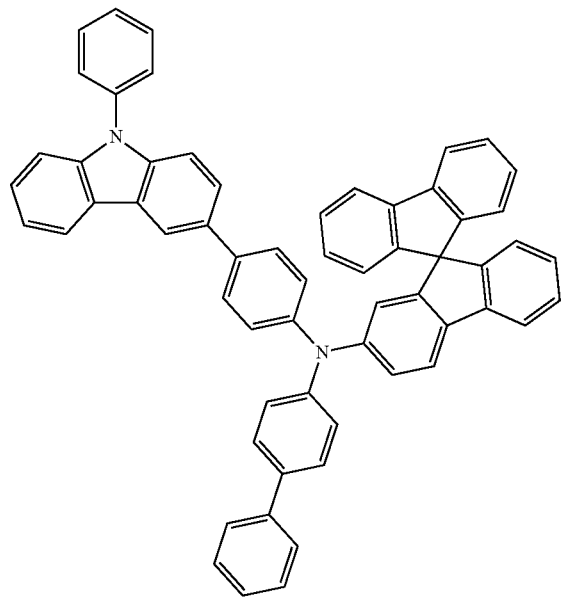
HT8
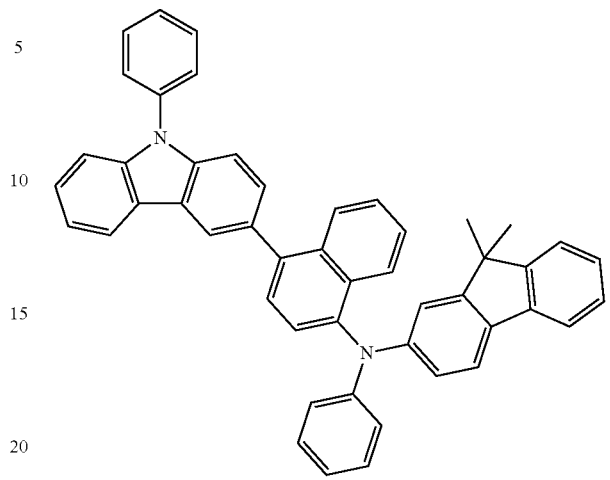
HT9
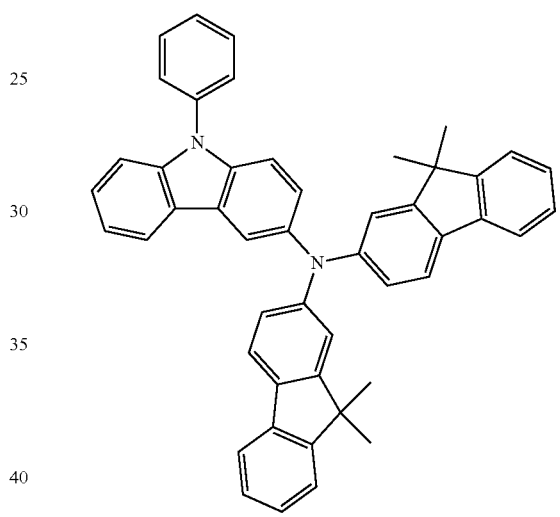
HT7
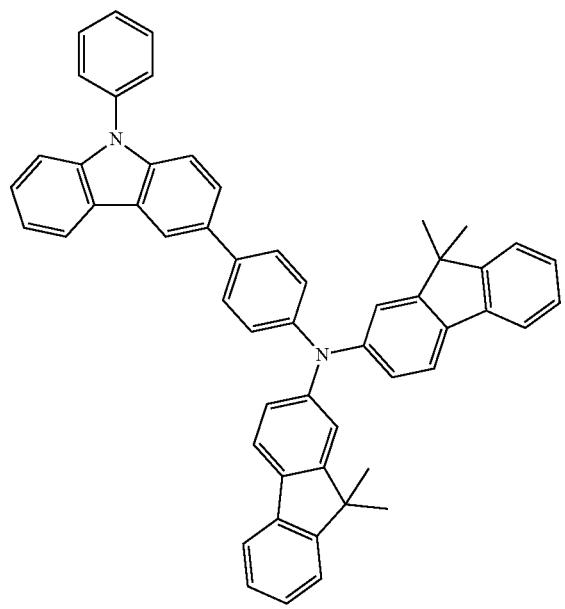
HT10
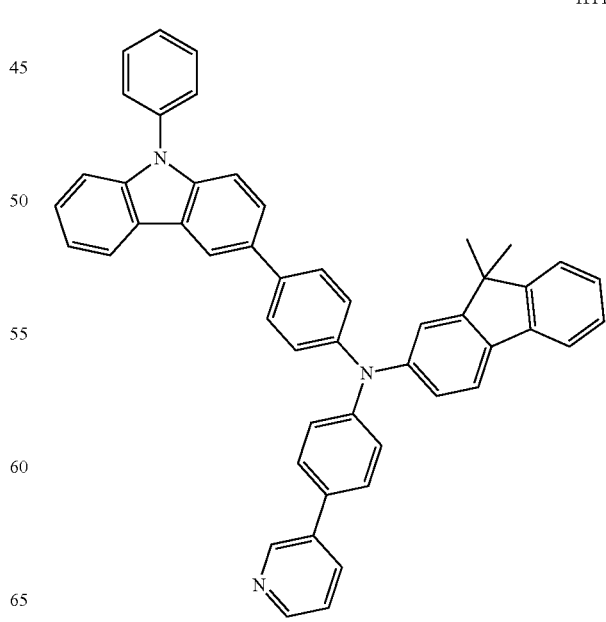

HT11 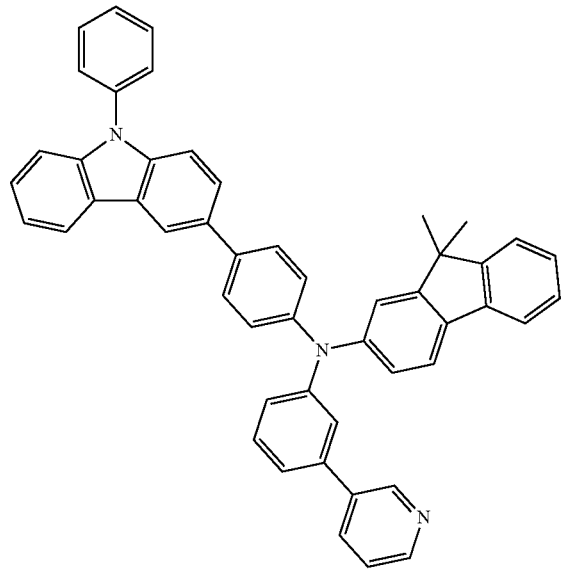
HT12 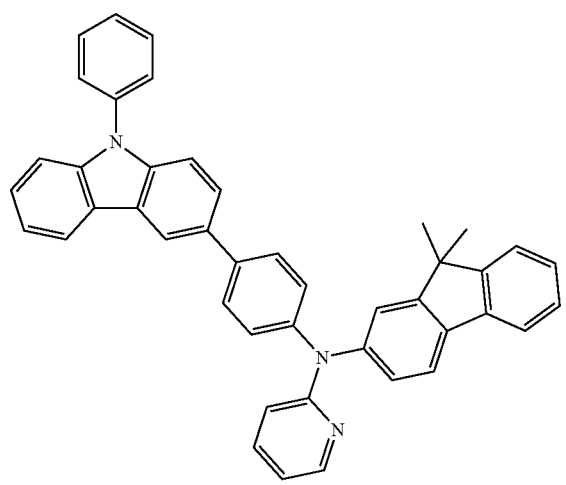
HT13 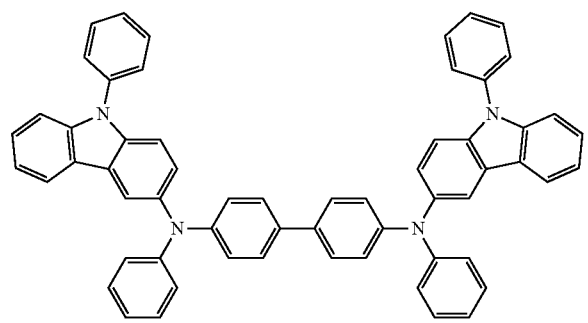
HT14 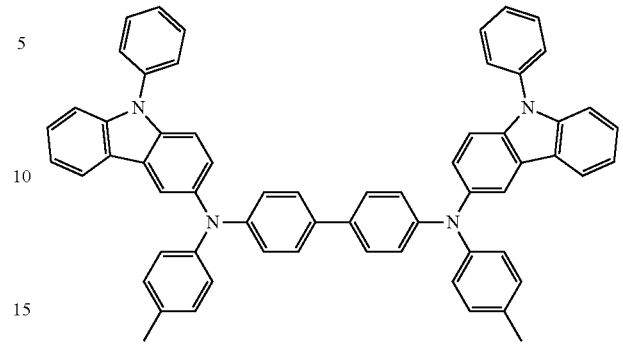
HT15 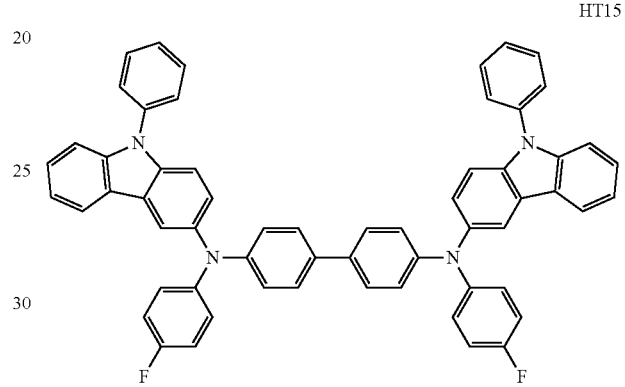
HT16 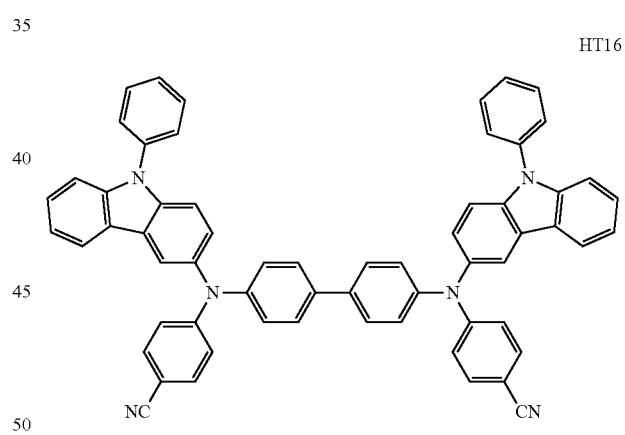
HT17 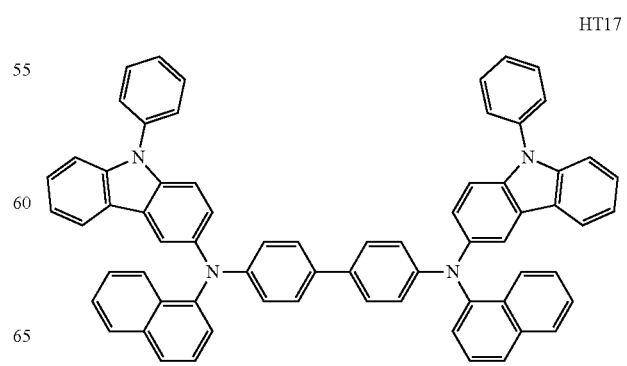

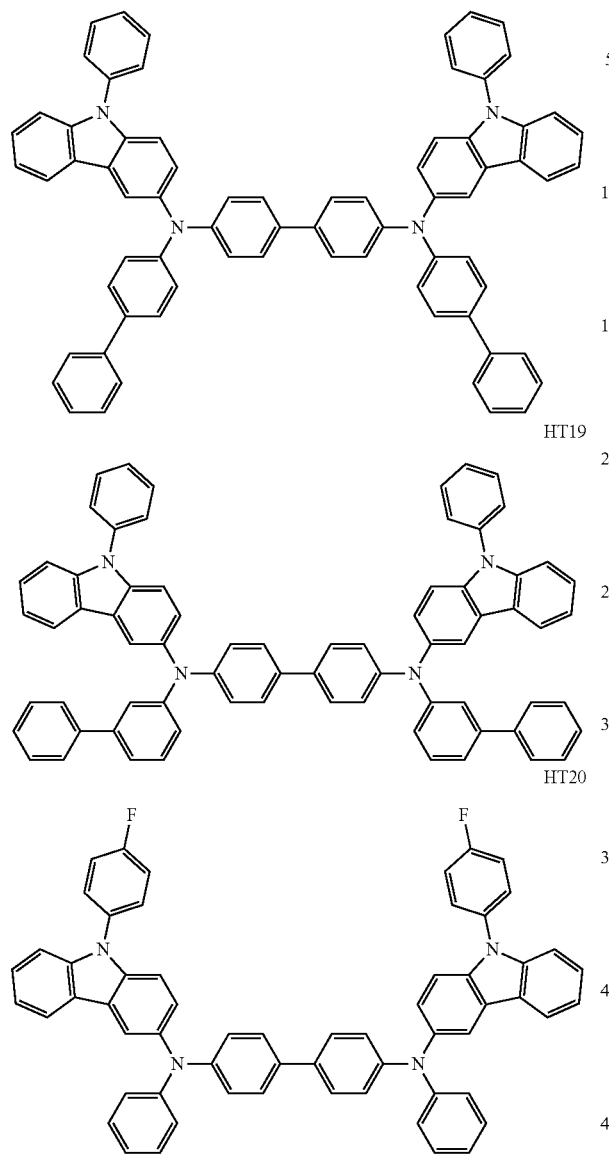

A thickness of the hole transport region may be in a range of about 100 Å to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by theory, it is understood that when the thicknesses of the hole transport region, the hole injection layer, and the hole transport layer are within these ranges, excellent hole transport characteristics may be obtained without a substantial increase in driving voltage.

The hole transport region may further include, in addition to the mentioned materials above, a charge-generating material to improve conductive properties. The charge-generating material may be homogeneously or non-homogeneously dispersed throughout the hole transport region.

The charge-generating material may be, for example, a p-dopant. The p-dopant may be one selected from a quinone derivative, a metal oxide, and a cyano group-containing compound, but embodiments are not limited thereto. For example, non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a compound containing a cyano group, such as Compound HT-D1 illustrated below, but embodiments are not limited thereto.

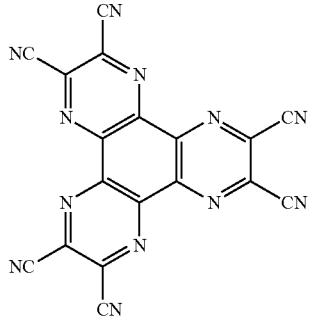

Compound HT-D1

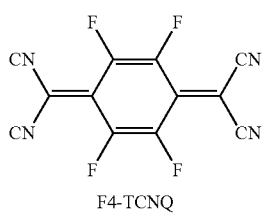

F4-TCNQ

The hole transport region may further include a buffer layer.

The buffer layer may compensate for an optical resonance distance according to a wavelength of light emitted from the emission layer to improve the efficiency of an organic light-emitting device.

An emission layer may be formed on the hole transport region by using various methods, such as vacuum-deposition, spin coating, casting, or an LB method. When the emission layer is formed by vacuum-deposition or spin coating, vacuum-deposition and coating conditions for the emission layer may be generally similar to the conditions for forming a hole injection layer, though the conditions may vary depending on the compound used.

When the hole transport region includes an electron blocking layer, a material of the electron blocking layer may be selected from the materials stated above that are included in the hole transport region and a host material described below, but embodiments are not limited thereto. For example, when a hole transport region includes an electron blocking layer, the electron blocking layer may include mCP described below.

The emission layer may include a host and a dopant, and the dopant may include an organometallic compound represented by Formula 1.

The host may include at least one selected from TPBi, TBADN, AND (also referred to as "DNA"), CBP, CDBP, TCP, Mcp, Compound H50 and Compound H51:
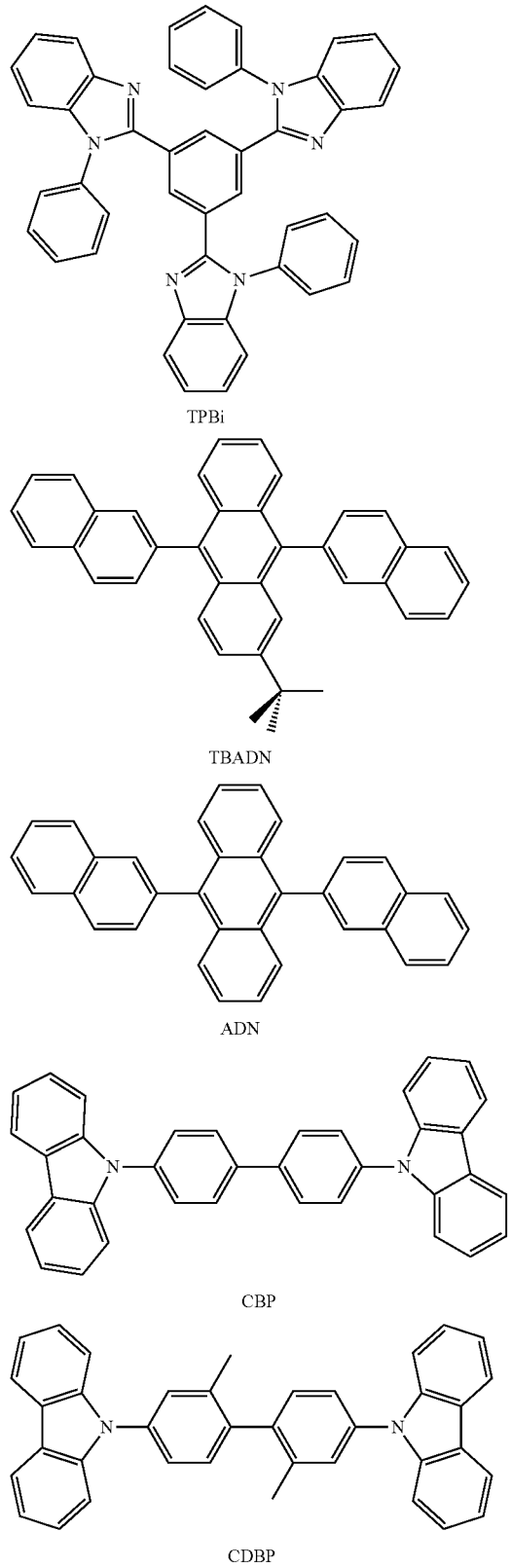
TPBi
TBADN
ADN
CBP
CDBP
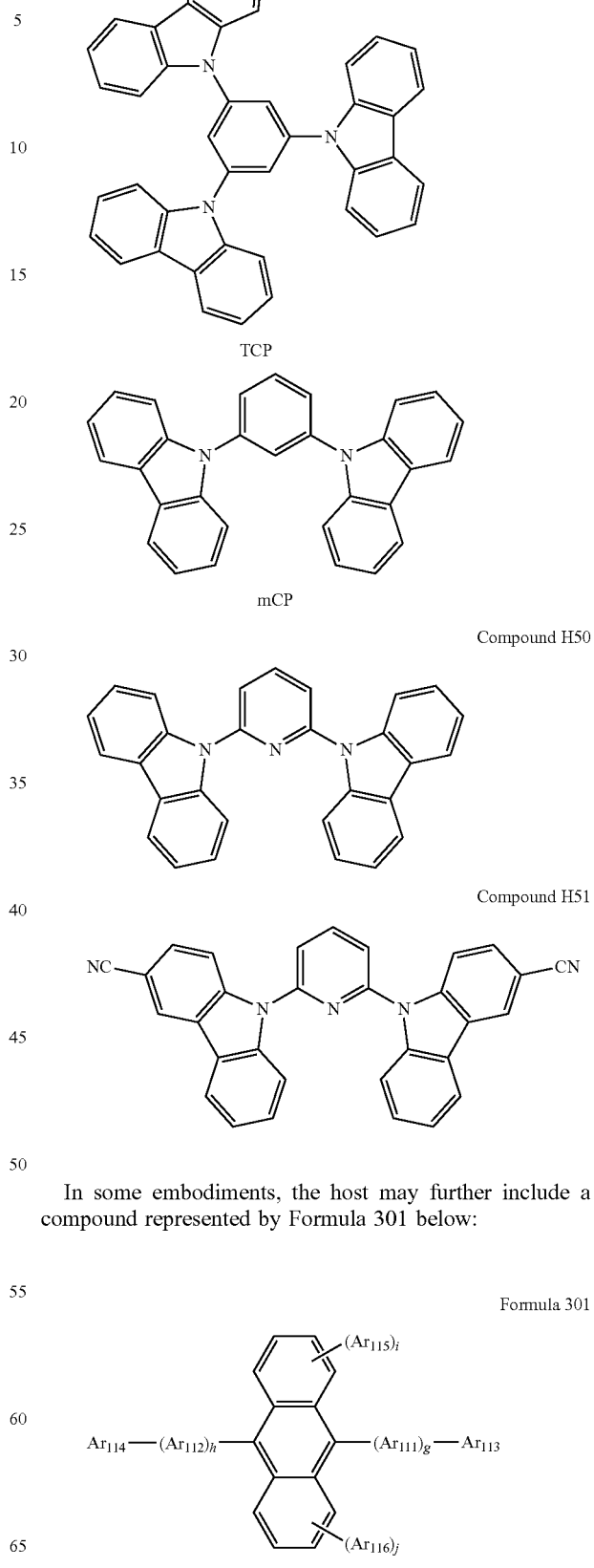
TCP
mCP
Compound H50
Compound H51
In some embodiments, the host may further include a compound represented by Formula 301 below:
Formula 301
$Ar_{114}—(Ar_{112})_h—\phantom{}—(Ar_{111})_g—Ar_{113}$
with $(Ar_{115})_i$ and $(Ar_{116})_j$ substituents.

$Ar_{111}$ and $Ar_{112}$ in Formula 301 may be each independently selected from a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ and $Ar_{116}$ in Formula 301 may be each independently selected from a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, i and j in Formula 301 may each independently be an integer of 0 to 4, for example, 0, 1, or 2.

$Ar_{113}$ to $Ar_{116}$ in Formula 301 may be each independently selected from a $C_1$-$C_{10}$ alkyl group substituted with at least one selected from a phenyl group, a naphthyl group, and an anthracenyl group;

a phenyl group, a naphthyl group, an anthracenyl group, a pyrenyl group, a phenanthrenyl group, and a fluorenyl group;

a phenyl group, a naphthyl group, an anthracenyl group, a pyrenyl group, a phenanthrenyl group, and a fluorenyl group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

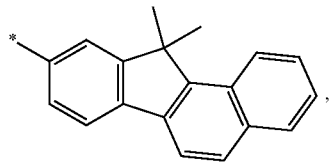 [SMILES: *c1ccc2c(c1)C(C)(C)c1c-2ccc2ccccc12]

but embodiments are not limited thereto.

In some embodiments, the host may include a compound represented by Formula 302 below:

<Formula 302

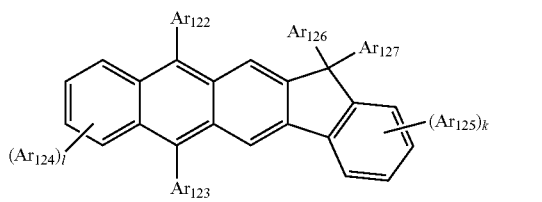

Descriptions of $Ar_{122}$ to $Ar_{125}$ in Formula 302 are the same as the description of $Ar_{113}$ in Formula 301.

$Ar_{126}$ and $Ar_{127}$ in Formula 302 may each independently be a $C_1$-$C_{10}$ alkyl group (for example, a methyl group, an ethyl group or a propyl group).

k and l in Formula 302 may each independently be an integer of 0 to 4. For example, k and l may each independently be 0, 1, or 2.

The compound represented by Formula 301 and the compound represented by Formula 302 may include Compounds H1 to H42, but embodiments are not limited thereto.

H1

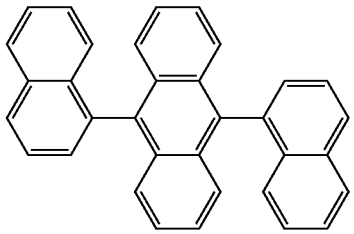

H2

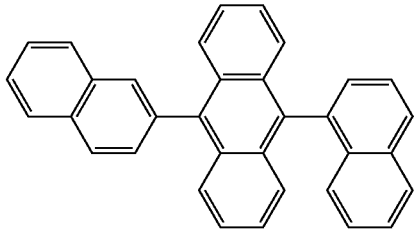

H3

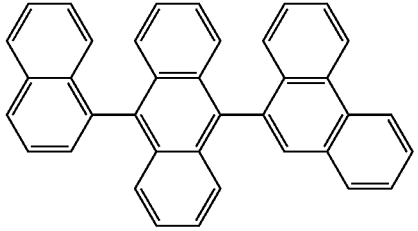

H4

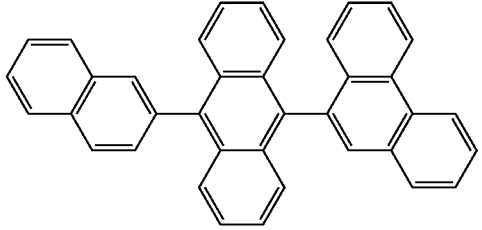

H5

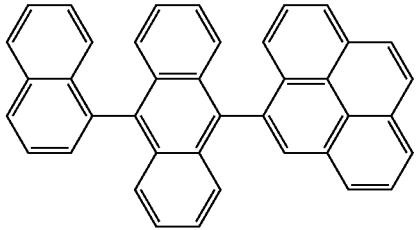

H6

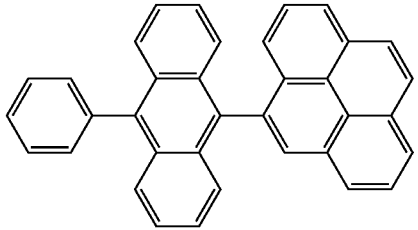

-continued
H7
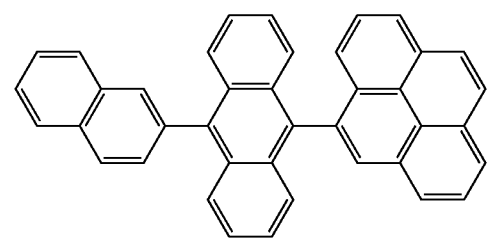
H8
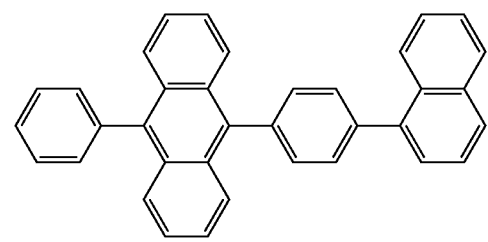
H9
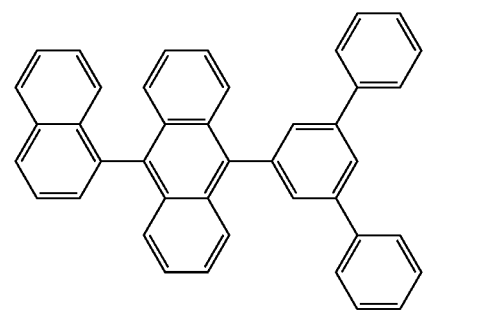
H10
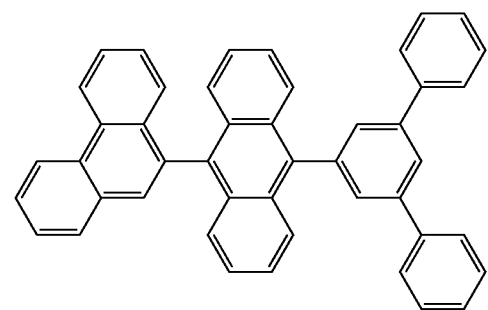
H11
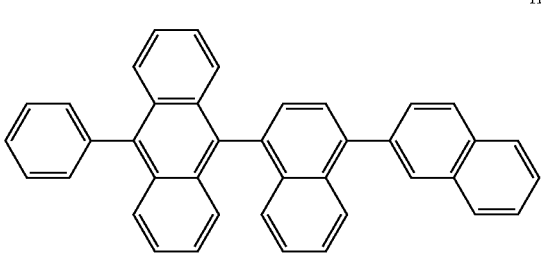
H12
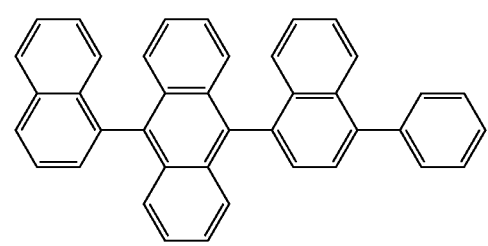
-continued
H13
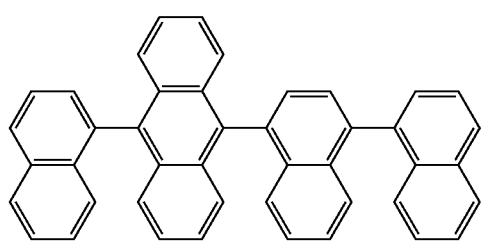
H14
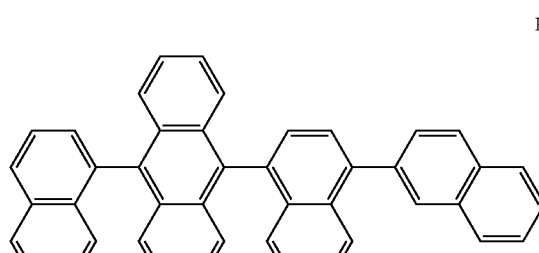
H15
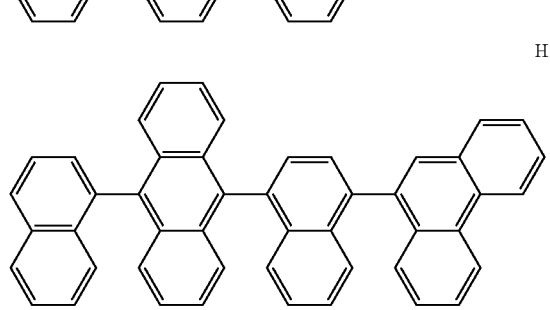
H16
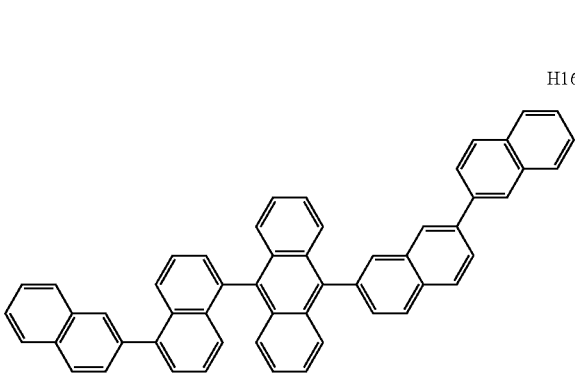
H17
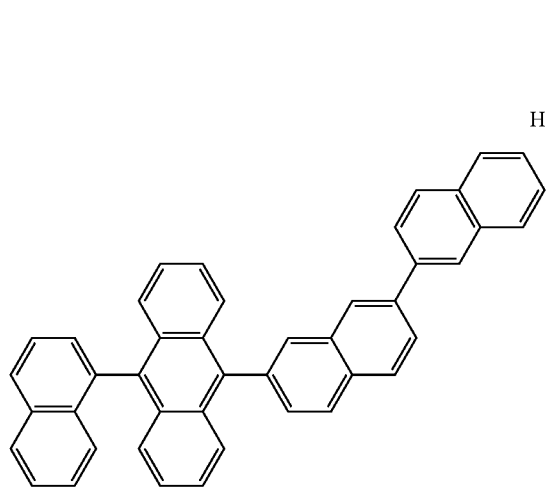

H18
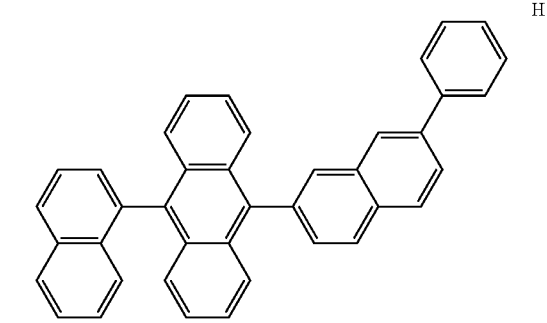
H19
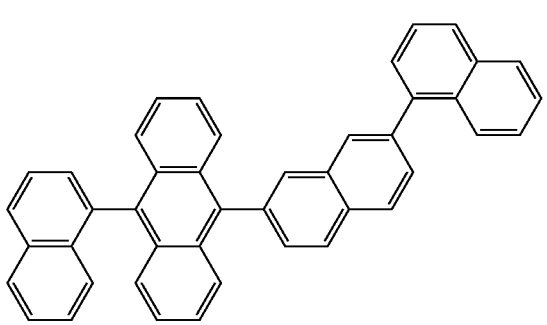
H20
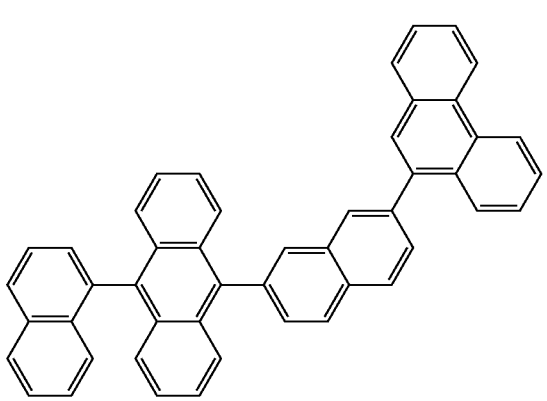
H21
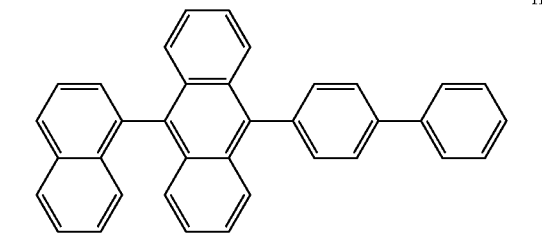
H22
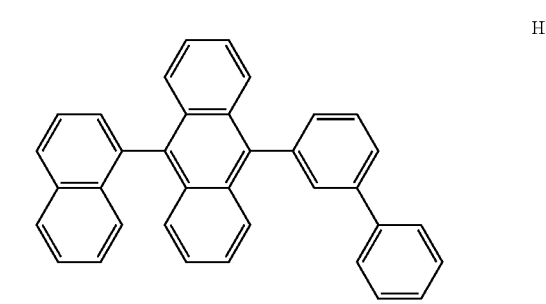
H23
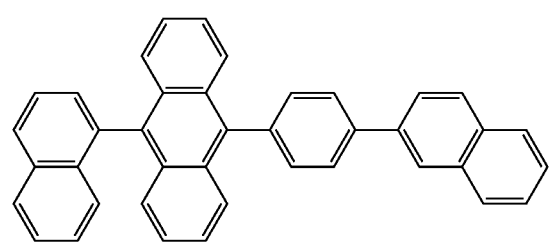
H24
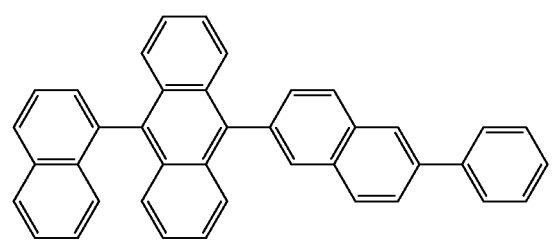
H25
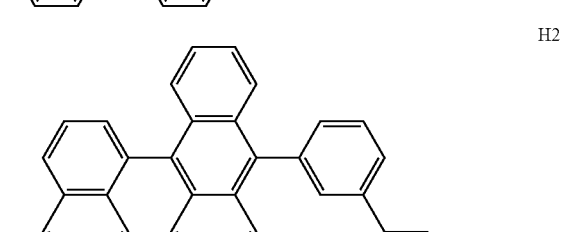
H26
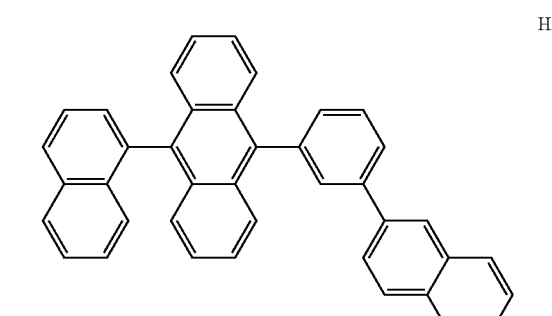
H27
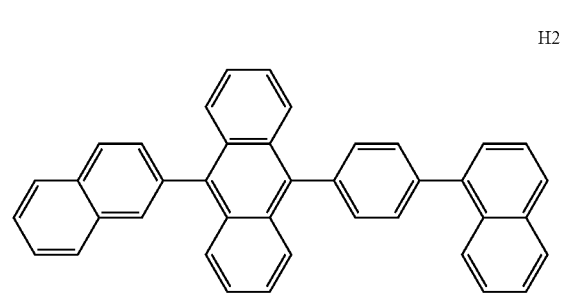

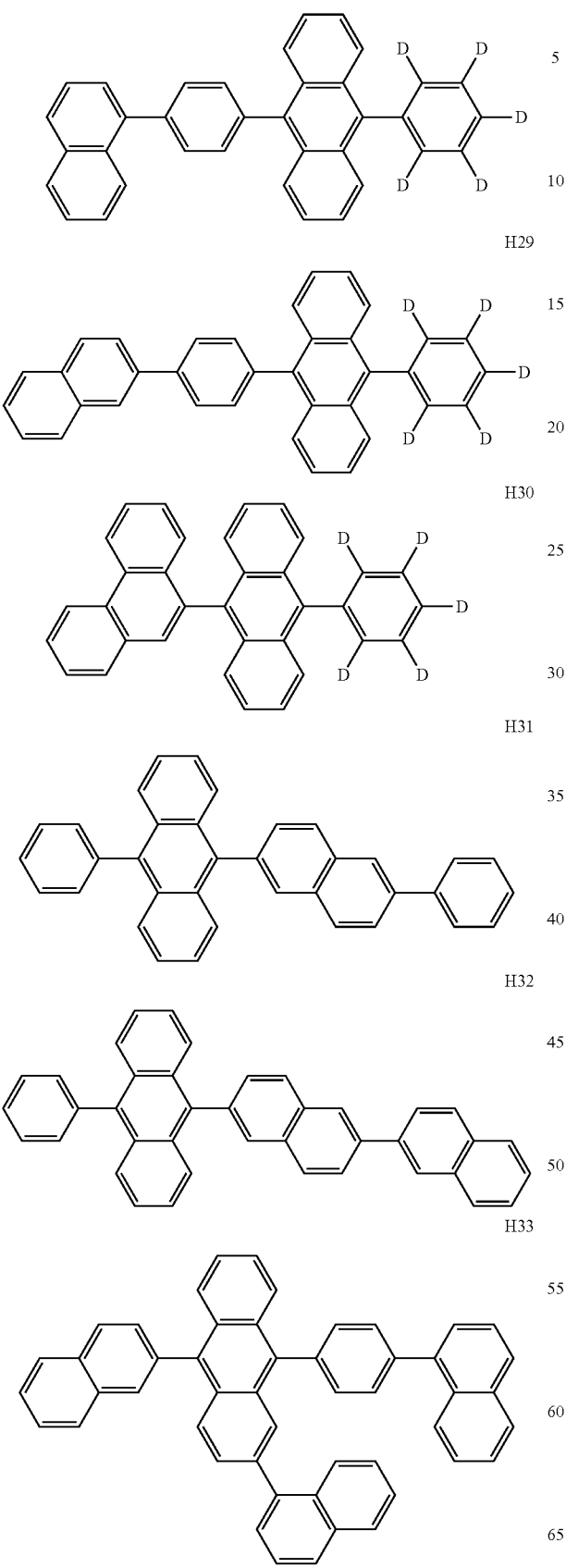

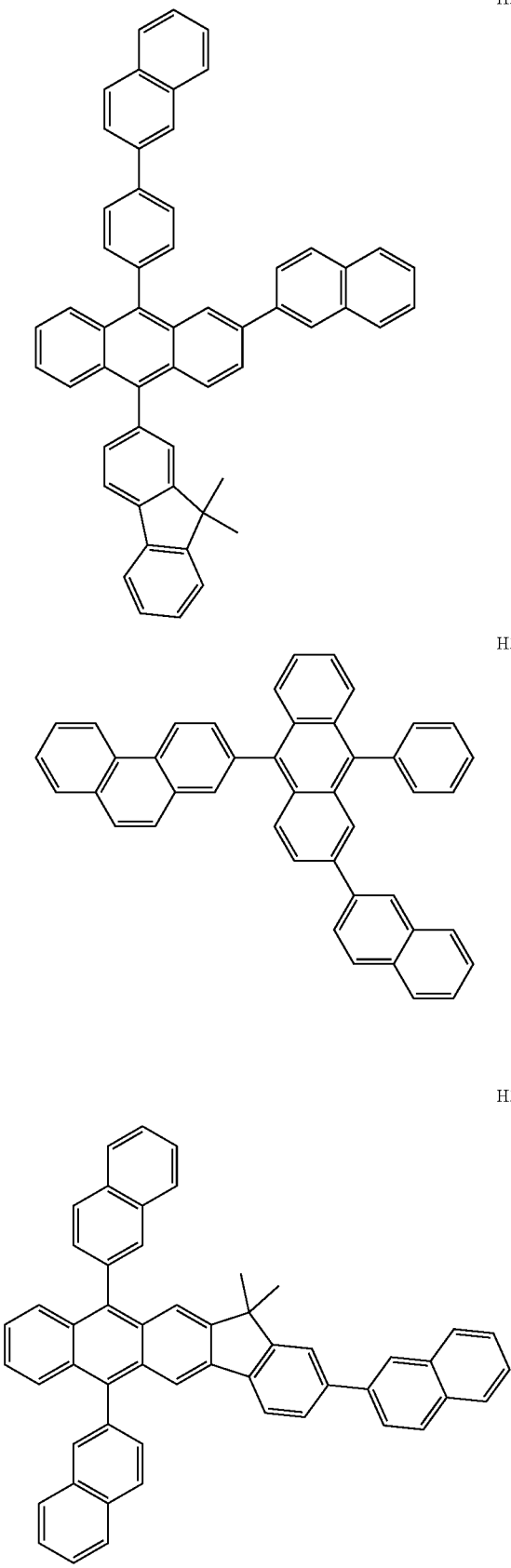
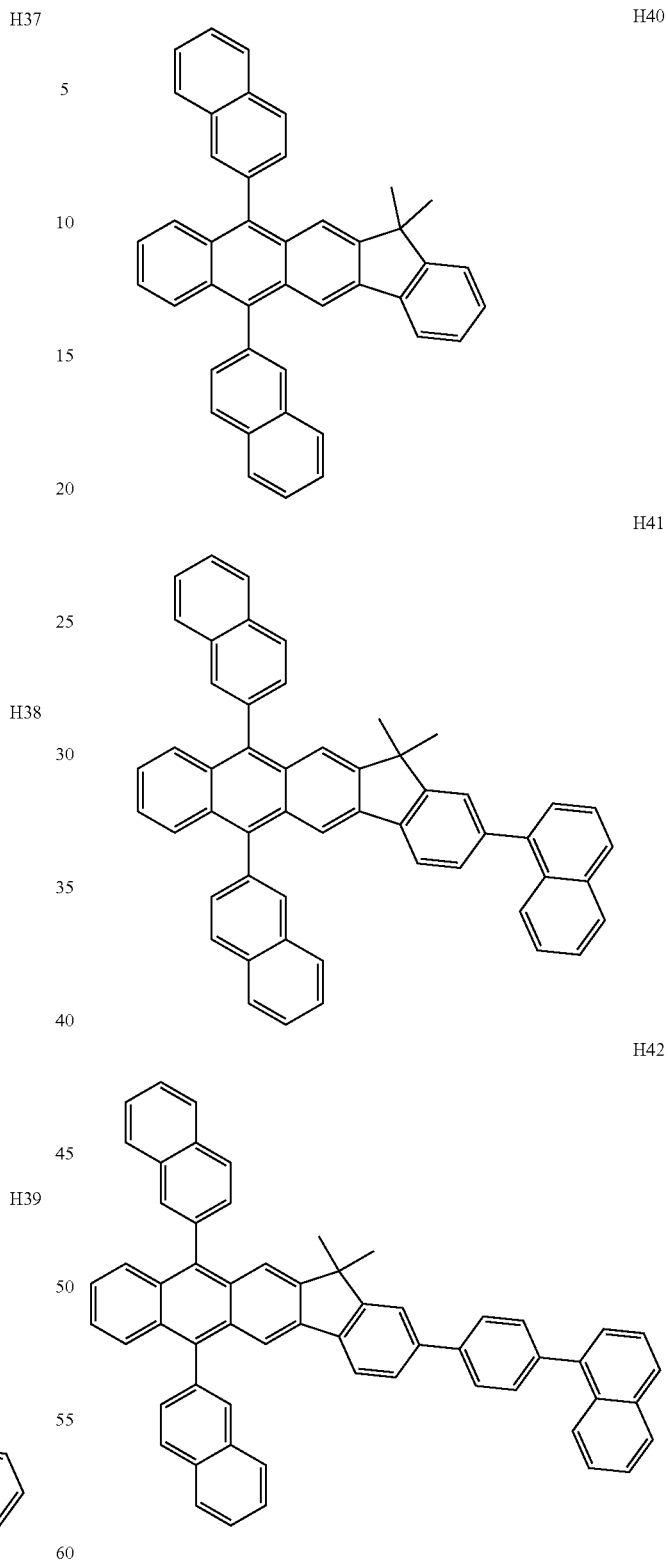
When the organic light-emitting device is a full color organic light-emitting device, the emission layer may be patterned into a red emission layer, a green emission layer, and a blue emission layer. Alternatively, the emission layer may have a structure in which the red emission layer, the green emission layer, and/or the blue emission layer are layered to emit white light or other various embodiments are possible.

When the emission layer includes the host and the dopant, the amount of the dopant may be selected from a range of about 0.01 part by weight to about 15 parts by weight based on about 100 parts by weight of the host, but the amount is not limited thereto.

A thickness of the emission layer may be in a range of about 100 Å to about 1,000 Å, for example, about 200 Å to about 600 Å. While not wishing to be bound by theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a structure of a hole blocking layer/an electron transport layer/an electron injection layer or an electron transport layer/an electron injection layer, but it is not limited thereto. The electron transport layer may have a single layer structure or a multi-layer structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may, for example, include at least one of BCP, Bphen and Balq, but is not limited thereto.

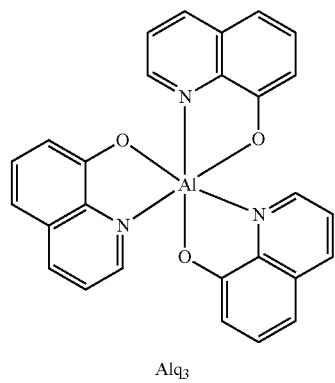

Alq3

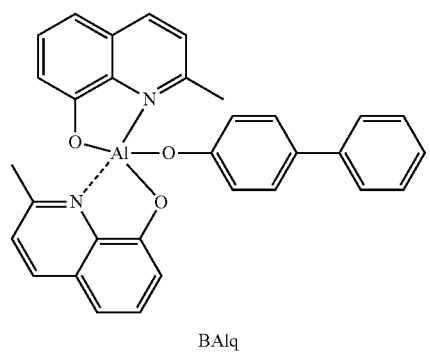

BAlq

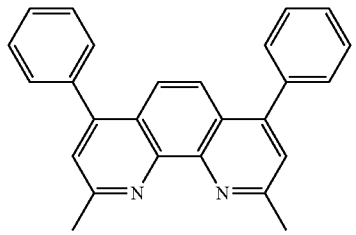

BCP

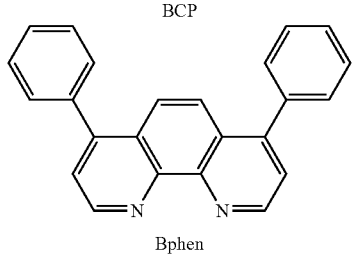

Bphen

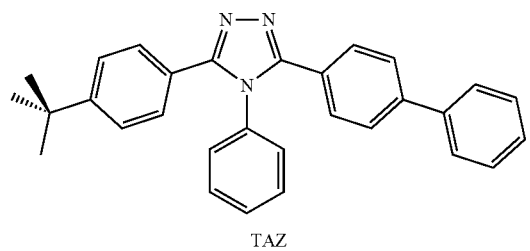

TAZ

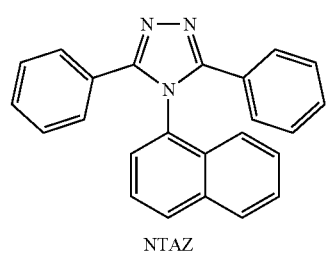

NTAZ

A thickness of the hole blocking layer may be in a range of about 20 Å to about 1,000 Å, for example, about 30 Å to about 300 Å. When the thickness of the hole blocking layer is within this range, excellent hole blocking characteristics may be obtained without a substantial increase in driving voltage.

The electron transport layer may further include at least one selected from BCP, BPhen, Alq3, BAlq, TAZ, and NTAZ.

In some embodiments, the electron transport layer may include at least one selected from Compounds ET1 and ET2, but it is not limited thereto.

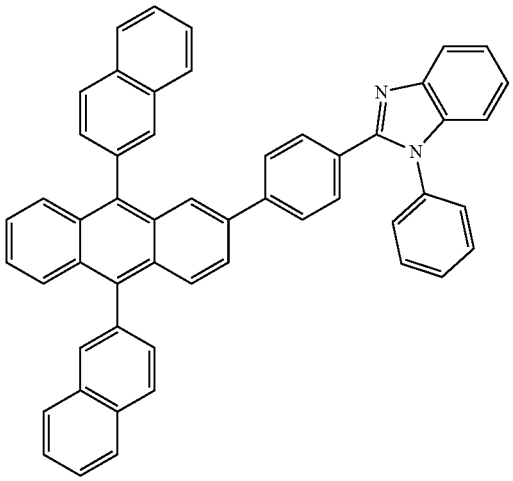

ET1

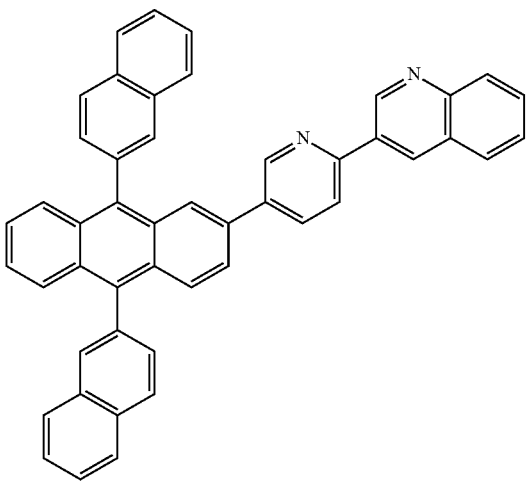

ET2

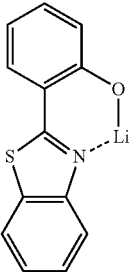

ET-D2

The electron transport region may include an electron injection layer that facilitates electron injection from the second electrode 19.

The electron injection layer may include at least one selected from, LiF, NaCl, CsF, $Li_2O$, and BaO.

A thickness of the electron injection layer may be in a range of about 1 Å to about 100 Å, for example, about 3 Å to about 90 Å. While not wishing to be bound by theory, it is understood that when the thickness of the electron injection layer is within this range, excellent electron injection characteristics may be obtained without a substantial increase in driving voltage.

The second electrode 19 is disposed on the organic layer 15. The second electrode 19 may be a cathode. A material for the second electrode 19 may be a material having a relatively low work function, such as a metal, an alloy, an electrically conductive compound, and a mixture thereof. Detailed examples of the material for forming the second electrode 19 are lithium (Li), magnesium (Mg), aluminum (Al), aluminum-lithium (Al—Li), calcium (Ca), magnesium-indium (Mg—In), and magnesium-silver (Mg—Ag). Alternatively, ITO or IZO may be used to form a transmissive second electrode 19 to manufacture a top emission light-emitting device, and such a variation may be possible.

Hereinbefore, the organic light-emitting device has been described with reference to FIGURE, but embodiments are not limited thereto.

A $C_1$-$C_{60}$ alkyl group as used herein refers to a linear or branched aliphatic hydrocarbon monovalent group having 1 to 60 carbon atoms. Detailed examples thereof are a methyl group, an ethyl group, a propyl group, an iso-butyl group, a sec-butyl group, a tert-butyl group, a pentyl group, an iso-amyl group, and a hexyl group. A $C_1$-$C_{60}$ alkylene group as used herein refers to a divalent group having the same structure as a $C_1$-$C_{60}$ alkyl group.

A $C_1$-$C_{60}$ alkoxy group as used herein refers to a monovalent group represented by —$OA_{101}$ (wherein $A_{101}$ is the $C_1$-$C_{60}$ alkyl group). Detailed examples thereof are a methoxy group, an ethoxy group, and an isopropyloxy group.

A $C_2$-$C_{60}$ alkenyl group as used herein refers to a group formed by placing at least one carbon double bond in the middle or at the terminal of the $C_2$-$C_{60}$ alkyl group. Detailed examples thereof are an ethenyl group, a propenyl group, and a butenyl group. A $C_2$-$C_{60}$ alkenylene group as used herein refers to a divalent group having the same structure as a $C_2$-$C_{60}$ alkenyl group.

A $C_2$-$C_{60}$ alkynyl group as used herein refers to a group formed by placing at least one carbon triple bond in the middle or at the terminal of the $C_2$-$C_{60}$ alkyl group. Detailed examples thereof are an ethenyl group and a propenyl group.

A thickness of the electron transport layer may be in a range of about 100 Å to about 1,000 Å, for example, about 150 Å to about 500 Å. When the thickness of the electron transport layer is within this range, excellent electron transport characteristics may be obtained without a substantial increase in driving voltage.

The electron transport layer may further include a metal-containing material in addition to the materials described above.

The metal-containing material may include a Li complex. The Li complex may include, for example, Compound ET-D1 (lithium quinolate, LiQ) or ET-D2.

ET-D1

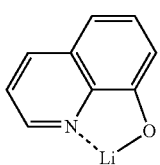

A $C_2$-$C_{60}$ alkynylene group as used herein refers to a divalent group having the same structure as a $C_2$-$C_{60}$ alkynyl group.

A $C_3$-$C_{10}$ cycloalkyl group as used herein refers to a monovalent monocyclic saturated hydrocarbon group including 3 to 10 carbon atoms. Detailed examples thereof are a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as a $C_3$-$C_{10}$ cycloalkyl group.

A $C_1$-$C_{10}$ heterocycloalkyl group as used herein refers to a monovalent monocyclic group including at least one heteroatom selected from N, O, P, Si, and S as a ring-forming atom and 1 to 10 carbon atoms. Detailed examples thereof are a tetrahydrofuranyl group and a tetrahydrothiophenyl group. A $C_1$-$C_{10}$ heterocycloalkylene group as used herein refers to a divalent group having the same structure as a $C_1$-$C_1$ heterocycloalkyl group.

A $C_3$-$C_{10}$ cycloalkenyl group as used herein refers to a monovalent monocyclic group that has 3 to 10 carbon atoms and at least one double bond in its ring, and which is not aromatic. Detailed examples thereof are a cyclopentenyl group, a cyclohexenyl group, and a cycloheptenyl group. A $C_3$-$C_{10}$ cycloalkenylene group as used herein refers to a divalent group having the same structure as a $C_3$-$C_{10}$ cycloalkenyl group.

A $C_1$-$C_{10}$ heterocycloalkenyl group as used herein refers to a monovalent monocyclic group including at least one heteroatom selected from N, O, P, Si, and S as a ring-forming atom, 1 to 10 carbon atoms, and at least one double bond in its ring. Detailed examples of the $C_1$-$C_{10}$ heterocycloalkenyl group are a 2,3-dihydrofuranyl group and a 2,3-dihydrothiophenyl group. A $C_2$-$C_{10}$ heterocycloalkenylene group as used herein refers to a divalent group having the same structure as a $C_1$-$C_{10}$ heterocycloalkenyl group.

A $C_6$-$C_{60}$ aryl group as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group as used herein refers to a monovalent group having a carbocyclic aromatic system including at least one heteroatom selected from N, O, P, Si, and S as a ring-forming atom and 1 to 60 carbon atoms. A $C_1$-$C_{60}$ heteroarylene group as used herein refers to a divalent group having a carbocyclic aromatic system including at least one heteroatom selected from N, O, P, and S as a ring-forming atom and 1 to 60 carbon atoms. Detailed examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the rings may be fused to each other.

A $C_6$-$C_{60}$ aryloxy group as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

A monovalent non-aromatic condensed polycyclic group as used herein refers to a monovalent group that has two or more rings condensed to each other, only carbon atoms (for example, the number of carbon atoms may be in a range of 8 to 60) as ring-forming atoms, wherein the molecular structure as a whole is non-aromatic in the entire molecular structure. Detailed examples of the non-aromatic condensed polycyclic group include a fluorenyl group. A divalent non-aromatic condensed polycyclic group as used herein refers to a divalent group having the same structure as the monovalent non-aromatic condensed polycyclic group.

A monovalent non-aromatic condensed hetero-polycyclic group as used herein refers to a monovalent group that has a plurality of rings condensed with each other, has a heteroatom selected from N, O P, Si, and S, other than carbon atoms (for example, the number of carbon atoms may be in a range of 1 to 60), as ring-forming atoms, wherein the molecular structure as a whole is non-aromatic in the entire molecular structure. The monovalent non-aromatic condensed heteropolycyclic group includes a carbazolyl group. A divalent non-aromatic condensed hetero-polycyclic group as used herein refers to a divalent group having the same structure as the monovalent non-aromatic condensed heteropolycyclic group.

Throughout the specification, at least one substituent of the substituted $C_5$-$C_{30}$ carbocyclic group, substituted $C_2$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group and a $C_1$-$C_{60}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, and $Q_1$ to $Q_9$, $Q_{11}$ to $Q_{19}$, $Q_{21}$ to $Q_{29}$ and $Q_{31}$ to $Q_{39}$ may be each independently selected from a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ alkyl group, and a $C_6$-$C_{60}$ aryl group.

When a group containing a specified number of carbon atoms is substituted with any of the substituents listed above, the number of carbon atoms in the resulting "substituted" group may be the number of atoms contained in the original (base) group plus the number of carbon atoms (if any) contained in the substituent. For example, the "substituted $C_1$-$C_{30}$ alkyl" may refer to a $C_1$-$C_{30}$ alkyl group substituted with $C_{6-60}$ aryl group, in which the total number of carbon atoms may be $C_7$-$C_{90}$.

Hereinafter, a compound and an organic light-emitting device according to an embodiment of the present disclosure will be described in detail with reference to Synthesis Examples and Examples, but the present inventive concept is not limited thereto. The expression "B was used instead of A" used in describing Synthesis Examples means that an amount of B used was identical to an amount of A used based on molar equivalence.

Example

Synthesis Example 1: Synthesis of Compound 1

Synthesis of Compound M1A

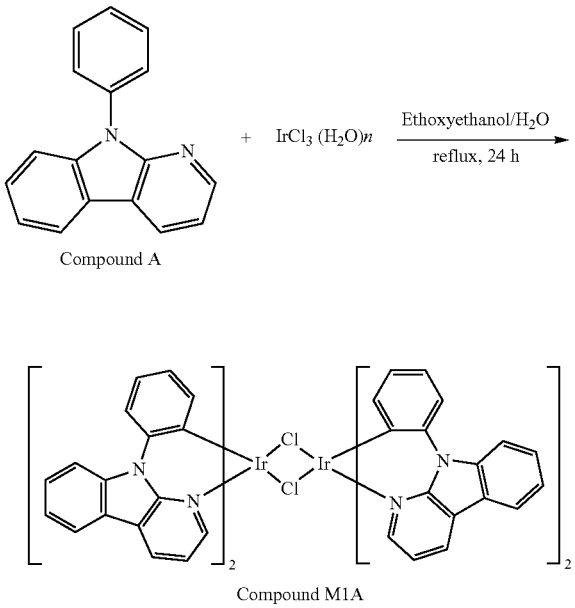

Compound M1A 6.00 grams (g) (24.57 millimoles (mmol)) of Compound A and 3.85 g (10.92 mmol) of iridium chloride were mixed with 60 milliliters (mL) of ethoxyethanol and 20 mL of distilled water, and the resulting mixture was stirred under reflux for 24 hours to carry out a reaction. The reaction mixture was then cooled to a room temperature. A solid material obtained from the above step was filtered and thoroughly washed with water/methanol/hexane in the stated order to obtain a solid. The solid was dried in a vacuum oven to obtain 6.00 g (77%) of Compound M1A.

Synthesis of Compound 1

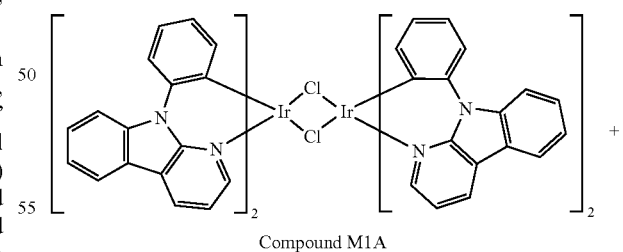

Compound M1A

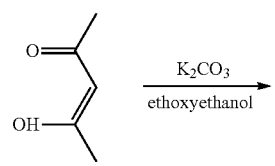

-continued

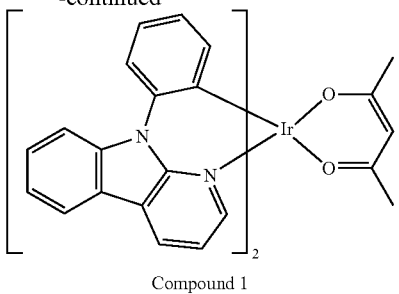

Compound 1

3.31 g (2.31 mmol) of Compound M1A, 2.32 g (23.14 mmol) of acetylacetone and 3.20 g (23.14 mmol) of K₂CO₃ were mixed with 40 mL of ethoxyethanol and the resulting mixture was stirred under reflux for 12 hours to complete the reaction. The cooled mixture obtained from the above step was filtered to obtain a solid. The solid was thoroughly washed with ethanol and hexane and purified by column chromatography with methylene chloride (MC): hexane, thereby obtaining 0.60 g (17%) of Compound 1. The identity of the obtained compound was confirmed by Mass and HPLC analysis.

HRMS (MALDI) calcd for $C_{39}H_{29}IrN_4O_2$: m/Z 778.1920, Found: 778.1925

Synthesis Example 2: Synthesis of Compound 34

Synthesis of Compound 34

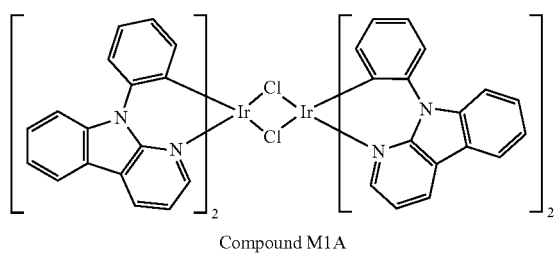

Compound M1A

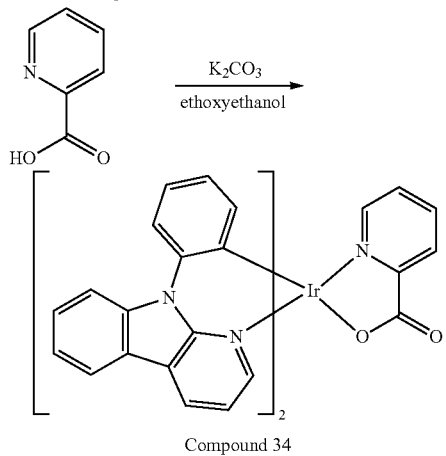

Compound 34

3.21 g (2.25 mmol) of Compound M1A, 2.77 g (22.48 mmol) of 2-picolinic acid, and 3.11 g (22.48 mmol) of K₂CO₃ were mixed with 40 mL of ethoxyethanol, and the resulting mixture was stirred under reflux for 12 hours to complete a reaction. The cooled mixture obtained from the above step was filtered to obtain a solid. The solid was thoroughly washed with ethanol and hexane and purified by column chromatography with MC: hexane, thereby obtaining 0.64 g (18%) of Compound 34. The identity of the obtained compound was confirmed by Mass and HPLC analysis.

HRMS (MALDI) calcd for $C_{40}H_{26}IrN_5O_2$: m/Z 801.1716, Found: 801.1711

Synthesis Example 3: Synthesis of Compound 61

Synthesis of Compound M1B

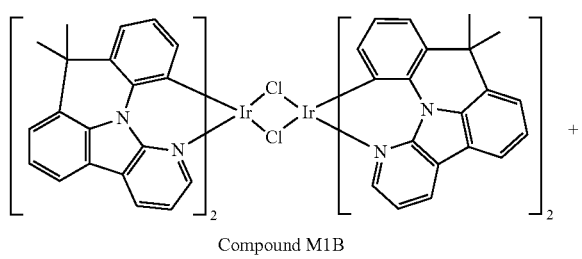

Compound B

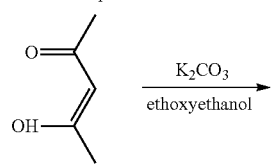

Compound M1B 9.67 g (33.99 mmol) of Compound B and 5.33 g (15.11 mmol) of iridium chloride were mixed with 90 mL of ethoxyethanol and 30 mL of distilled water, and the resulting mixture was stirred under reflux for 24 hours to carry out a reaction. The reaction mixture was then cooled to a room temperature. A solid material obtained from the above step was filtered and thoroughly washed with water/methanol/hexane in the stated order to obtain a solid. The solid was dried in a vacuum oven to obtain 11.73 g (98%) of Compound M1B.

Synthesis of Compound 61

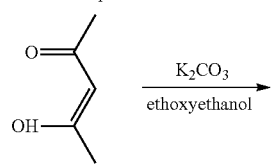

Compound M1B

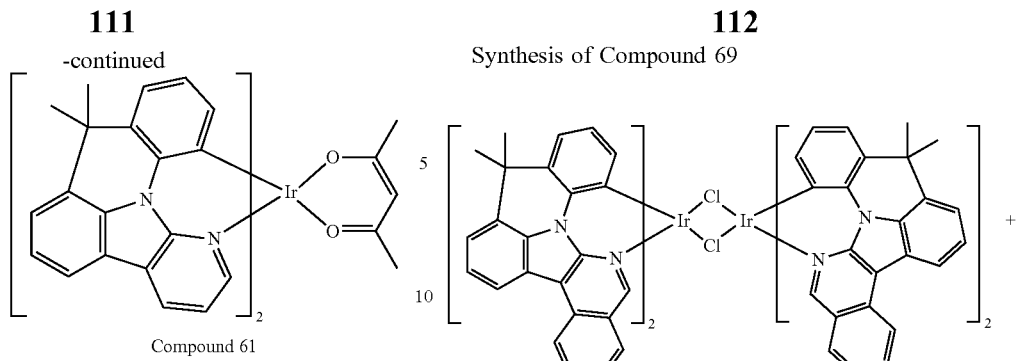

Compound 61

5.09 g (3.21 mmol) of Compound M1B, 3.21 g (32.05 mmol) of acetylacetone, and 4.43 g (32.05 mmol) of $K_2CO_3$ were mixed with 50 mL of ethoxyethanol, and the resulting mixture was stirred under reflux for 12 hours to carry out a reaction. The cooled mixture obtained from the above step was filtered to obtain a solid. The solid was thoroughly washed with ethanol and hexane, and purified by column chromatography with MC: hexane, thereby obtaining 0.77 g (14%) of Compound 61. The identity of the obtained compound was confirmed by Mass and HPLC analysis.

HRMS (MALDI) calcd for $C_{45}H_{37}IrN_4O_2$: m/Z 858.2546, Found: 858.2538

Synthesis Example 4: Synthesis of Compound 69

Synthesis of Compound M1C

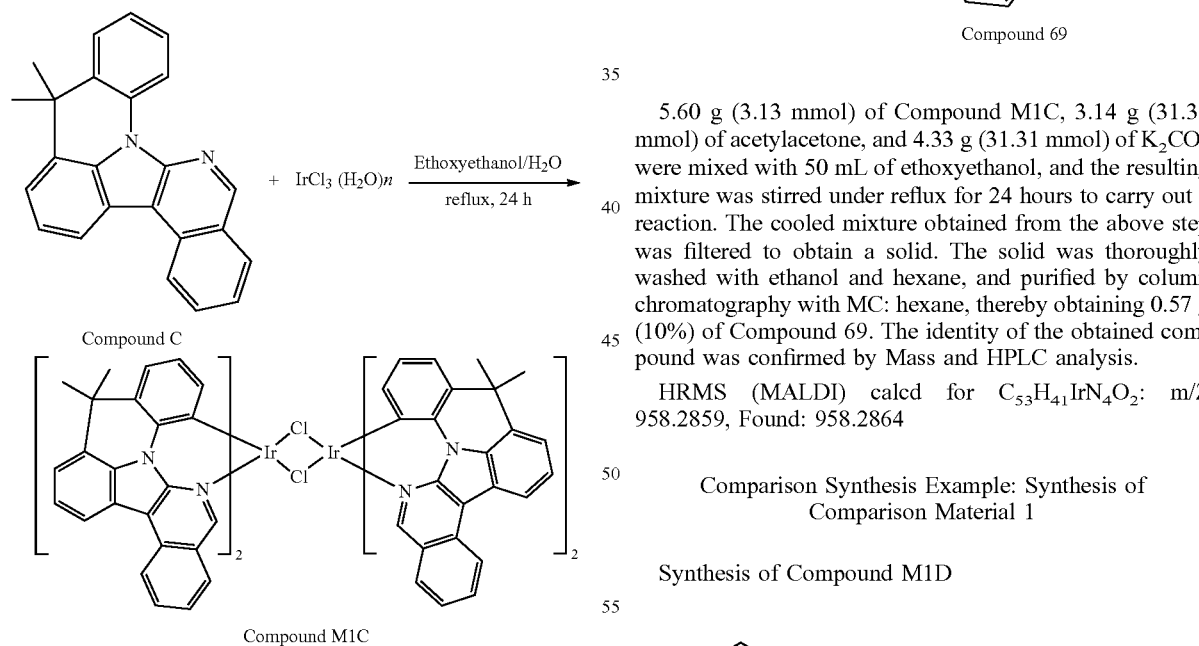

Compound M1C 10.09 g (30.19 mmol) of Compound C and 4.73 g (13.42 mmol) of iridium chloride were mixed with 90 mL of ethoxyethanol and 30 mL of distilled water, and the resulting mixture was stirred under reflux for 24 hours to carry out a reaction. The solid material obtained from the above step and cooled to a room temperature was filtered, and thoroughly washed with water/methanol/hexane in the stated order to obtain a solid. The solid was dried in a vacuum oven to obtain 10.95 g (91%) of Compound M1C.

Synthesis of Compound 69

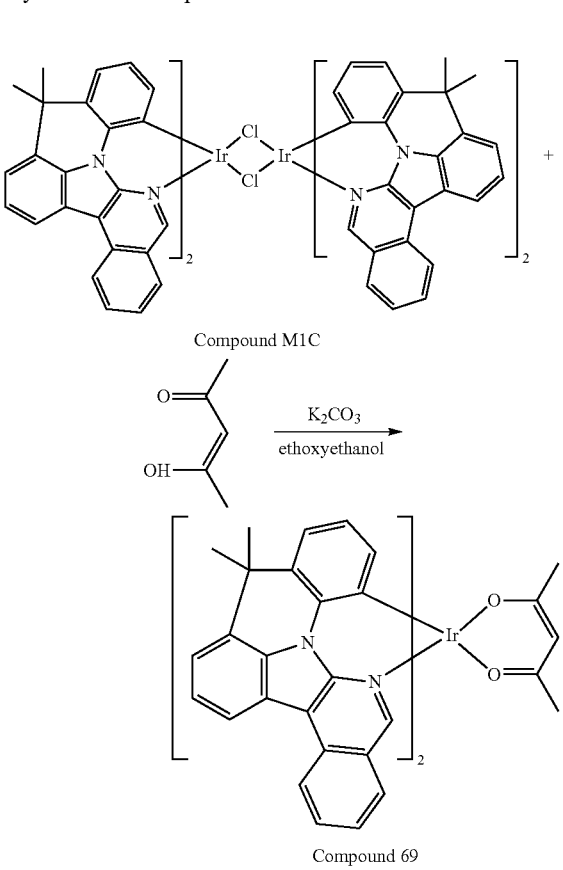

Compound 69

5.60 g (3.13 mmol) of Compound M1C, 3.14 g (31.31 mmol) of acetylacetone, and 4.33 g (31.31 mmol) of $K_2CO_3$ were mixed with 50 mL of ethoxyethanol, and the resulting mixture was stirred under reflux for 24 hours to carry out a reaction. The cooled mixture obtained from the above step was filtered to obtain a solid. The solid was thoroughly washed with ethanol and hexane, and purified by column chromatography with MC: hexane, thereby obtaining 0.57 g (10%) of Compound 69. The identity of the obtained compound was confirmed by Mass and HPLC analysis.

HRMS (MALDI) calcd for $C_{53}H_{41}IrN_4O_2$: m/Z 958.2859, Found: 958.2864

Comparison Synthesis Example: Synthesis of Comparison Material 1

Synthesis of Compound M1D

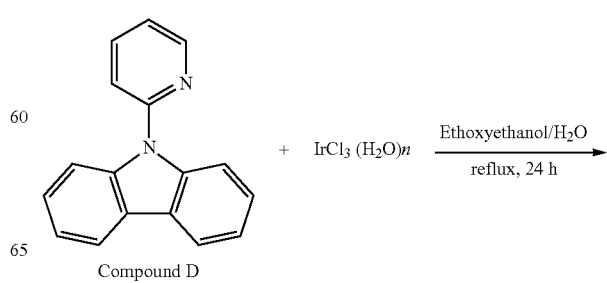

Compound D

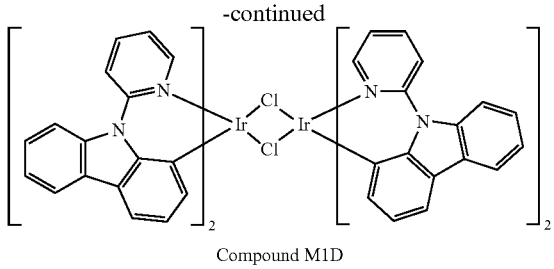

Compound M1D 7.70 g (31.50 mmol) of Compound D and 4.94 g (14.00 mmol) of iridium chloride were mixed with 90 mL of ethoxyethanol and 30 mL of distilled water, and the resulting mixture was stirred under reflux for 24 hours to carry out a reaction. The solid material obtained from the above step and cooled to room temperature was filtered, and thoroughly washed with water/methanol/hexane in the stated order to obtain a solid. The solid was dried in a vacuum oven to obtain 8.6 g (86%) of Compound M1D.

Synthesis of Comparison Material 1

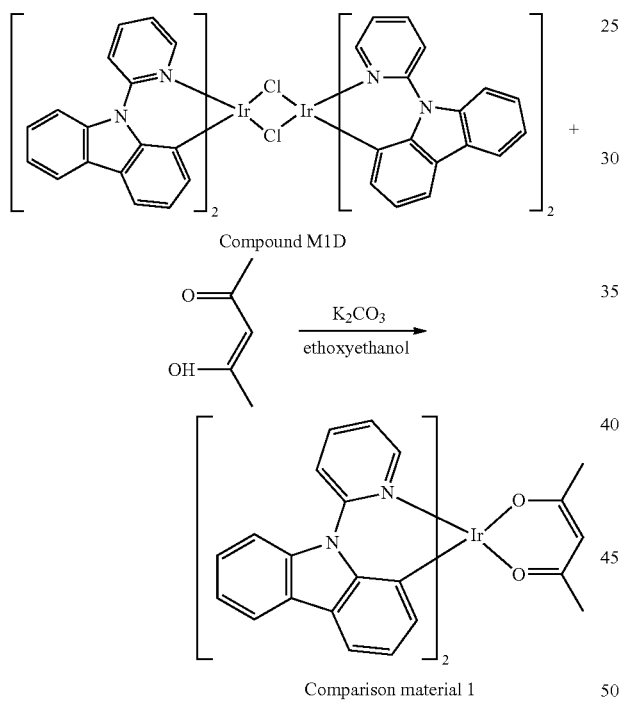

Comparison material 1

4.13 g (2.89 mmol) of Compound M1D, 2.90 g (28.92 mmol) of acetylacetone, and 4.00 g (28.92 mmol) of $K_2CO_3$ were mixed with 50 mL of ethoxyethanol, and the resulting mixture was stirred under reflux for 12 hours to carry out a reaction. The cooled mixture obtained from the above step was filtered to obtain a solid. The solid was thoroughly washed with ethanol and hexane and purified by column chromatography with MC: hexane, thereby obtaining 0.95 g (21%) of Comparison Material 1. The identity of the obtained compound was confirmed by Mass and HPLC analysis.

HRMS (MALDI) calcd for $C_{39}H_{29}IrN_4O_2$: m/z 778.1920, Found: 778.1914

Example 1

A glass substrate with an ITO electrode thereon was cut to a size of 50 millimeters (mm)×50 mm×0.5 mm, and then, sonicated by using acetone, isopropyl alcohol and pure water, for 15 minutes in each solvent, and cleaned by exposing to ultraviolet rays for 30 minutes.

Then, m-MTDATA was deposited on the ITO electrode (anode) on the glass substrate at a deposition rate of 1 Angstrom per second (Å/sec) to form a hole injection layer having a thickness of 600 Angstrom (Å), and α-NPD was deposited on the hole infection layer at a deposition rate of 1 Å/sec to form a hole transport layer having a thickness of 250 Å.

Compound 1 (dopant) and CBP (host) were co-deposited on the hole transport layer at a deposition rate of 0.1 Å/sec and 1 Å/sec, respectively, to form an emission layer having a thickness of 400 Å.

BAlq was deposited on the emission layer at a deposition rate of 1 Å/sec to form a hole blocking layer having a thickness of 50 Å, and then $Alq_3$ was deposited on the hole blocking layer to form an electron transport layer having a thickness of 300 Å. Next, LiF was deposited on the electron transport layer to form an electron injection layer having a thickness of 10 Å, and Al was vacuum-deposited on the electron injection layer to form a second electrode (cathode) having a thickness of 1,200 Å, thereby manufacturing an organic light-emitting device having a structure of ITO/m-MTDATA (600 Å)/α-NPD (250 Å)/CBP+10% (Compound 1) (400 Å)/Balq(50 Å) /$Alq_3$(300 Å)/LiF(10 Å)/Al(1,200 Å).

Example 2 to 4 and Comparative Example 1

An organic light-emitting device was manufactured in the same manner as in Example 1, except that when forming an emission layer, each of the compounds listed in Table 2 was used instead of Compound 1 as a dopant.

Evaluation Example 1: Characteristics Evaluation of an Organic Light-Emitting Device Driving voltage, current efficiency, power efficiency, EL wavelength, and color coordinates of each of the organic light-emitting devices manufactured in Examples 1 to 4 and Comparative Example 1 were evaluated under a required luminance of 6,000 candelas per square meter ($cd/m^2$), and the obtained data is shown in Table 2. A current-voltage meter (Keithley 2400) and a luminance meter (Minolta Cs-1000A) were used as evaluation apparatuses.

TABLE 2

| | dopant | driving voltage (V) | efficiency (cd/A) | power (lm/W) | $\lambda_{max}$ | CIEx | CIEy |
|---|---|---|---|---|---|---|---|
| Example 1 | Compound 1 | 6.2 | 20.5 | 10.4 | 533 | 0.394 | 0.564 |
| Example 2 | Compound 34 | 6.4 | 18.5 | 9.1 | 531 | 0.390 | 0.570 |
| Example 3 | Compound 61 | 5.8 | 40.0 | 21.7 | 529 | 0.356 | 0.594 |
| Example 4 | Compound 69 | 6.4 | 24.0 | 11.8 | 601 | 0.620 | 0.450 |

TABLE 2-continued
| | dopant | driving voltage (V) | efficiency (cd/A) | power (lm/W) | $\lambda_{max}$ | CIEx | CIEy |
|---|---|---|---|---|---|---|---|
| Comparative Example 1 | Comparison Material 1 | 8.5 | 5.0 | 1.8 | 535 | 0.400 | 0.580 |
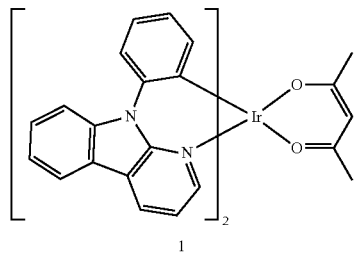
1
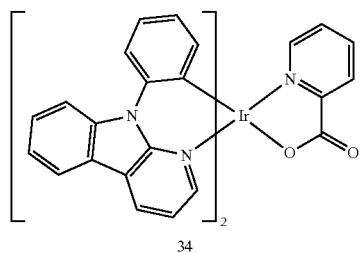
34
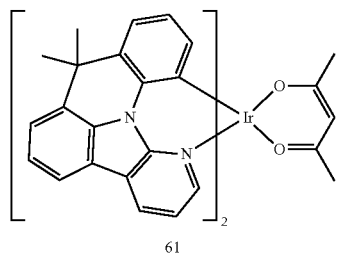
61
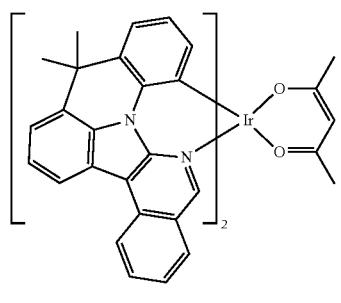
69
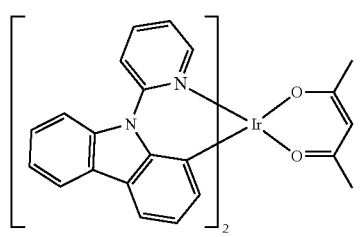
Comparison material 1

Table 2 shows that organic light-emitting device of Examples 1 to 4 have low driving voltage, high current efficiency, high power efficiency, and excellent color purity, compared to an organic light-emitting device of Comparative Example 1.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the present inventive concept as defined by the following claims.

What is claimed is:

1. An organometallic compound represented by Formula 1:

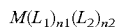

Formula 1

Formula 2B-1

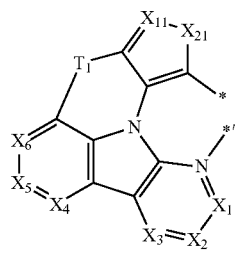

Formula 2B-2

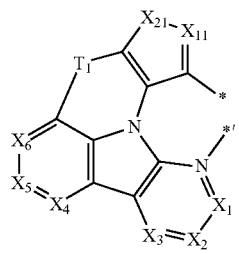

Formula 2B-3

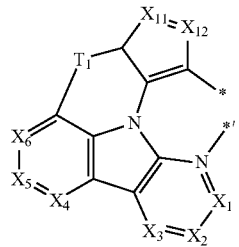

Formula 2B-11

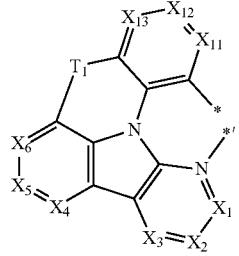

-continued

Formula 2B-12

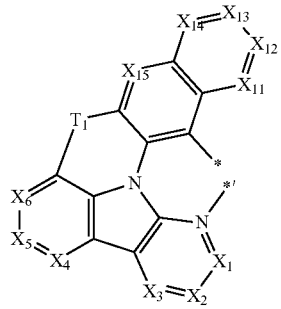

Formula 2B-13

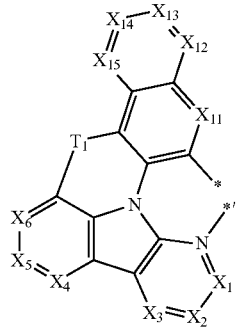

Formula 2B-21

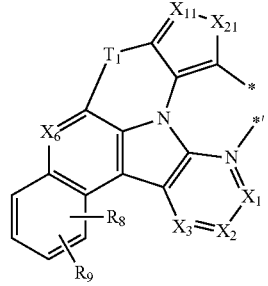

Formula 2B-22

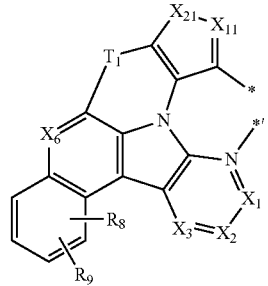

Formula 2B-23

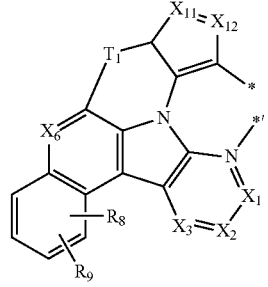

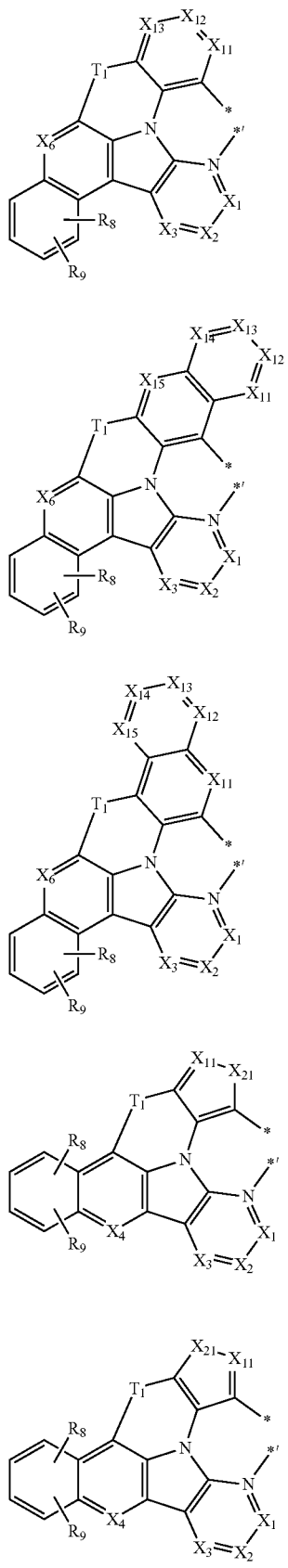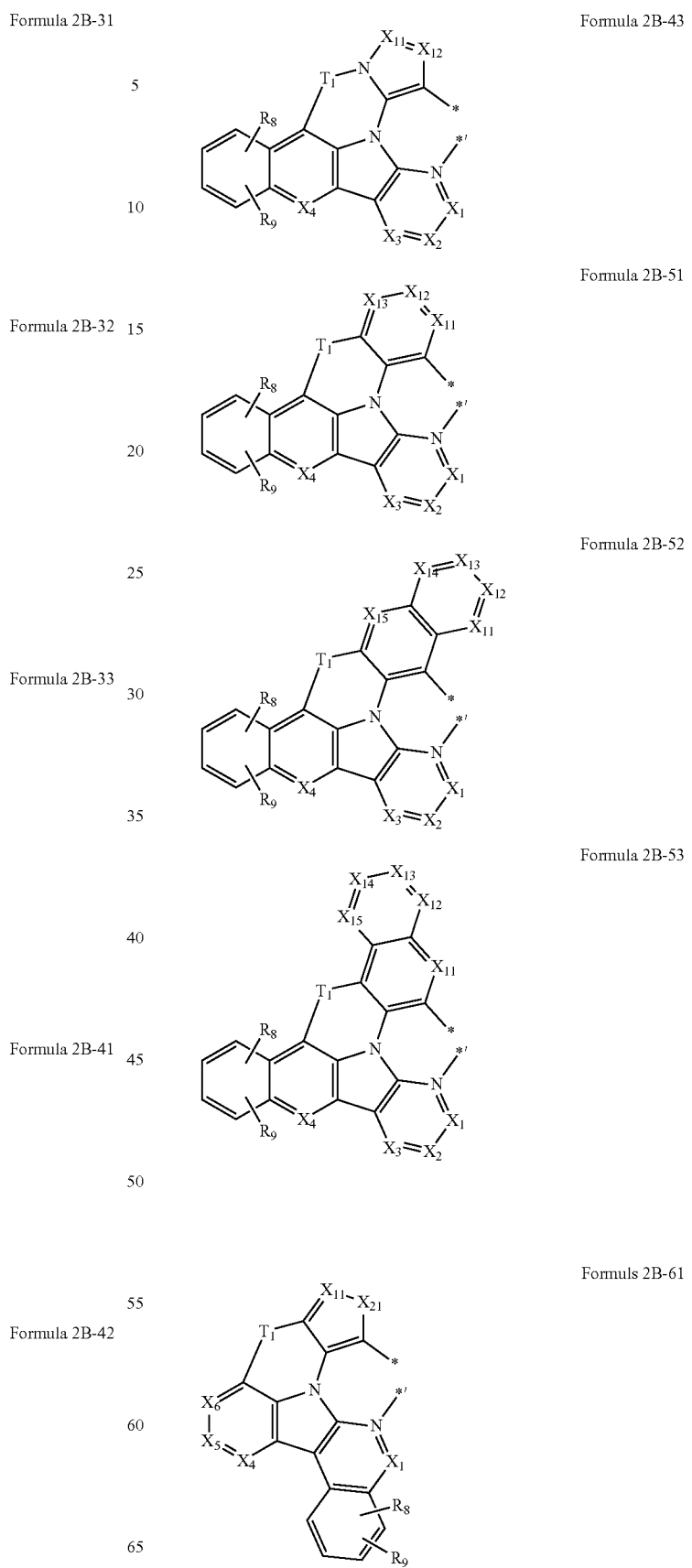

Formula 2B-62
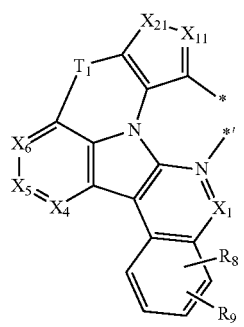
Formula 2B-63
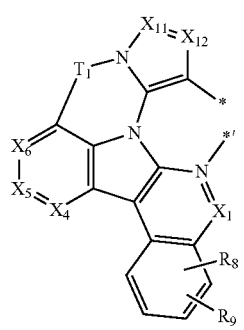
Formula 2B-71
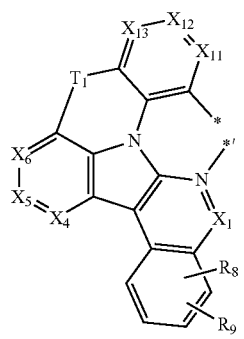
Formula 2B-72
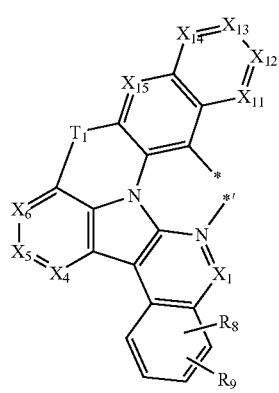
Formula 2B-73
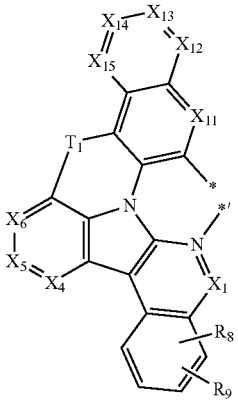
Formula 2B-81
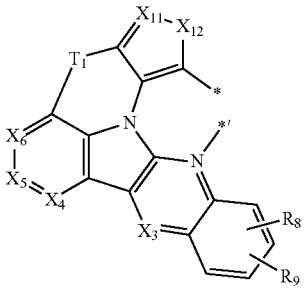
Formula 2B-82
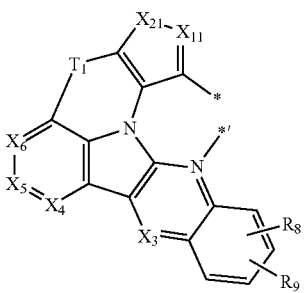
Formula 2B-83
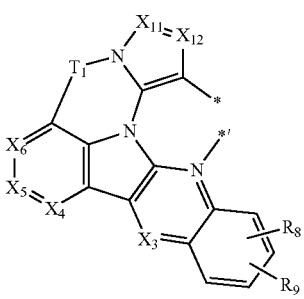
Formula 2B-91
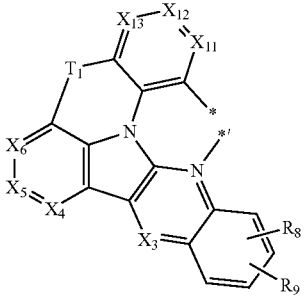

-continued

Formula 2B-92

Formula 2B-93

Formula 3-1

Formula 3-2

Formula 3-3

Formula 3-4

Formula 3-5

Formula 3-6

Formula 3-7

Formula 3-8

Formula 3-9

Formula 3-10

Formula 3-11

Formula 3-12

-continued

Formula 3-13

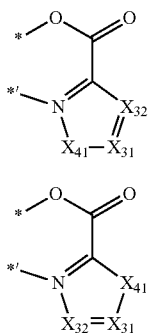

Formula 3-14

M in Formula 1 is selected from Ir, Pt, Os, Ti, Zr, Hf, Eu, Tb, Tm, and Rh,

Li in Formula 1 is selected from a ligand represented by 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93, $L_2$ in Formula 1 is selected from ligands represented by Formula Formulae 3-1 to 3-12, each of * and *' in Formulae 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, 2B-91 to 2B-93, and 2C is a binding site to M in Formula 1, n1 in Formula 1 is 1, 2, or 3, provided that when n1 is 2 or greater, two or more groups Li are the same or different, n2 in Formula 1 is 0, 1, 2, 3, or 4, provided that when n2 is 2 or greater, two or more groups $L_2$ are the same or different, in Formulae 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93, Xi is N or$C(R_1)$, $X_2$ is N or$C(R_2)$, $X_3$ is N or$C(R_3)$, $X_4$ is N or$C(R_4)$, $X_5$ is N or $C(R_5)$, and $X_6$ is N or$C(R_6)$, in Formula 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93, $T_1$ is selected from a single bond, *—O—*', *—S—*', *—$N(R_{31})$—*', *—$C(R_{31})$$(R_{32})$—*', *—$C(R_{31})$=$C(R_{32})$—*', and *—$Si(R_{31})$$(R_{32})$—*', wherein $R_{31}$ and $R_{32}$ are optionally linked to each other to form a substituted or unsubstituted $C_5$-$C_{30}$ carbocyclic group or a substituted or unsubstituted $C_2$-$C_{30}$ heterocyclic group, in Formulae 2B-1 to 2B-3, 2B-11 to 2B-13, 2B-21 to 2B-23, 2B-31 to 2B-33, 2B-41 to 2B-43, 2B-51 to 2B-53, 2B-61 to 2B-63, 2B-71 to 2B-73, 2B-81 to 2B-83, and 2B-91 to 2B-93, $X_{II}$ is $C(R_{11})$, $X_{12}$ is $C(R_{12})$, $X_{13}$ is $C(R_{13})$, $X_{14}$ is $C(R_{14})$, $X_{15}$ is $C(R_{15})$, and $X_{21}$ is O, S, $N(R_{21})$, or $C(R_{21})(R_{22})$, $R_1$ to $R_6$, $R_8$, $R_9$, $R_{11}$ to $R_{15}$, $R_{21}$, $R_{22}$, $R_{31}$, and $R_{32}$ are each independently selected from a hydrogen, a deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, —$P(=O)(Q_8)(Q_9)$, and —$Ge(Q_{51})(Q_{52})(Q_{53})$, two or more of $R_1$ to $R_3$ are optionally linked to each other to form a substituted or unsubstituted $C_5$-$C_{30}$ carbocyclic group or a substituted or unsubstituted $C_2$-$C_{30}$ heterocyclic group, two or more of $R_4$ to $R_7$ are optionally linked to each other to form a substituted or unsubstituted $C_5$-$C_{30}$ carbocyclic group or a substituted or unsubstituted $C_2$-$C_{30}$ heterocyclic group, in Formulae 3-1 to 3-14, $X_{31}$ is N or $C(Z_{1a})$, $X_{32}$ is N or $C(Z_{1b})$, $X_{41}$ is O, S, $N(Z_{1a})$, or $C(Z_{1a})(Z_{1b})$, $Z_1$ to $Z_4$, $Z_{1a}$, $Z_{1b}$, and $Z_{11}$ to $Z_{14}$ are each independently selected from a hydrogen, a deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from a deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —$N(Q_1)(Q_2)$, —$Si(Q_3)(Q_4)(Q_5)$, —$B(Q_6)(Q_7)$, —$P(=O)(Q_8)(Q_9)$, and —$Ge(Q_{51})(Q_{52})(Q_{53})$, e2 is 1 or 2, e3 is an integer selected from 1 to 3, and e4 is an integer selected from 1 to 4, at least one substituent of the substituted $C_5$-$C_{30}$ carbocyclic group, substituted $C_2$-$C_{30}$ heterocyclic group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ cycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, wherein $Q_1$ to $Q_9$, $Q_{11}$ to $Q_{19}$, $Q_{21}$ to $Q_{29}$, $Q_{31}$ to $Q_{39}$, and $Q_{51}$ to $Q_{53}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with one of a $C_1$-$C_{60}$ alkyl group and a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

2. The organometallic compound of claim 1, wherein in Formula 1,

M is Ir or Os, n1+n2 is 3; or

M is Pt, n1+n2 is 2.

3. The organometallic compound of claim 1, wherein $T_1$ is selected from *—O—*', *—S—*', *—$C(R_{31})(R_{32})$—*', *—$Si(R_{31})(R_{32})$—*', and groups represented by Formulae 11-1 to 11-4, wherein $R_{31}$ and $R_{32}$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group:

Formula 11-1

Formula 11-2

Formula 11-3

Formula 11-4

4. The organometallic compound of claim 1, wherein $R_1$ to $R_6$, $R_8$, $R_9$, $R_{11}$, to $R_{15}$, $R_{21}$, $R_{22}$, $R_{31}$, and $R_{32}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —SF$_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —N(Q$_1$)(Q$_2$), —Si(Q$_3$)(Q$_4$)(Q$_5$), —B(Q$_6$)(Q$_7$), —P(=O)(Q$_8$)(Q$_9$), and —Ge(Q$_{51}$)(Q$_{52}$)(Q$_{53}$);

wherein Q$_1$ to Q$_9$ and Q$_{51}$ to Q$_{53}$ are each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a C$_1$-C$_{10}$ alkyl group, and a phenyl group.

5. The organometallic compound of claim 1, wherein R$_1$ to R$_6$, R$_8$, R$_9$, R$_{11}$ to R$_{15}$, R$_{21}$, R$_{22}$, R$_{10}$, R$_{31}$, and R$_{32}$ are each independently selected from a hydrogen, a deuterium, —F, a cyano group, a nitro group, —SF$_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from a deuterium, —F, —CD$_3$, —CD$_2$H, —CDH$_2$, —CF$_3$, —CF$_2$H, —CFH$_2$, a cyano group, a nitro group, a C$_1$-C$_{10}$ alkyl group, a C$_1$-C$_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —N(Q$_1$)(Q$_2$), —Si(Q$_3$)(Q$_4$)(Q$_5$), —B(Q$_6$)(Q$_7$), —P(=O)(Q$_8$)(Q$_9$), and —Ge(Q$_{51}$)(Q$_{52}$)(Q$_{53}$), wherein Q$_1$ to Q$_9$ and Q$_{51}$ to Q$_{53}$ are each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a C$_1$-C$_{10}$ alkyl group, and a phenyl group.

6. The organometallic compound of claim 1, wherein R$_1$ to R$_6$, R$_8$, R$_9$, R$_{11}$ to R$_{15}$, R$_{21}$, R$_{22}$, R$_{31}$, and R$_{32}$ are each independently selected from a hydrogen, a deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19, groups represented by Formulae 10-1 to 10-36, —Si(Q$_3$)(Q$_4$)(Q$_5$), and —Ge(Q$_{51}$)(Q$_{52}$)(Q$_{53}$), and Q$_3$ to Q$_5$ and Q$_{51}$ to Q$_{53}$ are each independently selected from —CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group and a naphthyl group, each substituted with at least one selected from a deuterium, a C$_1$-C$_{10}$ alkyl group, and a phenyl group:

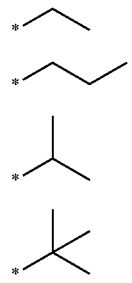

Formula 9-1

Formula 9-2

Formula 9-3

Formula 9-4

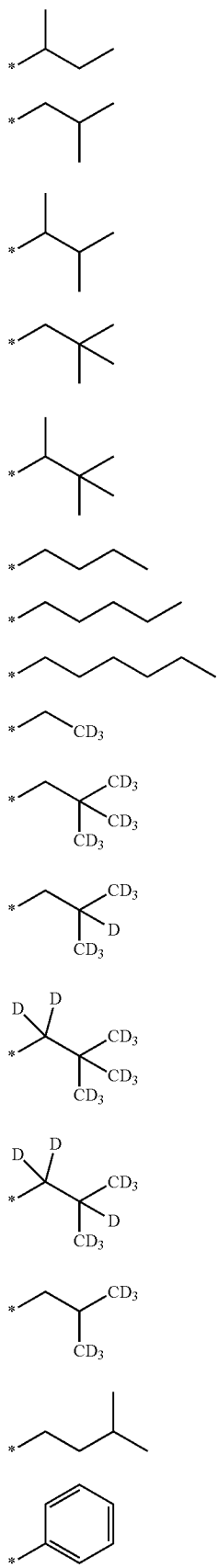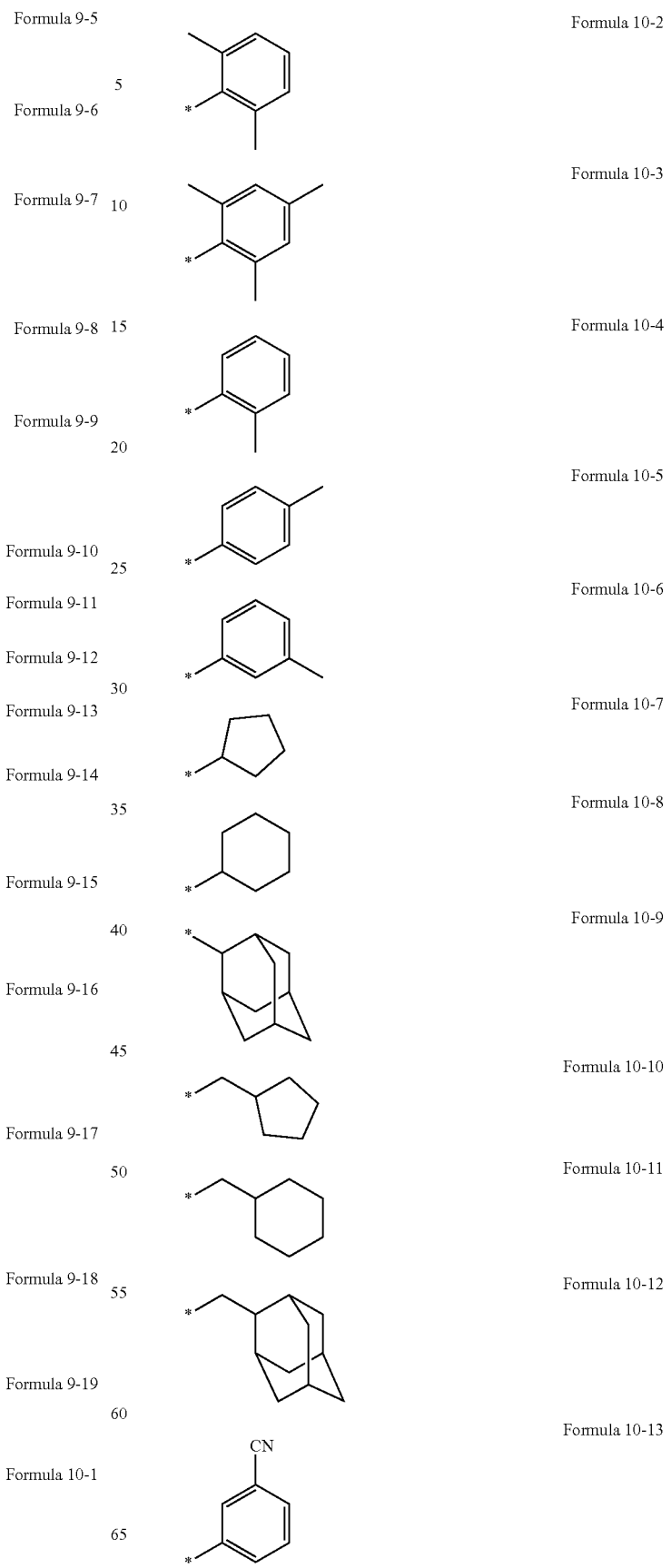

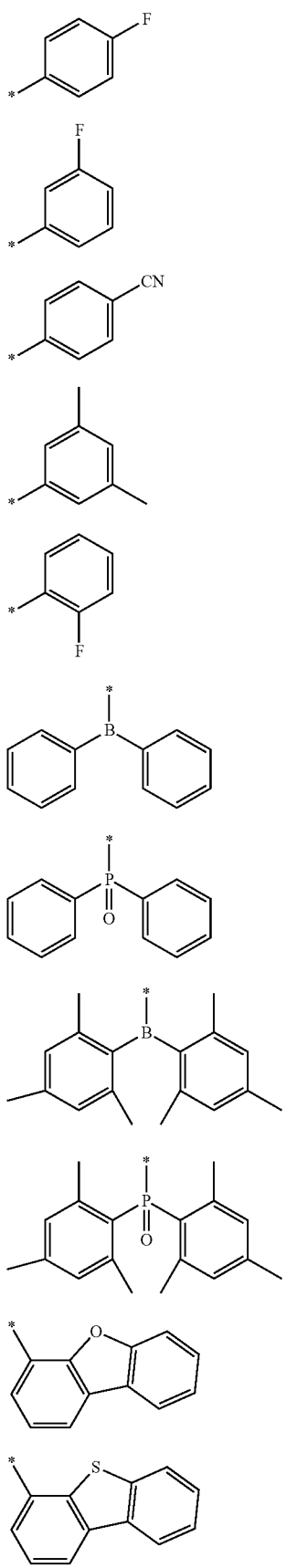
Formula 10-14
Formula 10-15
Formula 10-16
Formula 10-17
Formula 10-18
Formula 10-19
Formula 10-20
Formula 10-21
Formula 10-22
Formula 10-23
Formula 10-24
Formula 10-25
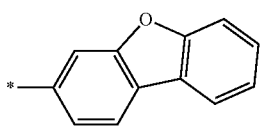
Formula 10-26
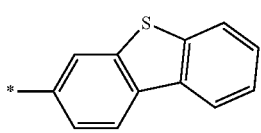
Formula 10-27
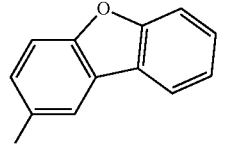
Formula 10-28
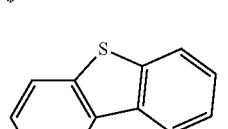
Formula 10-29
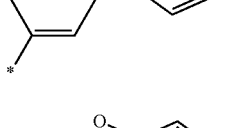
Formula 10-30
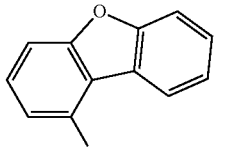
Formula 10-31
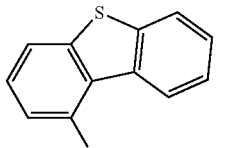
Formula 10-32
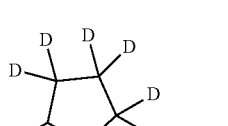
Formula 10-33
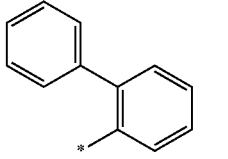

Formula 10-34

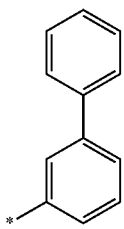

Formula 10-35

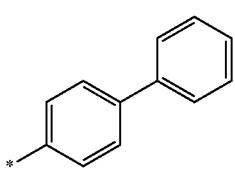

Formula 10-36

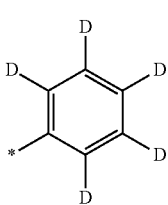

* in Formulae 9-1 to 9-19 and 10-1 to 10-36 is a binding site to a neighboring atom.

7. The organometallic compound of claim 1, wherein $T_1$ is selected from *—O—*', *—S—*', *—C($R_{31}$)($R_{32}$)—*', *—Si($R_{31}$)($R_{32}$)—*', and groups represented by Formulae 11-1 to 11-4, $R_1$ to $R_6$, $R_8$, $R_9$, $R_{11}$ to $R_{15}$, $R_{21}$, $R_{22}R_{31}$, and $R_{32}$ are each independently selected from a hydrogen, a deuterium, —F, a cyano group, a nitro group, —$SF_5$, a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group;

a methyl group, an ethyl group, an n-propyl group, an iso-propyl group, an n-butyl group, an isobutyl group, a sec-butyl group, a tert-butyl group, an n-pentyl group, an isopentyl group, a sec-pentyl group, a tert-pentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group, each substituted with at least one selected from a deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, a dibenzofuranyl group, and a dibenzothiophenyl group; and —N($Q_1$)($Q_2$), —Si($Q_3$)($Q_4$)($Q_5$), —B($Q_6$)($Q_7$), —P(=O)($Q_8$)($Q_9$), and —Ge($Q_{51}$)($Q_{52}$)($Q_{53}$), $Q_1$ to $Q_9$ and $Q_{51}$ to $Q_{53}$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a $C_1$-$C_{10}$ alkyl group, and a phenyl group, two neighboring substituents of $R_1$ to $R_3$ are optionally linked to each other to form a substituted or unsubstituted $C_5$-$C_{10}$ carbocyclic ring, two neighboring substituents of $R_4$ to $R_7$ are optionally linked to each other to form a substituted or unsubstituted $C_5$-$C_{10}$ carbocyclic ring, and two neighboring substituents of Ru to Rib are optionally linked to each other to form a substituted or unsubstituted $C_5$-$C_{10}$ carbocyclic ring:

Formula 11-1

Formula 11-2

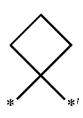

Formula 11-3

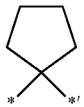

-continued

Formula 11-4

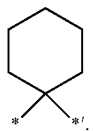

8. The organometallic compound of claim 1, wherein
$T_1$ is selected from *—O—*', *—S—*', *—C($R_{31}$)($R_{32}$)—*', *—Si($R_{31}$)($R_{32}$)—*', and groups represented by Formulae 11-1 to 11-4, $R_1$ to $R_6$, $R_8$, $R_9$, $R_{11}$ to $R_{15}$, $R_{22}$, $R_{31}$, and $R_{32}$ are each independently selected from a hydrogen, a deuterium, —F, a cyano group, a nitro group, —SF$_5$, —CH$_3$, —CD$_3$, —CD$_2$H, —CDH$_2$, —CF$_3$, —CF$_2$H, —CFH$_2$, groups represented by Formulae 9-1 to 9-19, groups represented by Formulae 10-1 to 10-36, —Si($Q_3$)($Q_4$)($Q_5$), and —Ge($Q_{51}$)($Q_{52}$)($Q_{53}$), $Q_3$ to $Q_5$ and $Q_{51}$ to $Q_{53}$ are each independently selected from
—CH$_3$, —CD$_3$, —CD$_2$H, —CDH$_2$, —CH$_2$CH$_3$, —CH$_2$CD$_3$, —CH$_2$CD$_2$H, —CH$_2$CDH$_2$, —CHDCH$_3$, —CHDCD$_2$H, —CHDCDH$_2$, —CHDCD$_3$, —CD$_2$CD$_3$, —CD$_2$CD$_2$H, and —CD$_2$CDH$_2$;

an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an iso-propyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, a C$_1$-C$_{10}$ alkyl group, and a phenyl group:

Formula 9-1
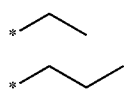

Formula 9-2
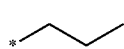

Formula 9-3

Formula 9-4

Formula 9-5
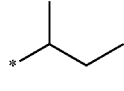

Formula 9-6
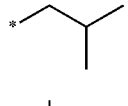

Formula 9-7
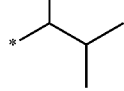

Formula 9-8
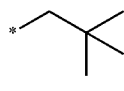

Formula 9-9
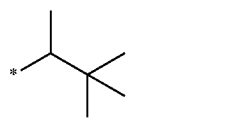

Formula 9-10
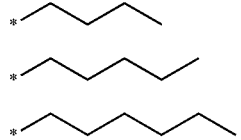

Formula 9-11
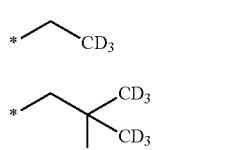

Formula 9-12
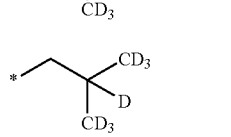

Formula 9-13
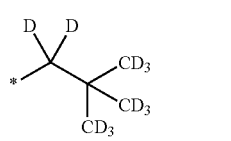

Formula 9-14
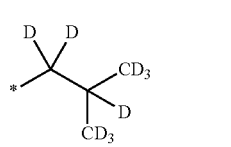

Formula 9-15
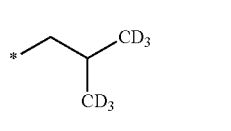

Formula 9-16
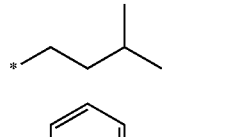

Formula 9-17
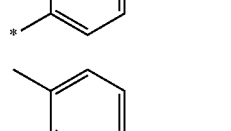

Formula 9-18
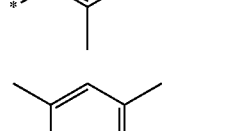

Formula 9-19
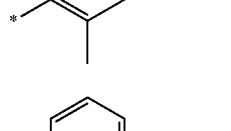

Formula 10-1
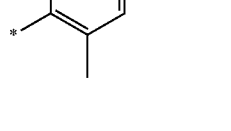

Formula 10-2
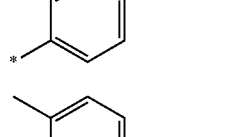

Formula 10-3
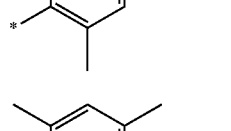

Formula 10-4
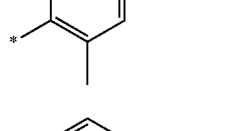

-continued
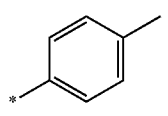
Formula 10-5
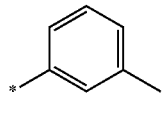
Formula 10-6
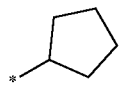
Formula 10-7
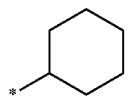
Formula 10-8
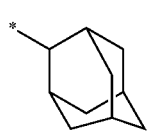
Formula 10-9
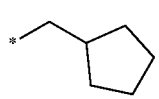
Formula 10-10
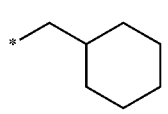
Formula 10-11
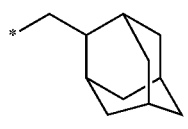
Formula 10-12
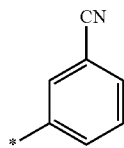
Formula 10-13
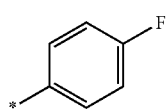
Formula 10-14
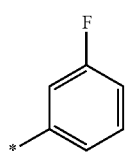
Formula 10-15
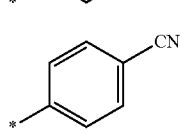
Formula 10-16
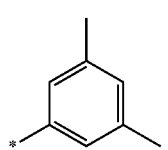
Formula 10-17
-continued
Formula 10-18
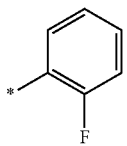
Formula 10-19
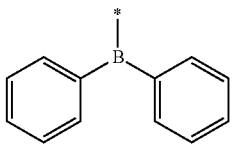
Formula 10-20
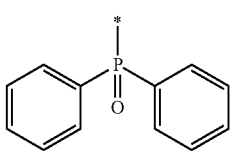
Formula 10-21
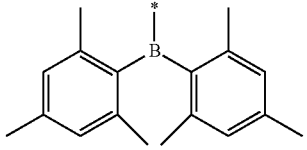
Formula 10-22
Formula 10-23
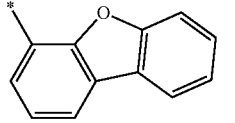
Formula 10-24
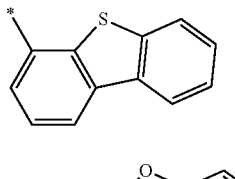
Formula 10-25
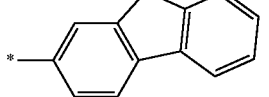
Formula 10-26
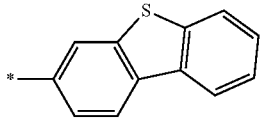
Formula 10-27
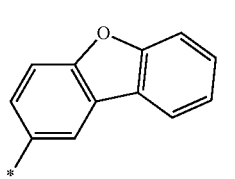

143
-continued
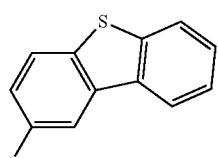
Formula 10-28
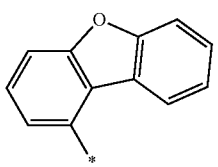
Formula 10-29
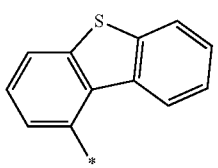
Formula 10-30
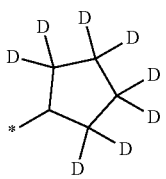
Formula 10-31
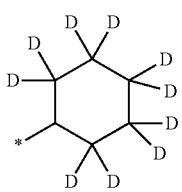
Formula 10-32
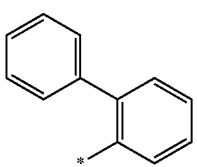
Formula 10-33
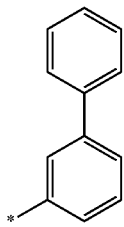
Formula 10-34
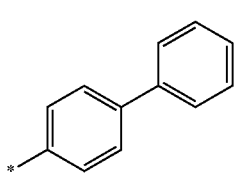
Formula 10-35
144
-continued
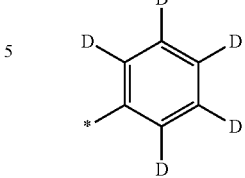
Formula 10-36
\* in Formulae 9-1 to 9-19 and 10-1 to 10-36 is a binding site to a neighboring atom.
9. An organometallic compound, wherein the organometallic compound is one of Compounds:
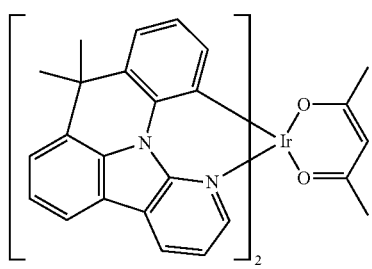
61
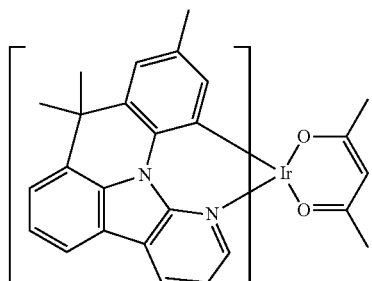
62
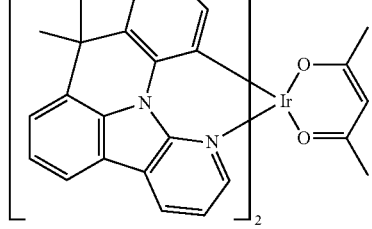
63
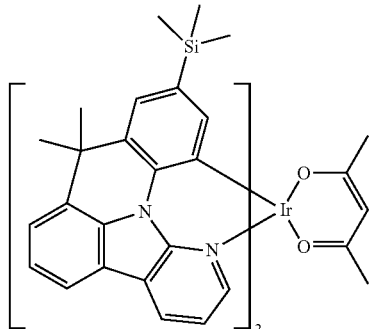
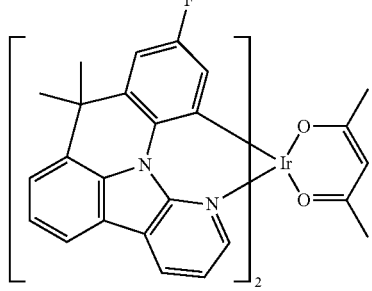
64

65
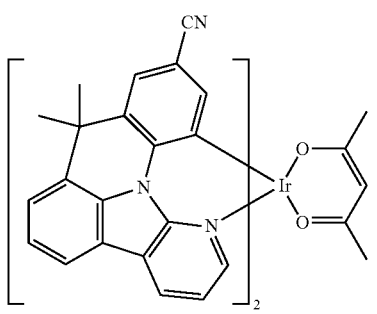
66
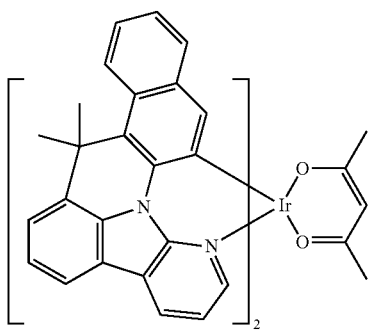
67
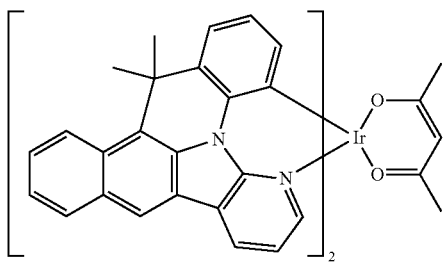
68
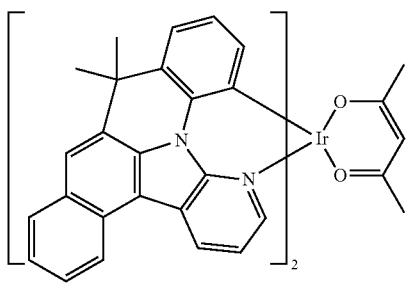
69
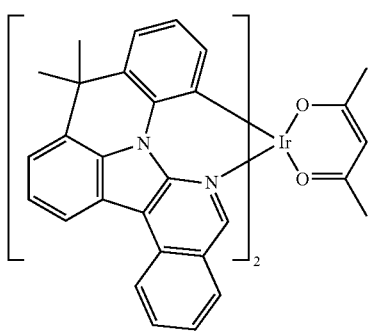
70
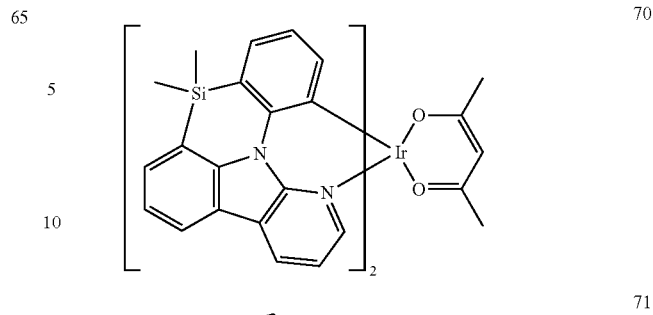
71
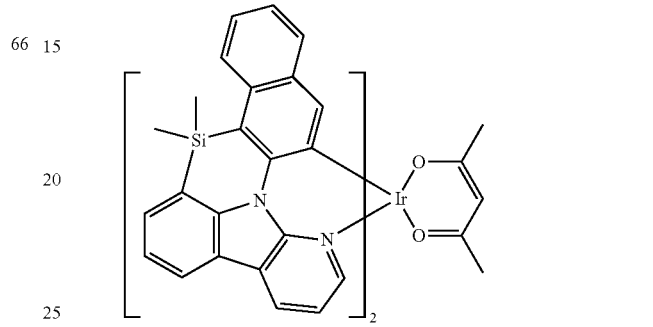
72
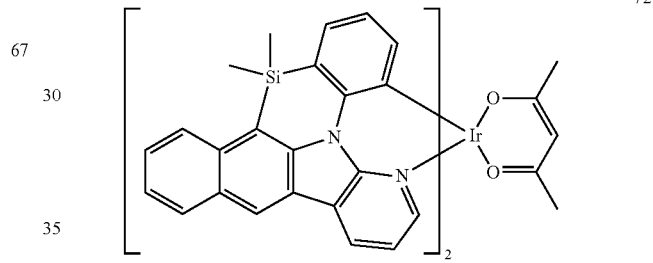
73
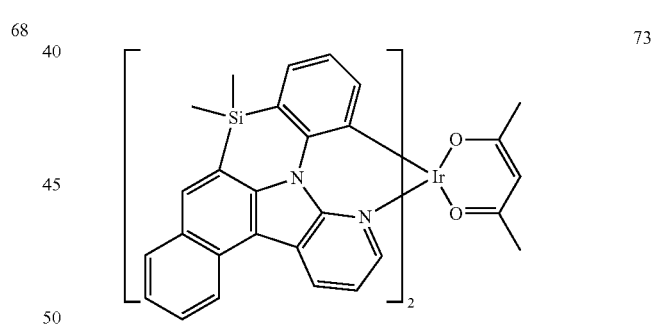
74
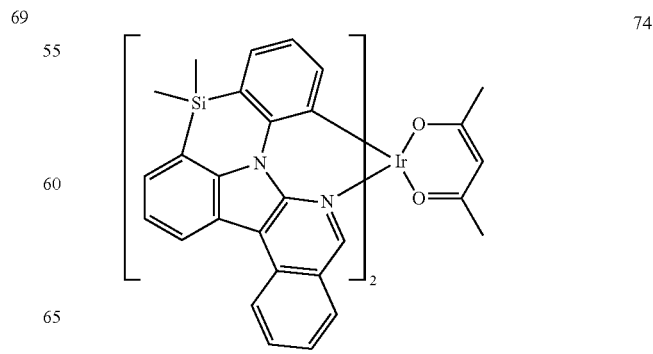

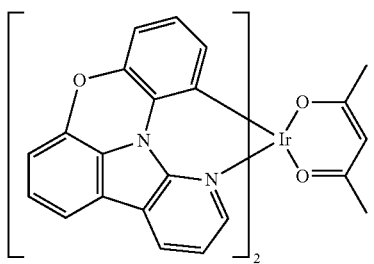
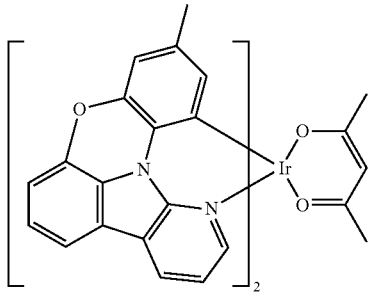
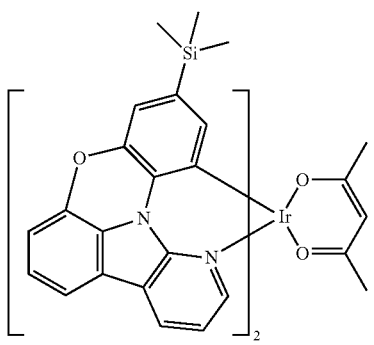
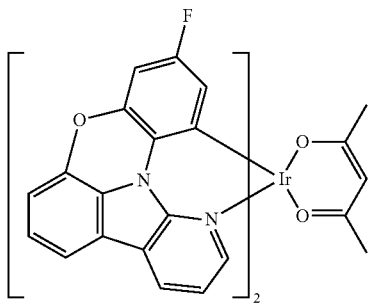
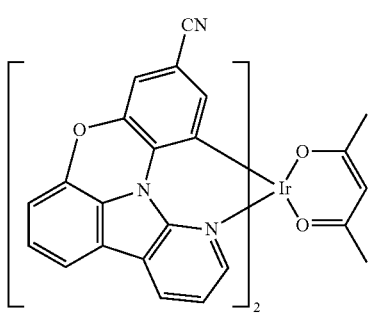
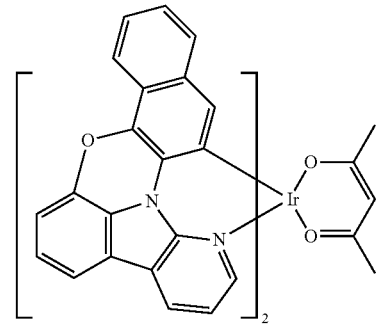
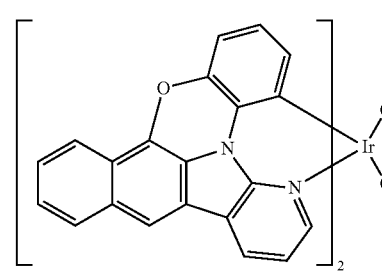
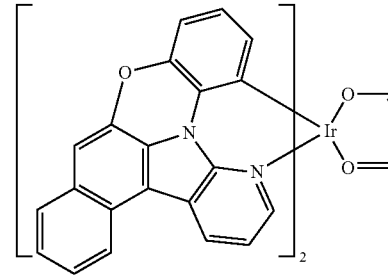
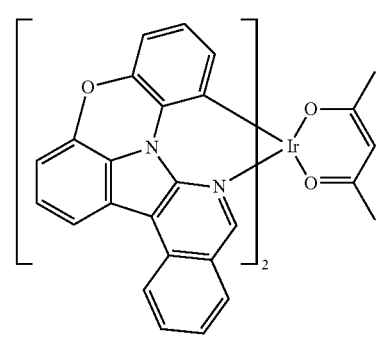
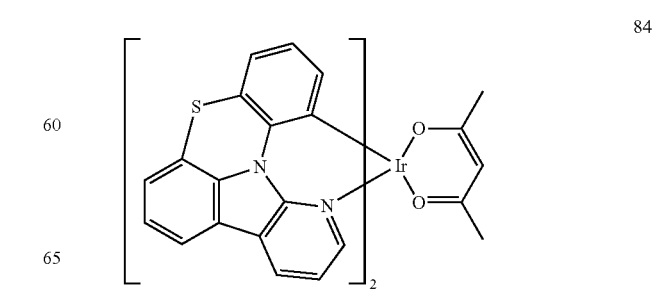

149
-continued
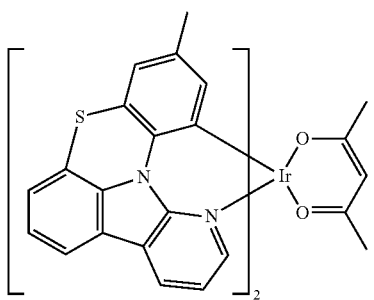
85
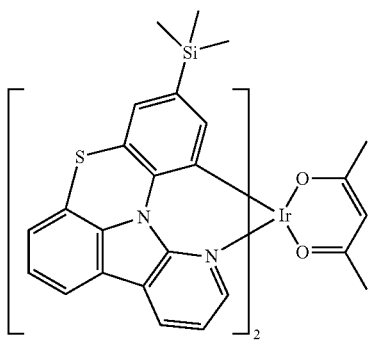
86
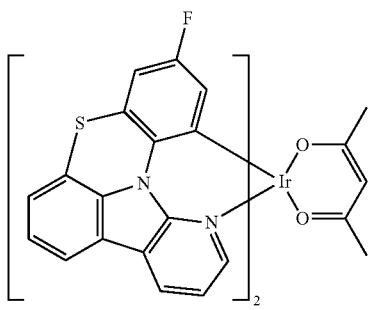
87
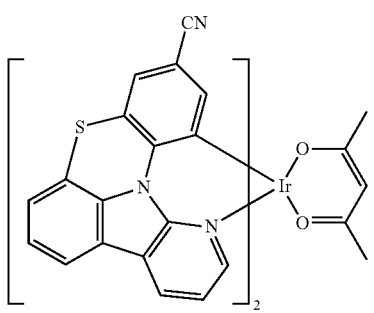
88
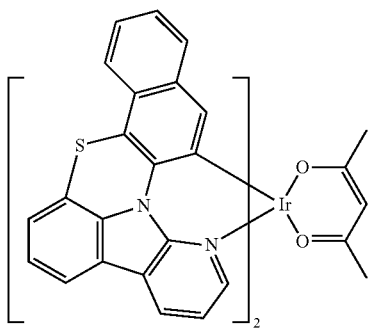
89
150
-continued
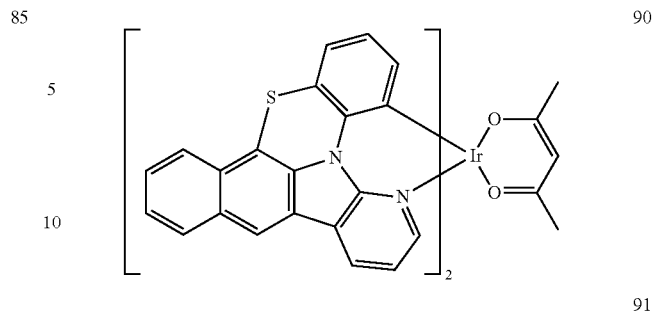
90
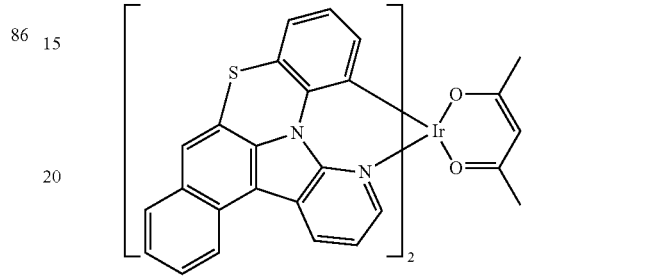
91
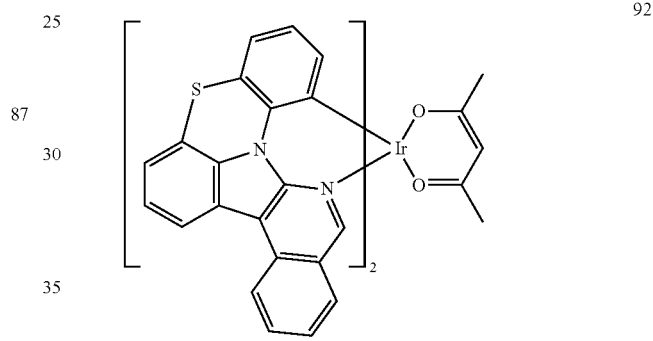
92
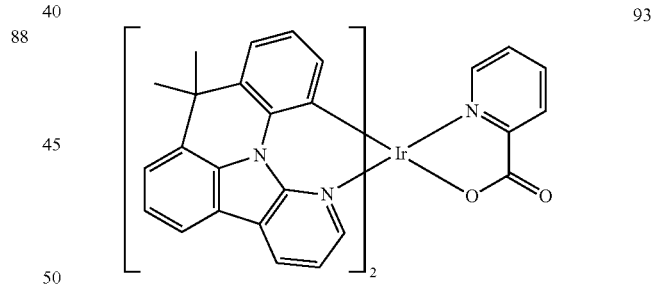
93
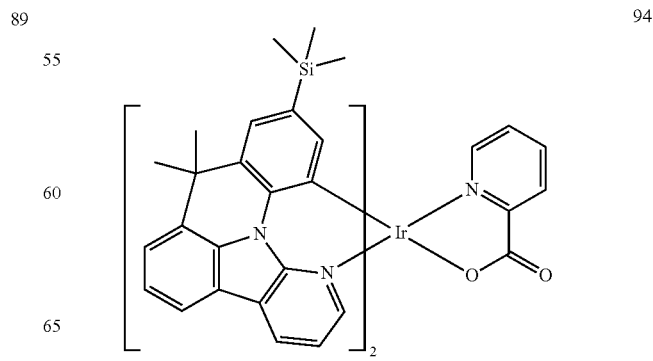
94

95
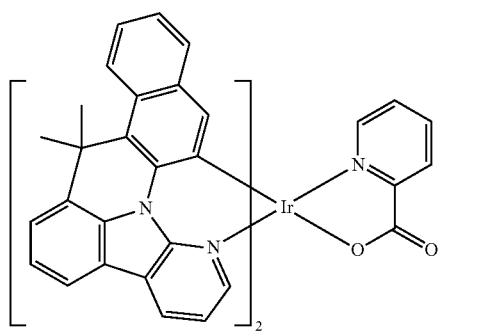
96
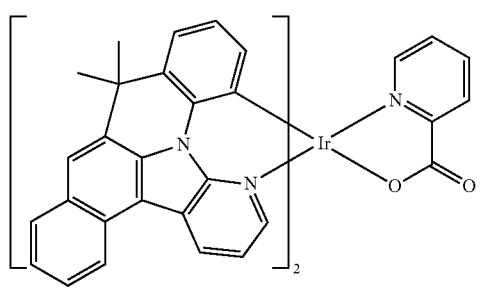
97
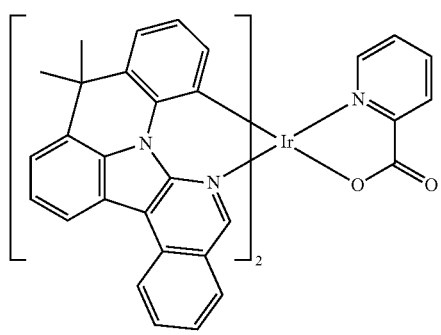
98
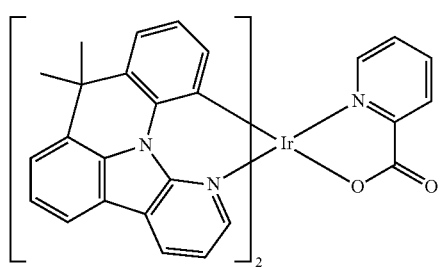
99
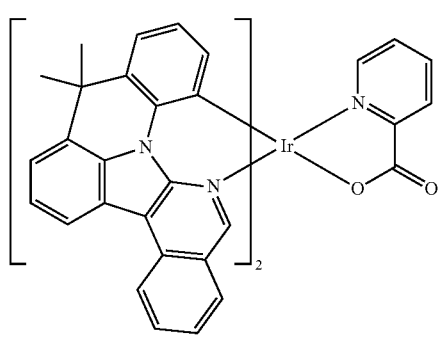
100
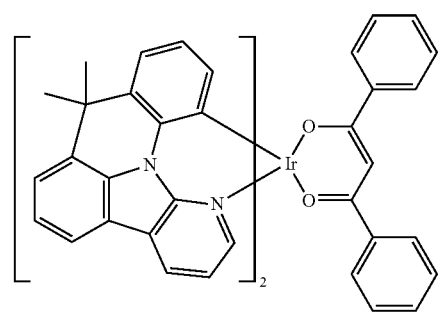
101
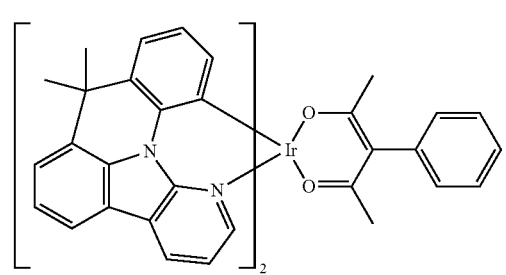
102
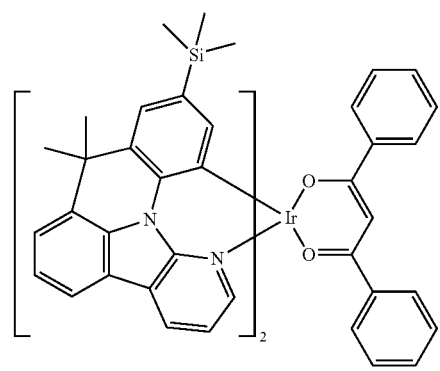
103
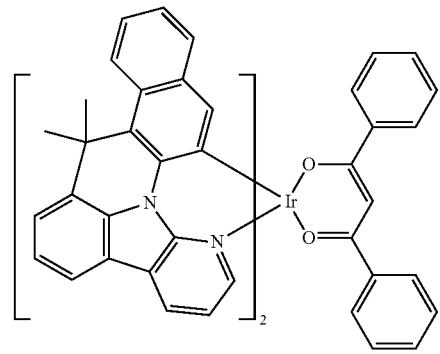

153
-continued

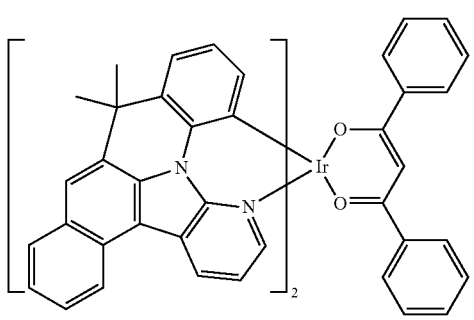
104

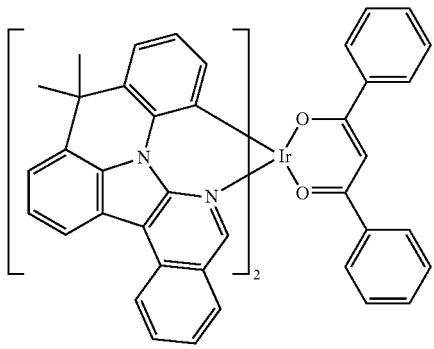
105

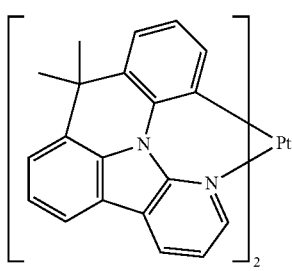
107

154
-continued

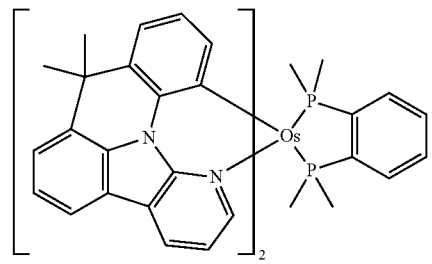
109

10. An organic light-emitting device comprising:
a first electrode;
a second electrode; and
an organic layer disposed between the first electrode and the second electrode,
wherein the organic layer comprises an emission layer, and at least one organometallic compound of claim 1.

11. The organic light-emitting device of claim 10, wherein
the first electrode is an anode,
the second electrode is a cathode,
the organic layer comprises a hole transport region disposed between the first electrode and the emission layer, and an electron transport region disposed between the emission layer and the second electrode,
wherein the hole transport region comprises at least one selected from a hole injection layer, a hole transport layer, a buffer layer, an interlayer, and an electron blocking layer, and
wherein the electron transport region comprises at least one selected from a hole blocking layer, an electron transport layer, and an electron injection layer.

12. The organic light-emitting device of claim 10, wherein the emission layer comprises the organometallic compound.

13. The organic light-emitting device of claim 12, wherein the emission layer further comprises a host.

* * * * *